United States Patent
Yang et al.

(10) Patent No.: US 12,421,103 B2
(45) Date of Patent: Sep. 23, 2025

(54) MICROELECTROMECHANICAL SYSTEM DEVICE

(71) Applicant: TAIWAN SEMICONDUCTOR MANUFACTURING COMPANY LTD., Hsinchu (TW)

(72) Inventors: Chen Hsiung Yang, Hsinchu County (TW); Chun-Wen Cheng, Hsinchu County (TW); Chia-Hua Chu, Hsinchu County (TW); En-Chan Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 112 days.

(21) Appl. No.: 18/167,884

(22) Filed: Feb. 12, 2023

(65) Prior Publication Data

US 2023/0192476 A1    Jun. 22, 2023

Related U.S. Application Data

(60) Continuation of application No. 17/114,403, filed on Dec. 7, 2020, now Pat. No. 11,577,954, which is a
(Continued)

(51) Int. Cl.
*B81B 3/00* (2006.01)
*B81B 7/00* (2006.01)
(Continued)

(52) U.S. Cl.
CPC .......... *B81B 3/0051* (2013.01); *B81B 3/0064* (2013.01); *B81B 3/007* (2013.01); (Continued)

(58) Field of Classification Search
CPC ............................ B81B 7/0061; H04R 19/005
See application file for complete search history.

(56) References Cited

U.S. PATENT DOCUMENTS

2014/0270271 A1*  9/2014  Dehe .................. H04R 23/00
                                                    381/174
2015/0001647 A1*  1/2015  Dehe .................. H04R 31/00
                                                    257/416
(Continued)

*Primary Examiner* — Britt D Hanley
*Assistant Examiner* — Victor V Barzykin
(74) *Attorney, Agent, or Firm* — WPAT LAW; Anthony King

(57) ABSTRACT

A MEMS device includes a first multi-layer structure, a second multi-layer structure over the first multi-layer structure, a first semiconductor layer between the first and second multilayer structures, a first air gap separating the first multi-layer structure and the first semiconductor layer, a second air gap separating the first semiconductor layer and the second multi-layer structure, a plurality of semiconductor pillars, and a plurality of second semiconductor pillars. The first semiconductor pillars are exposed to the first air gap, and coupled to the first semiconductor layer and the first multi-layer structure. The second semiconductor pillars are exposed to the second air gap, and coupled to the first semiconductor layer and the second multi-layer structure.

20 Claims, 45 Drawing Sheets

Related U.S. Application Data division of application No. 16/116,105, filed on Aug. 29, 2018, now Pat. No. 10,865,099.

(51) Int. Cl.
*B81B 7/02* (2006.01)
*B81C 1/00* (2006.01)
*H04R 19/00* (2006.01)
*H04R 19/04* (2006.01)
*H04R 31/00* (2006.01)

(52) U.S. Cl.
CPC .......... *B81B 7/0009* (2013.01); *B81B 7/0061* (2013.01); *B81B 7/02* (2013.01); *B81C 1/00158* (2013.01); *H04R 19/005* (2013.01); *B81B 2201/0257* (2013.01); *B81B 2203/0307* (2013.01); *B81B 2203/0361* (2013.01); *H04R 19/04* (2013.01); *H04R 31/00* (2013.01); *H04R 2201/003* (2013.01)

(56) References Cited

U.S. PATENT DOCUMENTS

| | | | |
|---|---|---|---|
| 2018/0086624 A1* | 3/2018 | Cheng | H04R 19/04 |
| 2019/0023562 A1* | 1/2019 | Fueldner | B81C 1/00182 |
| 2019/0098418 A1* | 3/2019 | Hermes | H04R 19/04 |
| 2020/0336842 A1* | 10/2020 | Kwon | B81B 7/0029 |
| 2020/0369514 A1* | 11/2020 | Brioschi | B81B 7/0006 |

* cited by examiner

MICROELECTROMECHANICAL SYSTEM DEVICE

PRIORITY CLAIM AND CROSS-REFERENCE

This application is a continuation of U.S. patent application Ser. No. 17/114,403, filed on Dec. 7, 2020, entitled of "METHOD FOR FORMING SEMICONDUCTOR DEVICE", which is a divisional application of U.S. patent application Ser. No. 16/116,105 filed on Aug. 29, 2018, entitled of "MEMS DEVICE AND METHOD FOR FORMING THE SAME", which is incorporated by reference in its entirety.

BACKGROUND

Microelectromechanical system (MEMS) devices have become widely used in many modern electronic products, such as accelerometers, pressure sensors, inkjet printers, and microphones. A common type of MEMS device includes a MEMS capacitor that has a movable element (sometimes referred to as a proof mass) that functions as a capacitor plate, and a fixed element that functions as the other capacitor plate. The movement of the movable element causes a change in the capacitance of the capacitor. The change in the capacitance may be converted into an electrical signal, and allowing the MEMS device to function as a microphone, an accelerometer, or the like.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
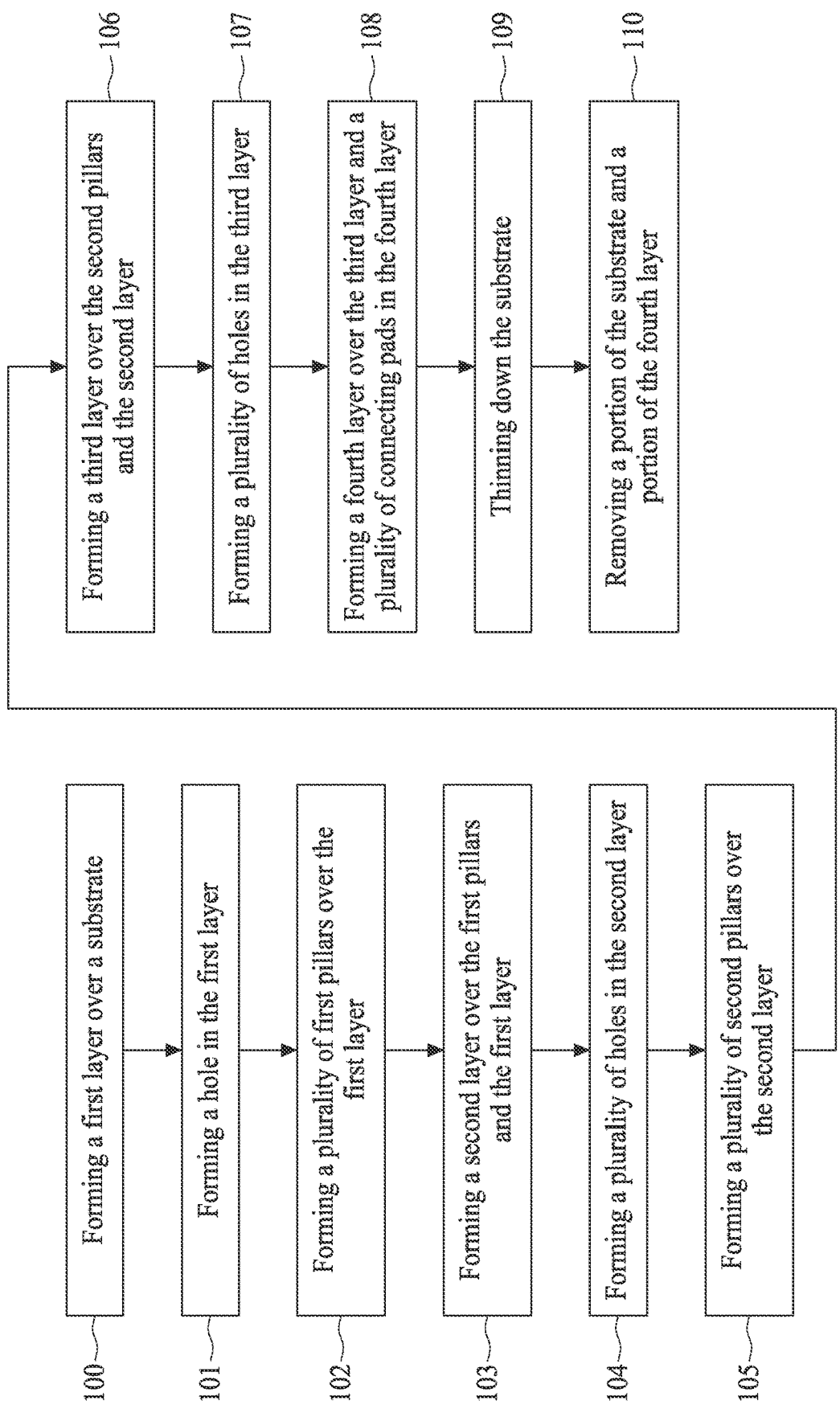
FIG. 1 is a flowchart representing a method for forming a MEMS device according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to ±5%, less than or equal to ±4%, less than or equal to ±3%, less than or equal to ±2%, less than or equal to ±1%, less than or equal to 0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.10, or less than or equal to ±0.05°.

In some embodiments, MEMS microphone includes a silicon substrate and a plate capacitor including a diaphragm (sometimes referred to as a membrane) and a back plate separated from the diaphragm by an air gap. The width of the air gap between the diaphragm and the back plate is changed when the diaphragm is driven to vibrate by sound waves, thus changing the capacitance of the plate capacitor. In this way, the MEMS microphone converts the sound waves into electrical signals.

When designing the MEMS microphone, it is typically desirable to achieve good sensitivity, high signal-to-noise ratio (SNR) and high acoustic overload point (AOP). AOP is one of the most important quality indicators for a MEMS microphone besides SNR. AOP describes the sound pressure level input into a microphone necessary to cause unacceptable distortion of its output (typically 10%), and is often expressed in units of dBSPL. Wind and loud noises cause microphones to exceed their AOP. Exceeding the AOP causes clipping of the output signals. Input sound pressure levels beyond the AOP of the microphone typically make voice signals unintelligible and foil signal processing that is intended to reduce noise.

AOP can be improved by increasing membrane stiffness or reducing bias voltage. However, such methods reduce SNR and sensitivity of the MEMS microphone. In other words, a trade-off exists between achieving a high SNR and good sensitivity and achieving a high AOP. Further, MEMS microphones are very sensitive to contaminating particles entering the air gap. It is found that particles in the air gap reduce the vibration of the membrane during sensing of the acoustic signal. That is, such particles can restrict the membrane's ability to vibrate sufficiently, resulting in malfunction.

The present disclosure therefore provides a MEMS device having semiconductor or insulating pillars in contact with top and bottom membranes. It can be taken as that the membrane stiffness of the top and bottom membranes is improved because the pillars press against the vibration and help to maintain the space between the top and bottom membranes. Therefore, AOP, which describes the sound pressure level input to cause unacceptable membrane distortion, is increased without reducing the bias voltage. Further, the MEMS device provided by the present disclosure can also include a membrane designed to reduce particles entering the air gap and a membrane designed to have large vent holes or air flow channels to maintain good sensitivity and SNR.

FIG. 1 is a flowchart of a method 10 for forming a MEMS device. The method 10 includes an operation 100 where a first layer is formed over a substrate. In some embodiments, the first layer can be a semiconductor layer or a multi-layer structure. The method 10 includes an operation 101 where a hole is formed in the first layer. The method 10 further includes an operation 102 where a plurality of first pillars is formed over the first layer. The method 10 further includes an operation 103 where a second layer is formed over the first pillars and the first layer. In some embodiments, the second layer can be a semiconductor layer or a multi-layer structure. The method 10 further includes an operation 104 where a plurality of holes is formed in the second layer. The method 10 further includes an operation 105 where a plurality of second pillars is formed over the second layer. The method 10 further includes an operation 106 where a third layer is formed over the second pillars and the second layer. In some embodiments, the third layer can be a semiconductor layer or a multi-layer structure. The method 10 further includes an operation 107 where a plurality of holes is formed in the third layer. The method 10 further includes an operation 108 where a fourth layer is formed over the third layer and a plurality of connecting is formed in the fourth layer. The method 10 further includes an operation 109 where the substrate is thinned down. The method 10 further includes an operation 110 where a portion of the substrate and a portion of the fourth layer are removed. The method 10 will be further described according to one or more embodiments. It should be noted that the operations of the method 10 may be rearranged or otherwise modified within the scope of the various aspects. It should be further be noted that additional processes may be provided before, during, and after the method 10, and that some other processes may only be briefly described herein. Thus, other implementations are possible within the scope of the various aspects described herein.

Figure 2:
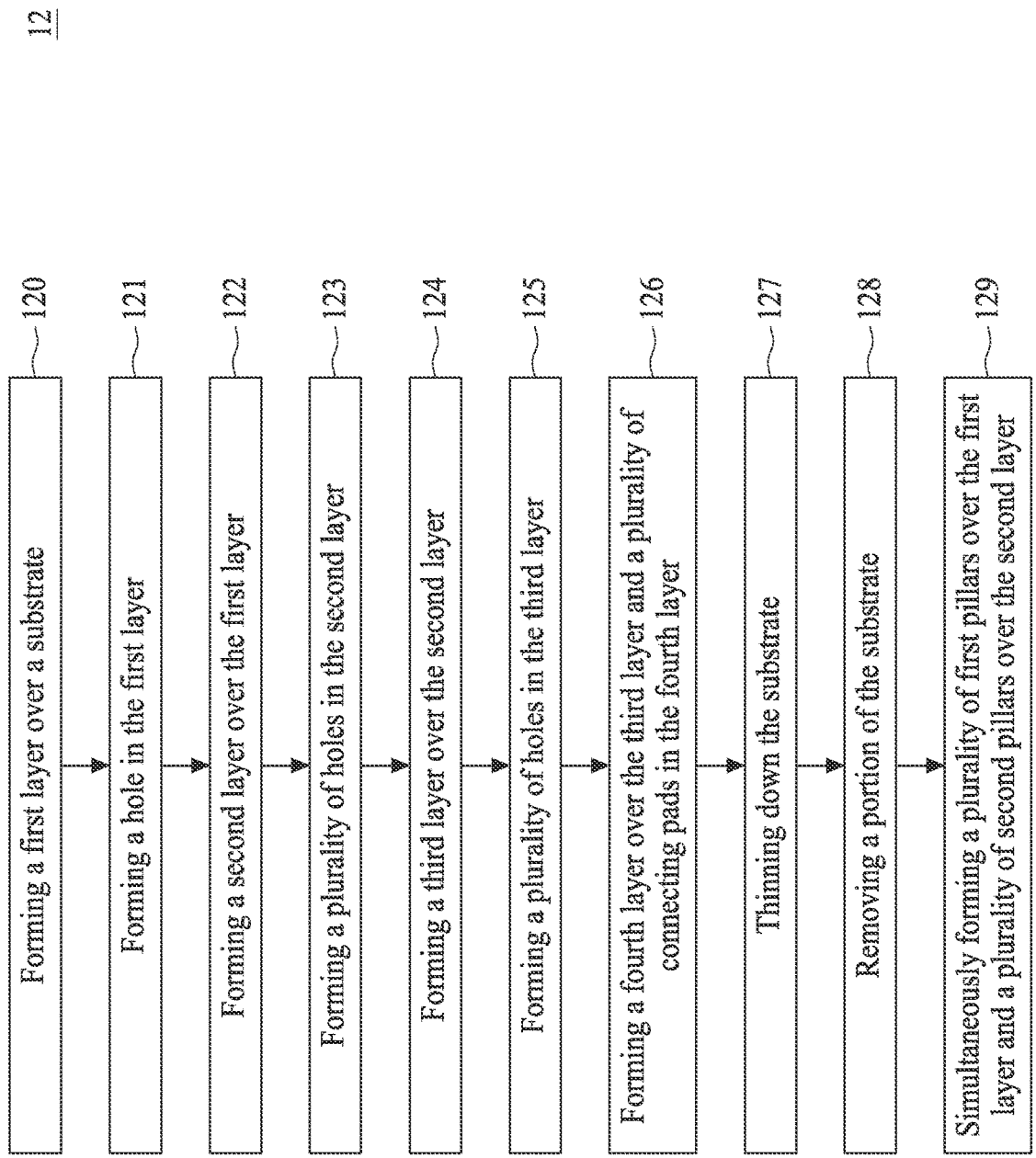
FIG. 2 is a flowchart representing a method for forming a MEMS device according to aspects of the present disclosure.

FIG. 2 is a flowchart of a method 12 for forming a MEMS device. The method 12 includes an operation 120 where a first layer is formed over a substrate. In some embodiments, the first layer can be a semiconductor layer or a multi-layer structure. The method 12 includes an operation 121 where a hole is formed in the first layer. The method 12 further includes an operation 122 wherein a second layer is formed over the first layer. In some embodiments, the second layer can be a semiconductor layer or a multi-layer structure. The method 12 further includes an operation 123 where a plurality of holes is formed in the second layer. The method 12 further includes an operation 124 wherein a third layer is formed over the second layer. In some embodiments, the third layer can be a semiconductor layer or a multi-layer structure. The method 12 further includes an operation 125 where a fourth layer is formed over the third layer and a plurality of connecting is formed in the fourth layer. The method 10 further includes an operation 126 where the substrate is thinned down. The method 10 further includes an operation 127 where a portion of the substrate is removed. The method 12 further includes an operation 128 where a portion of the substrate is removed. The method 12 further includes an operation 129 where a plurality of first pillars over the first layer and a plurality of second pillars over the second layer are simultaneously formed. The method 12 will be further described according to one or more embodiments. It should be noted that the operations of the method 12 may be rearranged or otherwise modified within the scope of the various aspects. It should further be noted that additional processes may be provided before, during, and after the method 12, and that some other processes may only be briefly described herein. Thus, other implementations are possible within the scope of the various aspects described herein.

Figure 3A:
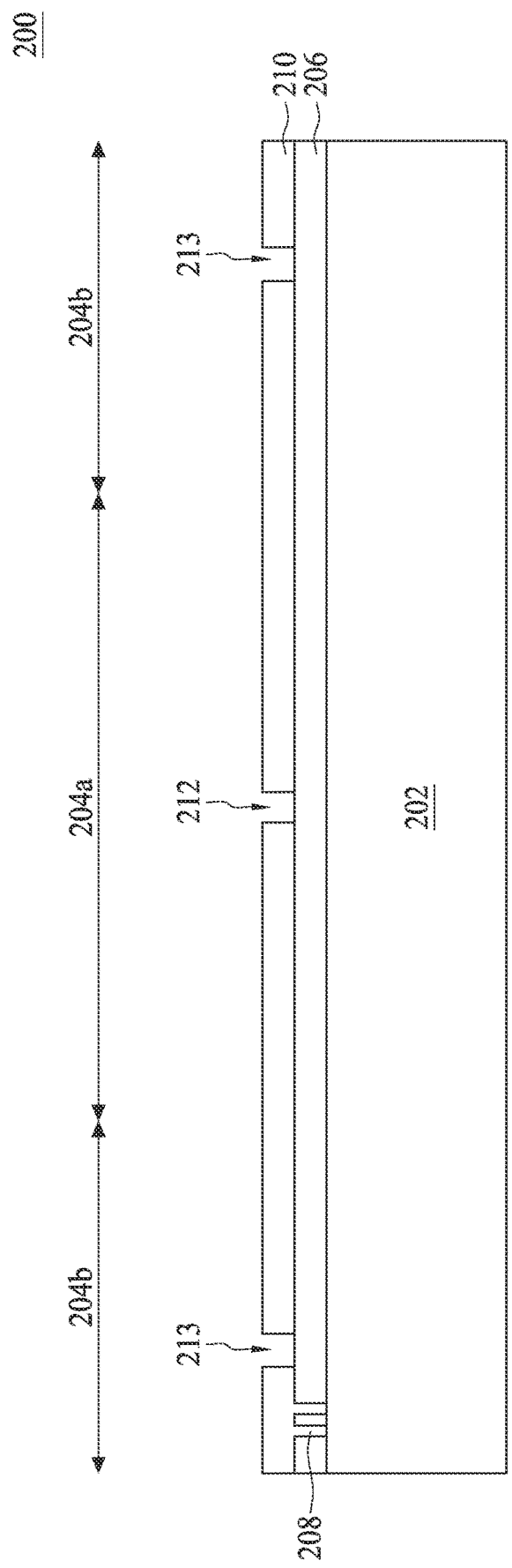
FIGS. 3A to 3K are schematic drawings illustrating a MEMS device at various fabrication stages constructed according to aspects of the present disclosure in one or more embodiments.

FIGS. 3A to 3K are schematic drawings illustrating a MEMS device 200 at various fabrication stages constructed according to aspects of the present disclosure in one or more embodiments. As shown in FIG. 3A, a substrate 202 is provided. In some embodiments, the substrate 202 is a bulk semiconductor substrate including one or more of, for example, silicon (Si), germanium (Ge), silicon carbide (SiC), a group III element, and a group IV element. The substrate 202 can have a first region 204a and a second region 204b defined thereon. In some embodiments, the second region 204b surrounds the first region 204a, but the disclosure is not limited thereto. In some embodiments, integrated circuit (IC) devices (not shown) can be formed in the second region 204b of the substrate 202, but the disclosure is not limited thereto. An insulating layer 206 is formed over the substrate 202. In some embodiments, the insulating layer 206 includes silicon oxide (SiO), but the disclosure is not limited thereto. The insulating layer 206 is formed to provide electrical isolation and serves as an etch stop layer, but the disclosure is not limited thereto.

Still referring to FIG. 3A, a plurality of connecting structures 208 are formed in the insulating layer 206 in the second region 204b. In some embodiments, the connecting structures 208 include Si, such as doped polysilicon, but the disclosure is not limited thereto. A first semiconductor layer 210 is formed over the substrate 202 according to operation 100 of the method 10. In some embodiments, the semiconductor layer 210 includes Si, such as doped polysilicon, but the disclosure is not limited thereto. In some embodiments, the connecting structures 208 are formed with the forming of the first semiconductor layer 210. Further, the connecting structures 208 are in contact with the substrate 202 and the first semiconductor layer 210 to provide electrical connection in the second region 204b. Subsequently, the first semiconductor layer 210 is patterned to form at least a hole 212 in the first region 204a according to operation 101. Further, a plurality of trenches 213 can be formed in the second region 204b simultaneously with the forming of the hole 212. A width of the trenches 213 is less than a width of the hole 212. In some embodiments, a width of the hole 212 is less than approximately 3 μm, but the disclosure is not limited thereto. In some embodiments, a width of the trenches 213 is between approximately 0.5 μm and 2 μm, but the disclosure is not limited thereto. As shown in FIG. 3A, the trenches 213 in the second region 204b are offset from the connecting structures 208. In some embodiments, the hole 212 is configured to serve as a vent hole, while the trenches 213 are configured to provide electrical isolation between elements such as a membrane and an interconnect structures formed thereafter.

Figure 3B:
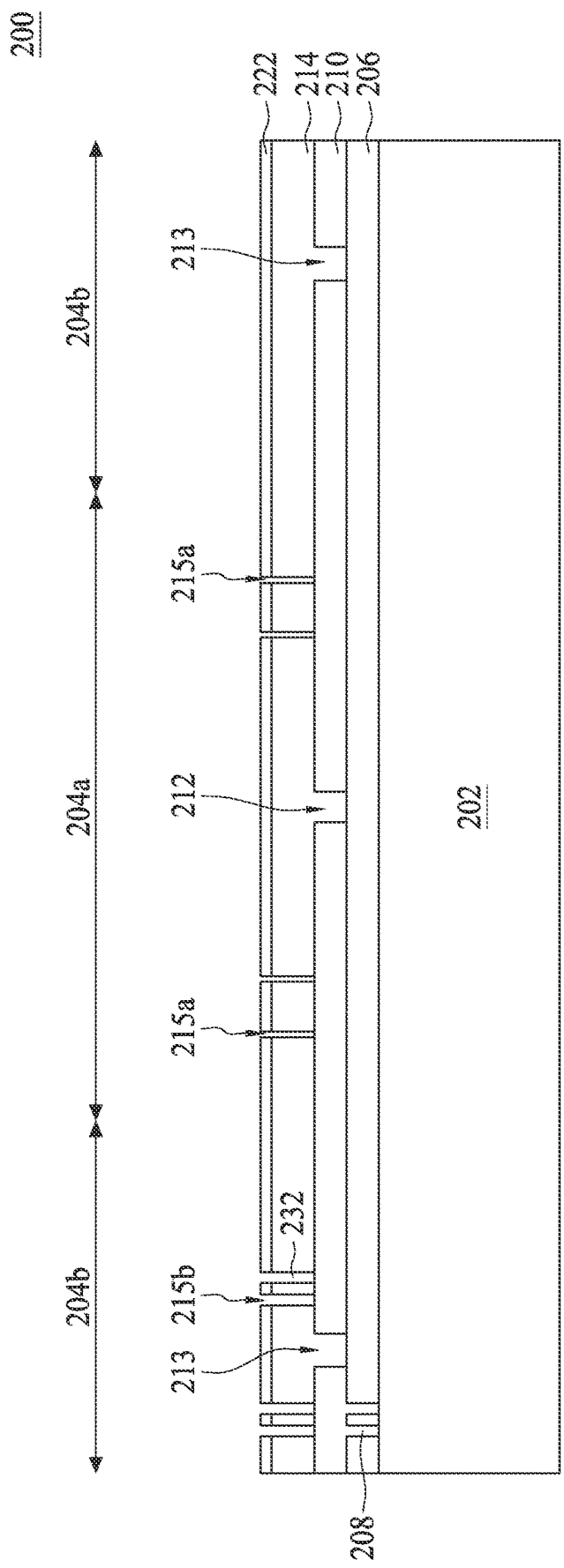
Figure 3C:
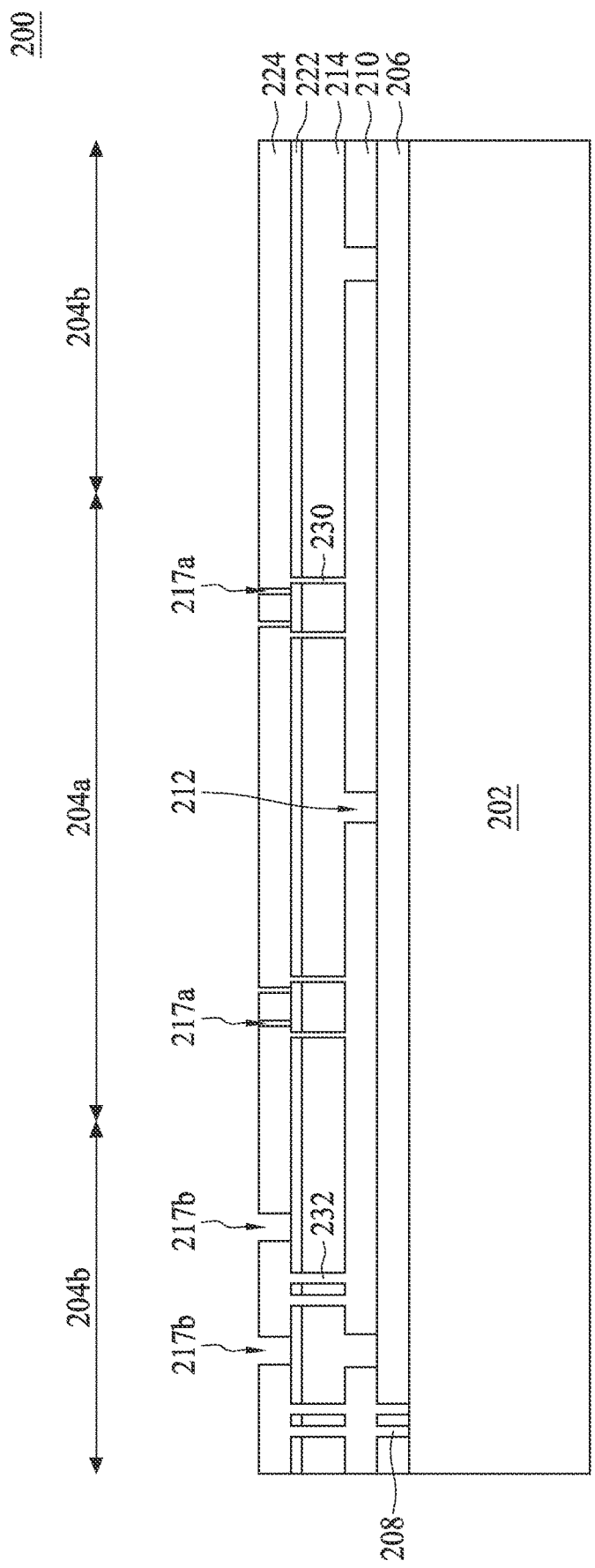

Referring to FIGS. 3B and 3C, a plurality of first pillars are formed over the first semiconductor layer 210 according to operation 102. In some embodiments, insulating layers 214 and 222 are formed on the first semiconductor layer 210 in operation 102, and the hole 212 and the trenches 213 are filled with the insulating layer 214. The insulating layer 214 and the insulating layer 222 can include different materials. For example, the insulating layer 214 can include tetraethylorthosilicate (TEOS), and the insulating layer 222 can include silicon nitride (SiN), but the disclosure is not limited thereto. A thickness of the insulating layer 214 is greater than a thickness of the insulating layer 222. It should be noted that the thickness of the insulating layer 214 substantially defines a spacing distance between the first semiconductor layer 210 and an overlaying layer to be formed thereon. Subsequently, a plurality of trenches 215a and a plurality of trenches 215b are formed in the insulating layer 214 and the insulating layer 222 in operation 102. As shown in FIG. 3B, the trenches 215a are formed in the first region 204a, and the trenches 215b are formed in the second region 204b. Further, the first semiconductor layer 210 is exposed through the trenches 215a and 215b. In some embodiments, a width of the trenches 215a is between approximately 0.5 μm and approximately 50 μm, and a width of the trenches 215b is between approximately 0.5 μm and approximately 50 μm, but the disclosure is not limited thereto. In some embodiments, the width of the trenches 215a is less than the width of the trenches 215b, but the disclosure is not limited thereto.

Referring to FIG. 3C, a semiconductor material is next formed over the substrate 202 to fill the trenches 215a. Accordingly, a plurality of first semiconductor pillars 230 is formed over the first semiconductor layer 210 in the first region 204a in operation 102. Further, the semiconductor material fills the trenches 215b in the second region 204b and thus a plurality of connecting structures 232 are formed. In some embodiments, the semiconductor material can include Si, such as doped polysilicon, but the disclosure is not limited thereto. The first semiconductor pillars 230 in the first region 204a are in contact with the first semiconductor layer 210, as shown in FIG. 3C. In some embodiments, the connecting structures 232 in the second region 204b can be electrically connected to the first semiconductor layer 210 or to the connecting structure 208 through the first semiconductor layer 210. Because the first semiconductor pillars 230 and the connecting structures 232 are formed by filling the trenches 215a and 215b, a width of the first semiconductor pillars 230 is substantially the same as a width of the trenches 215a, and a width of the connecting structures 232 is substantially the same as the width of the trenches 215b. In some embodiments, the width of the first semiconductor pillars 230 is between approximately 0.5 μm and approximately 50 μm, and the width of the connecting structures 232 is between approximately 0.5 μm and approximately 50 μm, but the disclosure is not limited thereto.

Further, a semiconductor layer 224 is formed over the first semiconductor pillars 230 and the first semiconductor layer 210. The semiconductor layer 224 is patterned to form at least a plurality of trenches 217a in the first region 204a and a plurality of trenches 217b in the second region 204b. In some embodiments, a width of the trenches 217a is less than a width of the trenches 217b, but the disclosure is not limited thereto. In some embodiments, the width of the trenches 217b in the second region 204b is between approximately 1 μm and approximately 2 μm, but the disclosure is not limited thereto. Additionally, the width of the trenches 217a in the first region 204a can be the same as the width of the first semiconductor pillars 230, but the disclosure is not limited thereto. In some embodiments, the trenches 217a are offset from the first semiconductor pillars 230, but the disclosure is not limited thereto. In some embodiments, the trenches 217a are configured to provide electrical isolation between elements such as membranes formed thereafter, while the trenches 217b are configured to provide electrical isolation between elements such as interconnect structures formed thereafter.

Figure 3D:
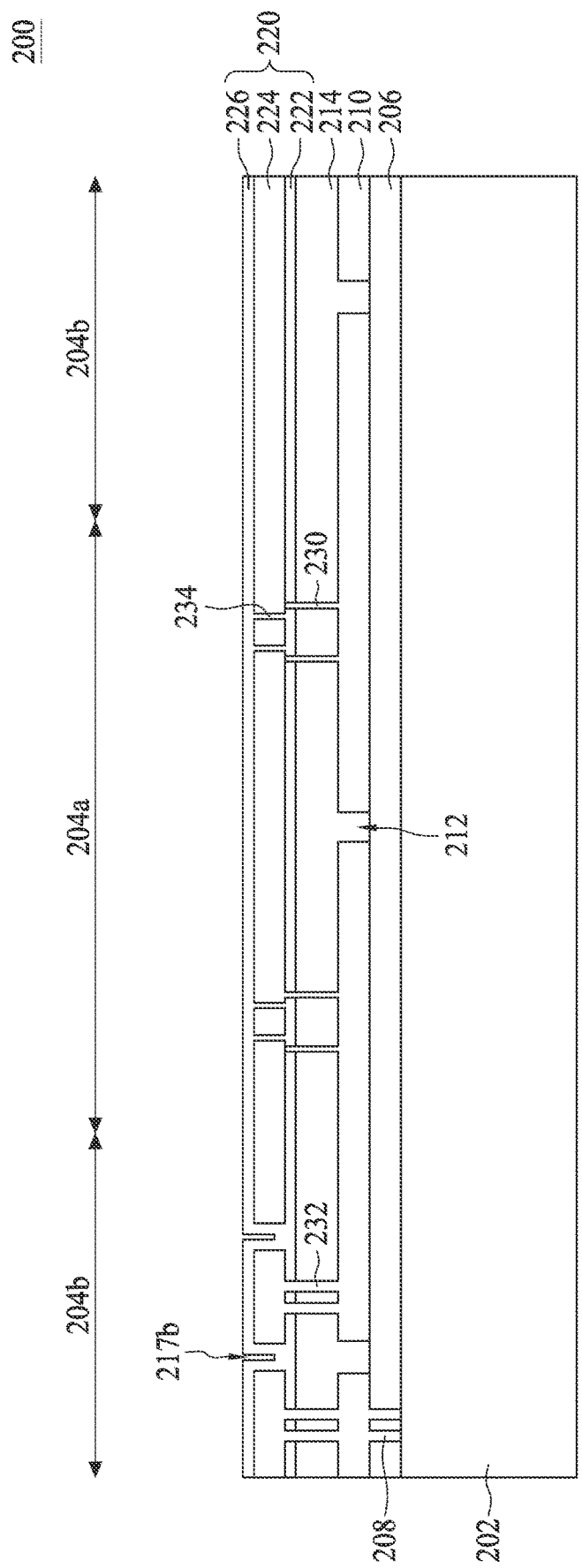

Referring to FIG. 3D, next, an insulating layer 226 is formed on the semiconductor layer 224. The insulating layer 226 can include the same material as that of the insulating layer 222, but the disclosure is not limited thereto. A thickness of the insulating layer 226 can be the same as the thickness of the insulating layer 222, but the disclosure is not limited thereto. In some embodiments, a multi-layer structure 220 including the insulating layer 222, the semiconductor layer 224 and the insulating layer 226 is formed. The multi-layer structure 220 is taken as a second layer formed over the first semiconductor layer 210 and the first semiconductor pillars 230 according to operation 103. Further, the insulating layer 226 fills the trenches 217a and thus forms a plurality of isolation structures 234 in the semiconductor layer 224 in the first region 204a. In some embodiments, the insulating layer 226 is conformally formed over the semiconductor layer 224, such that the insulating layer 226 covers a bottom and sidewalls of the trenches 217b, as shown in FIG. 3D. However, in other embodiments, the insulating layer 226 can fill the trenches 217b in the second region 204b.

Figure 3E:
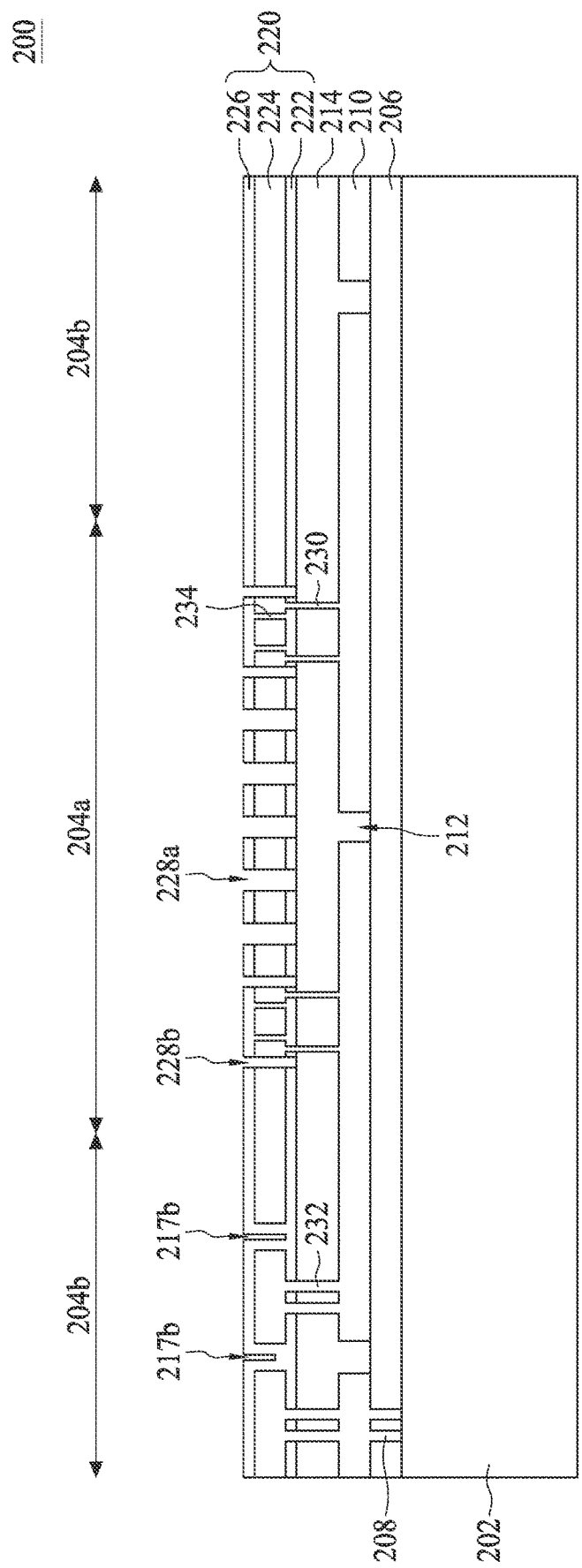

Referring to FIG. 3E, a plurality of holes 228a is formed in the multi-layer structure 220 according to operation 104. The holes 228a are formed in the first region 204a. In some embodiments, a plurality of trenches 228b is formed in the first region 204a simultaneously with the forming of the holes 228a. As shown in FIG. 3E, the holes 228a and the trenches 228b penetrate the multi-layer structure 220. In some embodiments, a width of the holes 228a is between approximately 1 μm and approximately 50 μm, but the disclosure is not limited thereto. In some embodiments, the width of the holes 228a is greater than a width of the trenches 228b. The holes 228a are configured to serve as acoustic holes, while the trenches 228b are configured to provide mechanical isolations between elements such as a back plate and the interconnect structures formed thereafter.

Figure 3F:
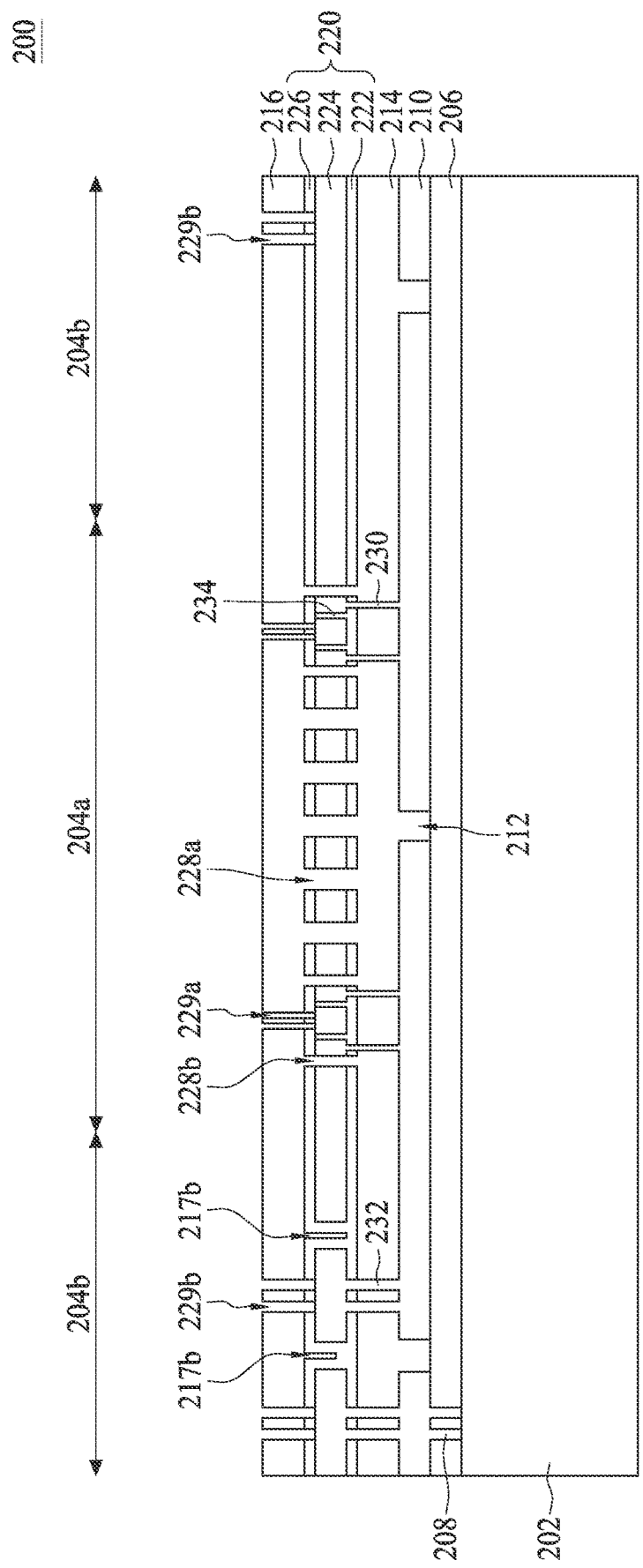
Figure 3G:
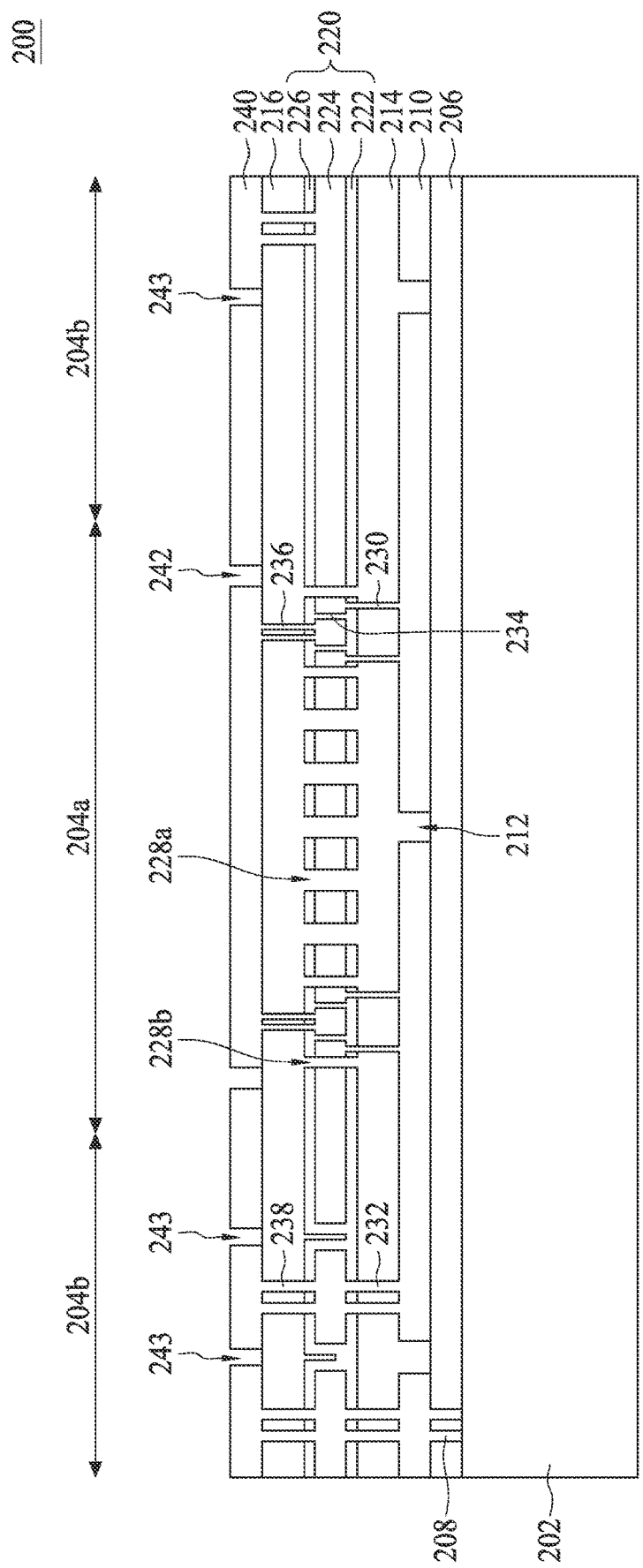

Referring to FIGS. 3F and 3G, a plurality of second pillars is formed over the multi-layer structure 220 according to operation 105. In some embodiments, an insulating layer 216 is formed over the multi-layer structure 220 in operation 105. In some embodiments, the insulating layer 216 can include materials different from those of the insulating layer 226, but the insulating layer 216 can include the same materials as the insulating layer 214. As shown in FIG. 3F, the insulating layer 216 fills the holes 228a and the trenches 228b in the first region 204a and the trenches 217b in the second region 204b. It should be noted that a thickness of the insulating layer 216 substantially defines a spacing distance between the multi-layer structure 220 and an overlaying layer to be formed thereon. Subsequently, a plurality of trenches 229a and a plurality of trenches 229b are formed in the insulating layer 216 in operation 105. As shown in FIG. 3F, the trenches 229a are formed in the first region 204a, and the trenches 229b are formed in the second region 204b. Further, the semiconductor layer 224 of the multi-layer structure 220 is exposed through the trenches 229a and the trenches 229b. In some embodiments, a width of the trenches 229a can be substantially the same as the width of the first semiconductor pillars 230, and a width of the trenches 229b can be substantially the same as the width of the connecting structures 232, but the disclosure is not limited thereto. It should also be noted that in some embodiments, the trenches 229a in the first region 204a are offset from the isolation structures 234, the first semiconductor pillars 230, the holes 228a and the trenches 228b, as shown in FIG. 3F.

Referring to FIG. 3G, a semiconductor material is next formed over the substrate 202 to fill the trenches 229a and 229b. The semiconductor material fills the trenches 229a in the first region 204a and thus a plurality of second semiconductor pillars 236 is formed over the multi-layer structure 220 according to operation 105. Further, the semiconductor material fills the trenches 229b and thus a plurality of connecting structures 238 is formed in the second region 204b. The second semiconductor pillars 236 in the first region 204a are in contact with the semiconductor layer 224 of the multi-layer structure 220, as shown in FIG. 3G. In some embodiments, the connecting structures 238 in the second region 204b can be electrically connected to the semiconductor layer 224 of the multi-layer structure 220. Because the second semiconductor pillars 236 and the connecting structures 238 are formed by filling the trenches 229a and 229b, a width of the second semiconductor pillars 236 is substantially the same as the width of the trenches 229a, and a width of the connecting structures 238 is substantially the same as the width of the trenches 229b.

A second semiconductor layer 240 is formed over the second semiconductor pillars 236 and the multi-layer structure 220 according to operation 106. Subsequently, the second semiconductor layer 240 is patterned to form a plurality of holes 242 in the first region 204a according to operation 107. In some embodiments, a plurality of trenches 243 is formed in the second region 204b simultaneously with the forming of the holes 242. In some embodiments, a width of the holes 242 in the first region 204a is between approximately 1 m and approximately 50 μm, but the disclosure is not limited thereto. In some embodiments, a width of the trenches 243 is between approximately 0.5 μm and 2 μm, but the disclosure is not limited thereto. In some embodiments, the holes 242 are offset from the second semiconductor pillars 236, but the disclosure is not limited thereto.

Figure 3H:
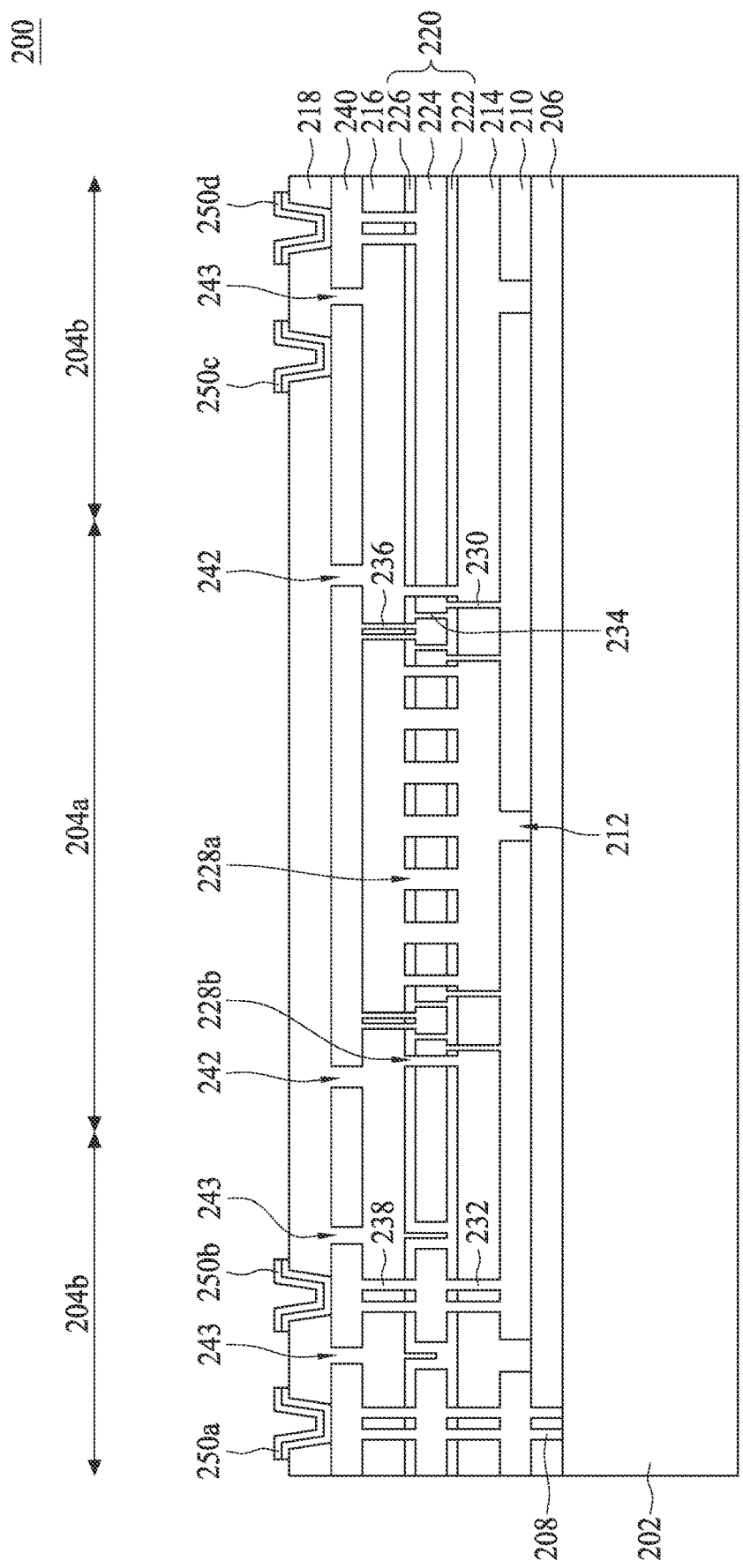

Referring to FIG. 3H, an insulating layer 218 is next formed over the second semiconductor layer 240 in operation 108. In some embodiments, the insulating layer 218 can include the same materials as the insulating layer 216. As shown in FIG. 3H, the insulating layer 218 fills the holes 242 in the first region 204a and the trenches 243 in the second region 204b. Subsequently, a plurality of openings (not shown) are formed in the insulating layer 218, and a plurality of connecting pads 250a to 250d are formed in the openings in operation 108.

Figure 3I:
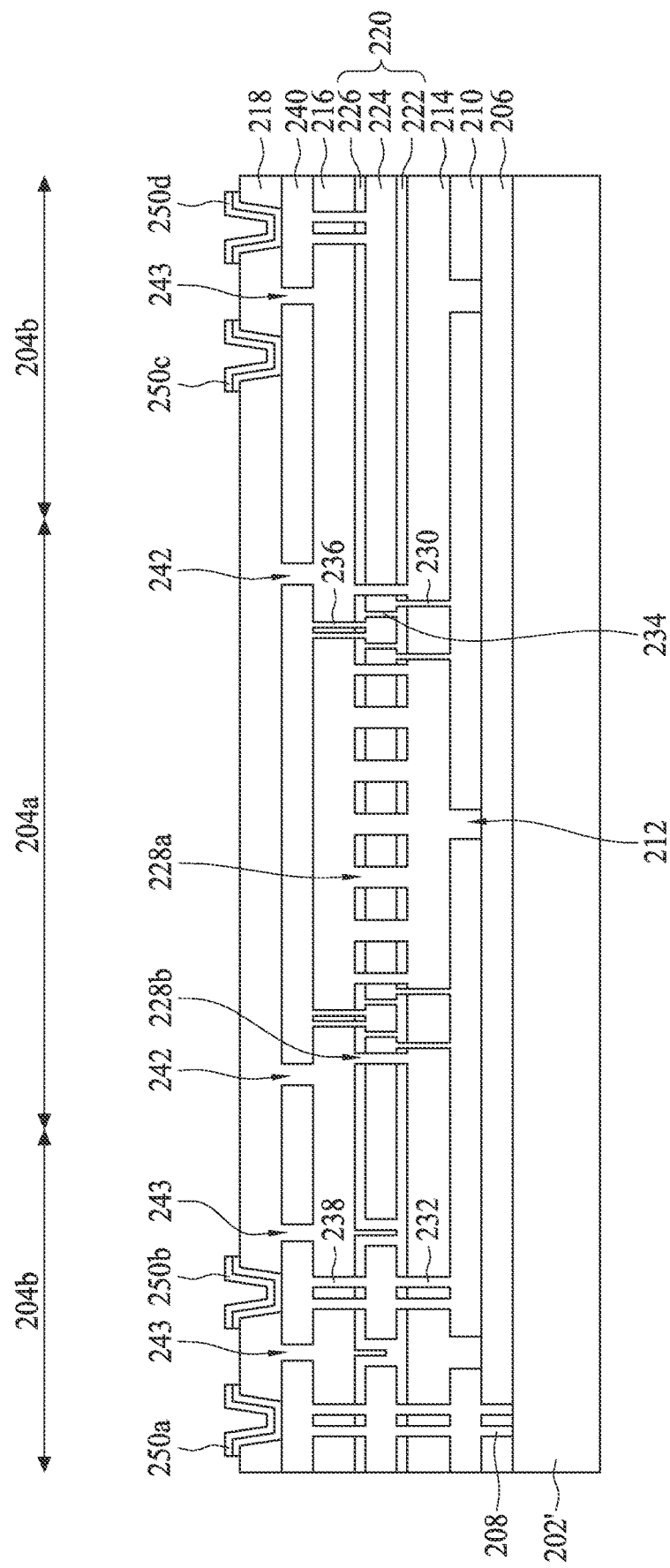

Referring to FIG. 3I, the substrate 202 is next grinded or thinned down on a side opposite to the first semiconductor layer 210, the multi-layer structure 220, and the second semiconductor layer 240 according to operation 109. In some embodiments, the substrate 202 can be thinned down to a desired thickness by a chemical mechanical polishing (CMP) operation, but the disclosure is not limited thereto. Consequently, a thinned substrate 202' is obtained as shown in FIG. 3I. In some embodiments, a thickness of the thinned substrate 202' is between approximately 200 μm and approximately 400 μm, but the disclosure is not limited thereto.

Figure 3J:
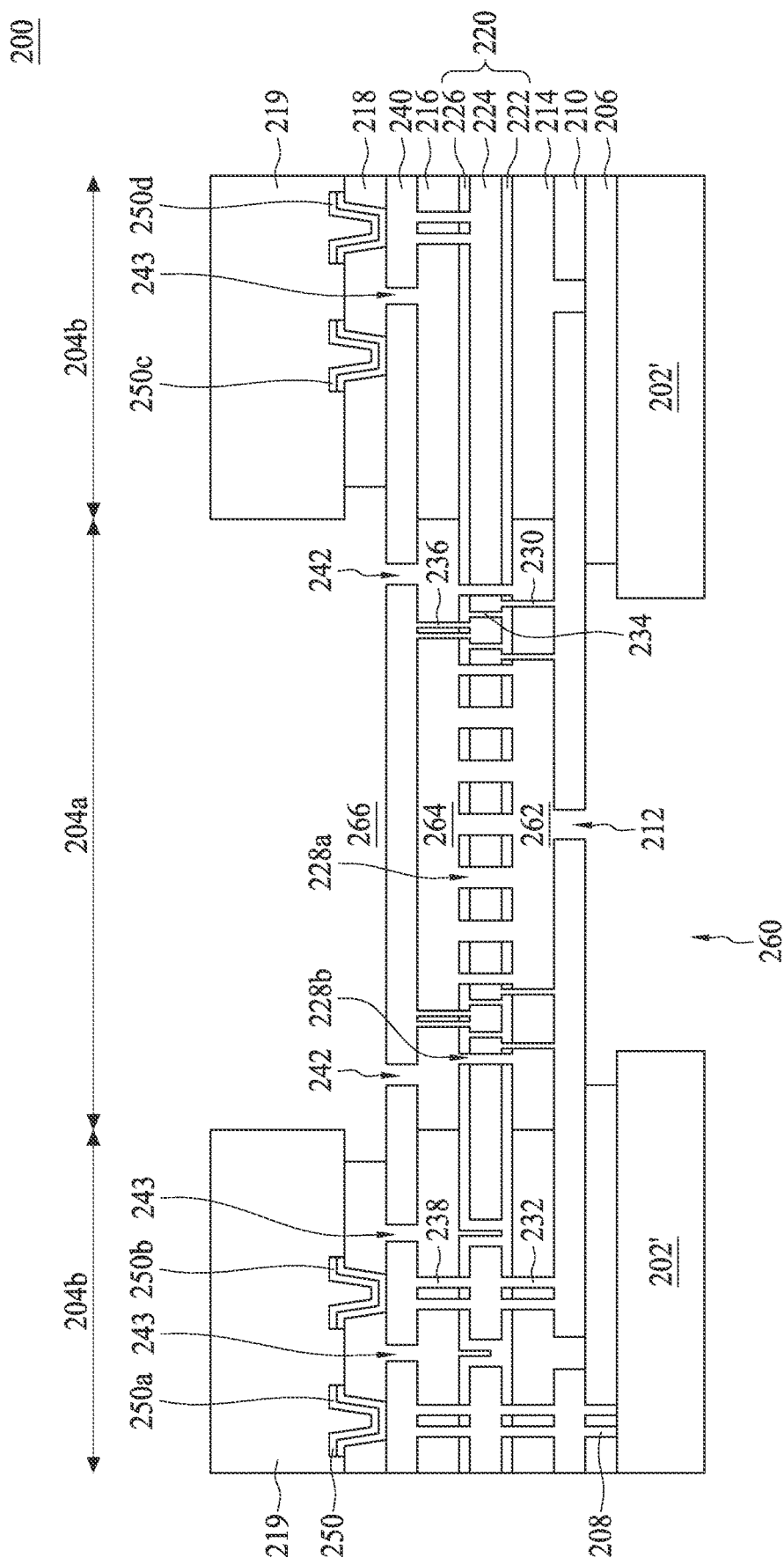

Referring to FIG. 3J, a patterned photoresist 219 is next formed on the insulating layer 218 and the connecting pads 250. The patterned photoresist 219 includes an opening substantially corresponding to the first region 204a. Next, a portion of the thinned substrate 202' is removed to form an environment port 260 substantially in the first region 204a according to operation 110, as shown in FIG. 3J. Next, an etching operation is performed to remove a portion of the insulating layer 218 through the opening in operation 110. Further, a portion of the insulating layer 216, a portion of the insulating layer 214, and a portion of the insulating layer 206 are removed through the opening by the etching operation. In some embodiments, the etching operation includes introducing vapor hydrofluoric (vHF) acid through the opening, but the disclosure is not limited thereto. The etching operation removes the portion of the insulating layer 218 in the first region 204a exposed through the patterned photoresist 219 to form an opening 266. The etching operation further removes the insulating layer 218 from the holes 242, and thus the holes 242 are again visible. The etching operation further removes a portion of the insulating layer 216 in the first region 204a to form an air gap 264. The etching operation further removes the insulating layer 216 from the holes 228a and the trenches 228b, and the holes 228a and the trenches 228b are again visible. The etching operation further removes a portion of the insulating layer 214 in the first region 204a to form an air gap 262. The etching operation further removes the insulating layer 214 from the hole 212, and the hole 212 is again visible. The etching operation further removes the insulating layer 206, such that the air gap 262 is in communication with the environmental port 260, as shown in FIG. 3J. Next, the patterned photoresist 219 is removed. Additionally, a width of the opening 266 can be greater than a width of the air gaps of 264 and 262, and the width of air gaps 264 and 262 can be greater than a width of the environment port 260, but the disclosure is not limited thereto.

Figure 3K:
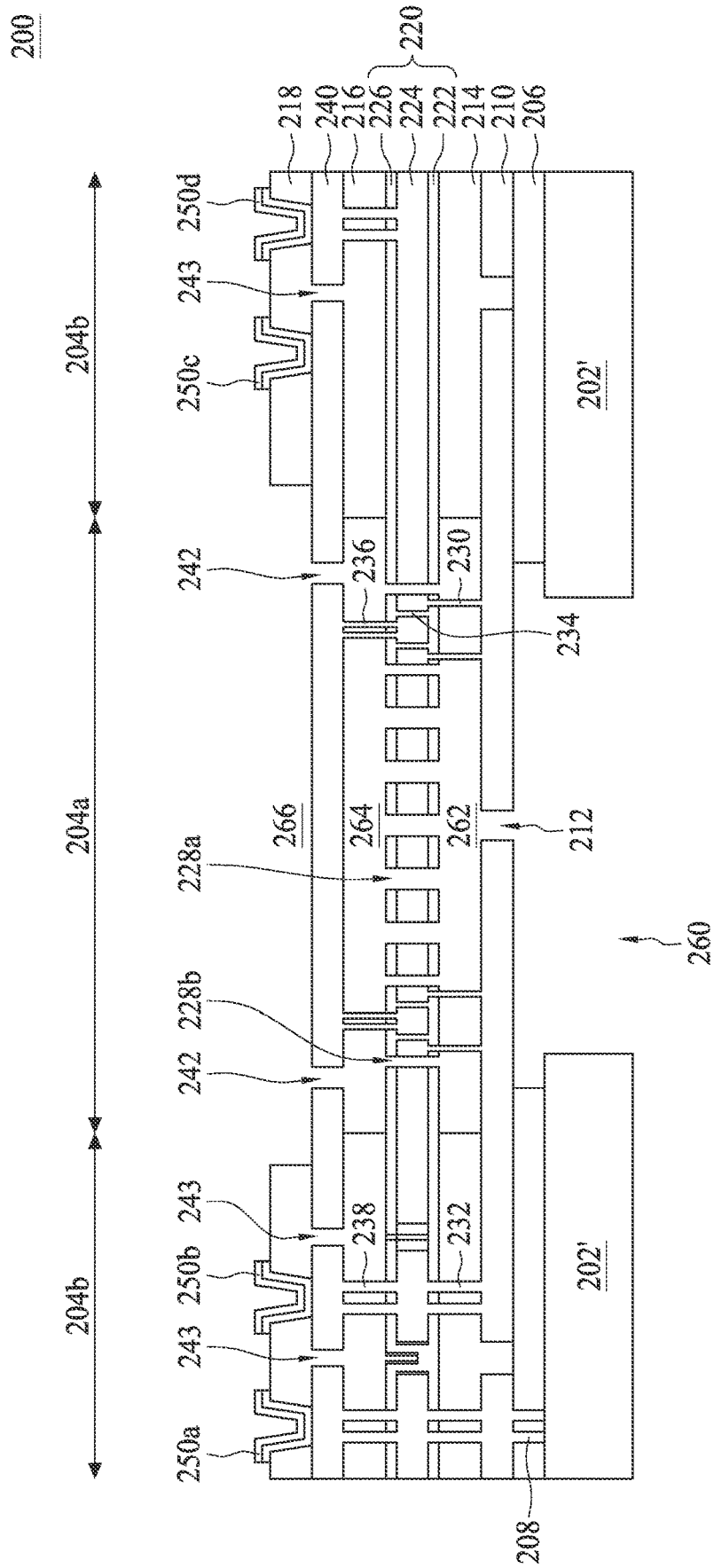

Referring to FIG. 3K, a MEMS device 200 is formed accordingly. The MEMS device 200 includes the substrate 202' and the insulating layer 206, and the environment port 260 is formed to penetrate the substrate 202' and the insulating layer 206 in the first region 204a. As shown in FIG. 3K, the environment port 260 is in communication with an ambient environment. The MEMS device 200 further includes the first semiconductor layer 210 and the second semiconductor layer 240. The first semiconductor layer 210 and the second semiconductor layer 240 include the same material, such as doped polysilicon, but the disclosure is not limited thereto. As shown in FIG. 3K, the second semiconductor layer 240 is separated from the substrate 202' by the first semiconductor layer 210. The MEMS device 200 further includes the multi-layer structure 220 disposed between the first semiconductor layer 210 and the second semiconductor layer 240.

A portion of the first semiconductor layer 210 corresponding to the environment port 260 or in the first region 204a is referred to as a first movable portion, and a portion of the first semiconductor layer 210 in the second region 204b is referred to as a first anchor portion. In some embodiments, the first anchor portion substantially surrounds the first movable portion, but the disclosure is not limited thereto. It should be noted that at least the first hole 212 is formed in and penetrates the first movable portion of the first semiconductor layer 210, as shown in FIG. 3K. The first hole 212 is configured to serves as a vent hole. In some embodiments, the first hole 212 is formed substantially in a center of the movable portion (in the first region 204a), but the disclosure is not limited thereto. A portion of the second semiconductor layer 240 corresponding to the environment port 260 or in the first region 204a is referred to as a second movable portion, and a portion of the second semiconductor layer 240 in the second region 204b is referred to as a second anchor portion. In some embodiments, the second anchor portion substantially surrounds the second movable portion, but the disclosure is not limited thereto. It should be noted that the plurality of second holes 242 are formed in and penetrate the second movable portion of the second semiconductor layer 240, as shown in FIG. 3K. The second holes 242 serve as air flow channels. Further, the plurality of holes 228a and the plurality of trenches 228b are formed in and penetrate the multi-layer structure 220, and the holes 228a and the trenches 228b are formed in the first region 204a. In some embodiments, the holes 228a and the trenches 228b are formed corresponding to the first movable portion of the first semiconductor layer 210 and the second movable portion of the second semiconductor layer 240. The holes 228a serve as acoustic holes, while the trenches 228b serve to provide mechanical isolation.

Still referring to FIG. 3K, the air gap 262 is disposed between the first semiconductor layer 210 and the multi-layer structure 220 to separate the first semiconductor layer 210 and the multi-layer structure 220. Further, the air gap 262 is in communication with the environment port 260 via the first hole 212. The air gap 264 is disposed between the second semiconductor layer 240 and the multi-layer structure 220 to separate the second semiconductor layer 240 and the multi-layer structure 220. Further, the air gap 264 is in communication with the air gap 262 via the acoustic holes 228a and the mechanical isolation trenches 228b. The opening 266 is in communication with the air gap 264 via the second holes 242.

Still referring to FIG. 3K, it should be noted that the MEMS device 200 further includes the plurality of first semiconductor pillars 230, the plurality of second semiconductor pillars 236, and the plurality of isolation structures 234. The first semiconductor pillars 230 are formed between and arranged in contact with the first semiconductor layer 210 and the multi-layer structure 220. The first semiconductor pillars 230 are disposed on the first movable portion of the first semiconductor layer 210 and surrounded by the air gap 262. The second semiconductor pillars 236 are formed between and arranged in contact with the second semiconductor layer 240 and the multi-layer structure 220, and the second semiconductor pillars 236 are e surrounded by the air gap 264. The isolation structures 234 are formed in the multi-layer structure 220, and entirely embedded in the multi-layer structure 220. Further, the isolation structures 234 penetrate the semiconductor layer 224 to be in contact with the insulating layers 222 and 226, as shown in FIG. 3K.

In some embodiments, the first semiconductor pillars 230 and the second semiconductor pillar 236 can include the same material. In some embodiments, the first semiconductor layer 210, the second semiconductor layer 240, the first semiconductor pillars 230, and the second semiconductor pillar 236 can include the same material, such as doped polysilicon, but the disclosure is not limited thereto. In some embodiments, the isolation structures 234 can include the same materials as the insulating layer 226 of the multi-layer structure 220. In some embodiments, the width of the first semiconductor pillars 230 and the width of the second semiconductor pillars 236 can be the same, but the disclosure is not limited thereto.

The first semiconductor pillars 230 and the second semiconductor pillars 236 can be offset from each other. The first semiconductor pillars 230 and the second semiconductor pillars 236 can be offset from the isolation structures 234. Further, the first semiconductor pillars 230 are electrically isolated from the second semiconductor pillars 236 by the isolation structures 234. Accordingly, the first semiconductor layer 210, the multi-layer structure 220 and the second semiconductor layer 240 are electrically isolated from and by the trenches 228b and the isolation structures 234. In some embodiments, each of the second holes 242 is between the second anchor portion (in the second region 204b) and the second semiconductor pillars 236, as shown in FIG. 3K. In some embodiments, each of the first semiconductor pillars 230 is entirely separated from the insulating layer 214 by the air gap 262, and each of the second semiconductor pillars 236 is entirely separated from the insulating layer 216 by the air gap 264.

In some embodiments, the first movable portion of the first semiconductor layer 210 and the second movable portion of the second semiconductor layer 240 serve as bottom and up membranes, and the multi-layer structure 220 serves as a back plate for the MEMS device 200. As shown in FIG. 3K, an interconnect structure can be formed by the connecting structure 208, the first semiconductor layer 210, the connecting structure 232, the semiconductor layer 224 in the multi-layer structure 220, the connecting structure 238 and the second semiconductor layer 240. And the interconnect structure provides electrical connection between the substrate 202' and the connecting pad 250a. Another interconnect structure can be formed by the first semiconductor layer 210, the connecting structure 232, the semiconductor layer 224 in the multi-layer structure 220, the connecting structure 238 and the second semiconductor layer 240. And the interconnect structure provides electrical connection between the bottom membrane and the connecting pad 250b. Another interconnect structure can be formed by the semiconductor layer 224 in the multi-layer structure 220, the connecting structure 238 and the second semiconductor layer 240. And the interconnect structure provides electrical connection between the back plate and the connecting pad 250d. Further, the connecting pad 250c is in contact with the second semiconductor layer 240 to provide electrical connection to the up membrane.

Consequently, the MEMS device 200 is referred to as a dual-membrane device. It should be noted that the first semiconductor pillars 230 between the first semiconductor layer 210 and the multi-layer structure 220 and entirely disposed over the first movable portion of the first semiconductor layer 210 improve a stiffness of the first semiconductor layer 210, and the second semiconductor pillars 236 between the second semiconductor layer 240 and the multi-layer structure 220 and entirely disposed over the second movable portion of the second semiconductor layer 240 improve a stiffness of the second semiconductor layer 240. Accordingly, AOP of the MEMS device 200 can be improved without changing bias voltage. Further, the vent hole 212, which allows communication between the environment port 260 and the air gap 262, has the width of less than 3 µm and therefore prevents particles from entering the air gap 262. Particle and air damping issues can therefore both be mitigated. In addition, the second holes 242, which are air flow channels, improve air outflow, and thus performance of the MEMS device 200 can be improved.

Figure 4A:
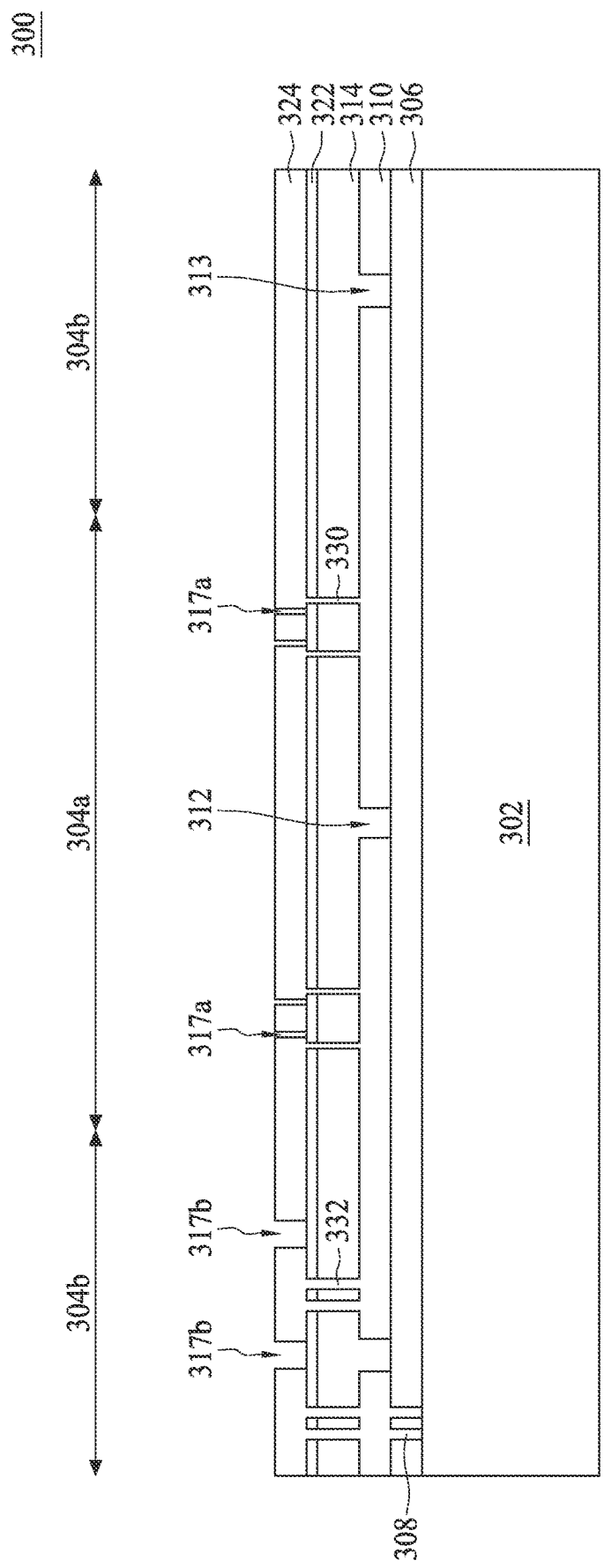
FIGS. 4A to 4G are schematic drawings illustrating a MEMS device at various fabrication stages constructed according to aspects of the present disclosure in one or more embodiments.

FIGS. 4A to 4G are schematic drawings illustrating a MEMS device 300 at various fabrication stages constructed according to aspects of the present disclosure in one or more embodiments. Further, similar elements in FIGS. 4A to 4G and FIGS. 3A to 3K can include similar materials; therefore, repetitive details are omitted in the interest of brevity. As shown in FIG. 4A, a substrate 302 is provided. The substrate 302 can have a first region 304a and a second region 304b defined thereon. In some embodiments, the second region 304b surrounds the first region 304a, but the disclosure is not limited thereto. In some embodiments, IC devices (not shown) can be formed in the second region 304b of the substrate 302, but the disclosure is not limited thereto. In some embodiments, an insulating layer 306 is formed over the substrate 302, and a plurality of connecting structures 308 are formed in the insulating layer 306 in the second region 304b. Further, the connecting structures 308 are in contact with the substrate 302, and are configured to provide electrical connection in the second region 304b.

Still referring to FIG. 4A, a first semiconductor layer 310 is formed over the substrate 302 according to operation 100. Subsequently, the first semiconductor layer 310 is patterned to form at least a hole 312 in the first region 304a and a plurality of trenches 313 in the second region 304b. In some embodiments, a width of the hole 312 is less than approximately 3 µm, but the disclosure is not limited thereto. In some embodiments, the hole 312 in the first region 304a is configured to serve as a vent hole, while the trenches 313 in the second region 304b are configured to provide electrical isolation between elements such as a membrane and interconnect structures formed thereafter.

Figure 4B:
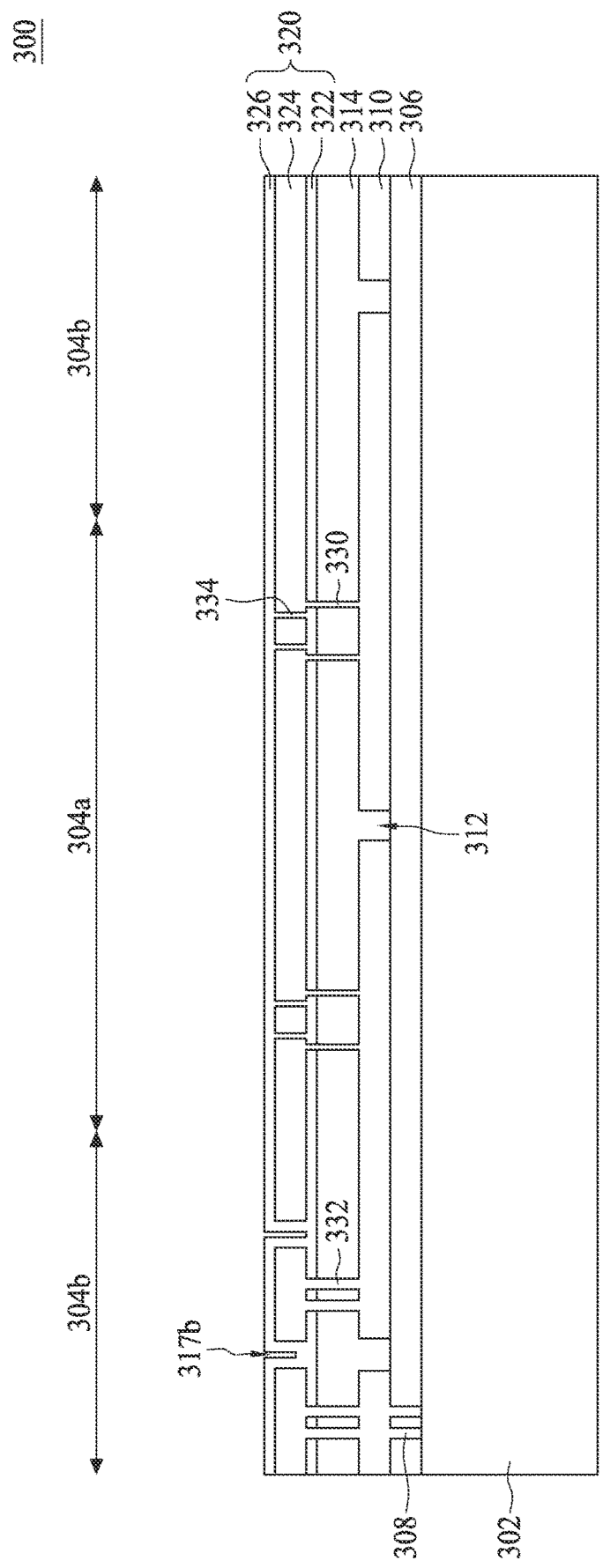

Still referring to FIGS. 4A and 4B, a plurality of first pillars are formed over the first semiconductor layer 310 according to operation 102. In some embodiments, insulating layers 314 and 322 are then formed on the first semiconductor layer 310, and the holes 312 and the trenches 313 are filled with the insulating layer 314. As mentioned above, the insulating layers 314 and 322 can include different materials. A thickness of the insulating layer 314 is greater than a thickness of the insulating layer 322. As mentioned above, the thickness of the insulating layer 314 substantially defines a spacing distance between the first semiconductor layer 310 and an overlaying layer to be formed thereon. Subsequently, a plurality of first semiconductor pillars 330 are formed in the first region 304a according to operation 102. A plurality of connecting structures 332 are formed in the second region 304b simultaneously with the forming of the first semiconductor pillars 330. A semiconductor layer 324 is formed over the first semiconductor pillars 330 and the first semiconductor layer 310. It should be understood that operations for forming the first semiconductor pillars 330 and the connecting structures 332 can be the same as those described above and shown in FIGS. 3B to 3C, and such details are therefore omitted for brevity. In some embodiments, a width of the first semiconductor pillars 330 is less than a width of the connecting structures 332, but the disclosure is not limited thereto. In some embodiments, the width of the first semiconductor pillars 330 is between approximately 0.5 µm and approximately 50 µm, but the disclosure is not limited thereto. The first semiconductor pillars 330 in the first region 304a are in contact with the first semiconductor layer 310, as shown in FIG. 4A. In some embodiments, the connecting structures 332 in the second region 304b can be electrically connected to the first semiconductor layer 310 or to the connecting structure 308 through the first semiconductor layer 310. Subsequently, the semiconductor layer 324 is patterned to form at least a plurality of trenches 317a in the first region 304a and a plurality of trenches 317b in the second region 304b. In some embodiments, a width of the trenches 317a is less than a width of the trenches 317b, but the disclosure is not limited thereto. In some embodiments, the width of the trenches 317b in the second region 304b is between approximately 1 µm and 2 µm, but the disclosure is not limited thereto. The width of the trenches 317a in the first region 304a can be the same as the width of the first semiconductor pillars 330, but the disclosure is not limited thereto. The trenches 317a are offset from the first semiconductor pillars 330, and the trenches 317b are offset from the connecting structures 332. In some embodiments, the trenches 317a and 317b are both configured to provide electrical isolation. In some embodiments, the trenches 317a are provide to electrical isolation between elements such as membranes formed thereafter, while the trenches 317b are to provide electrical isolation between elements such as interconnect structures formed thereafter.

Referring to FIG. 4B, next, an insulating layer 326 is formed on the semiconductor layer 324. The insulating layer 326 can include the same material as that of the insulating layer 322, but the disclosure is not limited thereto. A thickness of the insulating layer 326 can be the same as the thickness of the insulating layer 322, but the disclosure is not limited thereto. In some embodiments, a multi-layer structure 320 including an insulating layer 322, a semiconductor layer 324 and an insulating layer 326 is formed. The multi-layer structure 320 is taken as a second layer formed over the first semiconductor layer 310 and the first semiconductor pillars 330 according to operation 103. Further, the insulating layer 326 fills the trenches 317a and thus forms a plurality of isolation structures 334 in the semiconductor layer 324 in the first region 304a. In some embodiments, the insulating layer 326 is conformally formed over the semiconductor layer 324, such that the insulating layer 326 covers a bottom and sidewalls of the trenches 317b, as shown in FIG. 4B. However, in other embodiments, the insulating layer 326 can fill the trenches 317b in the second region 304b.

Figure 4C:
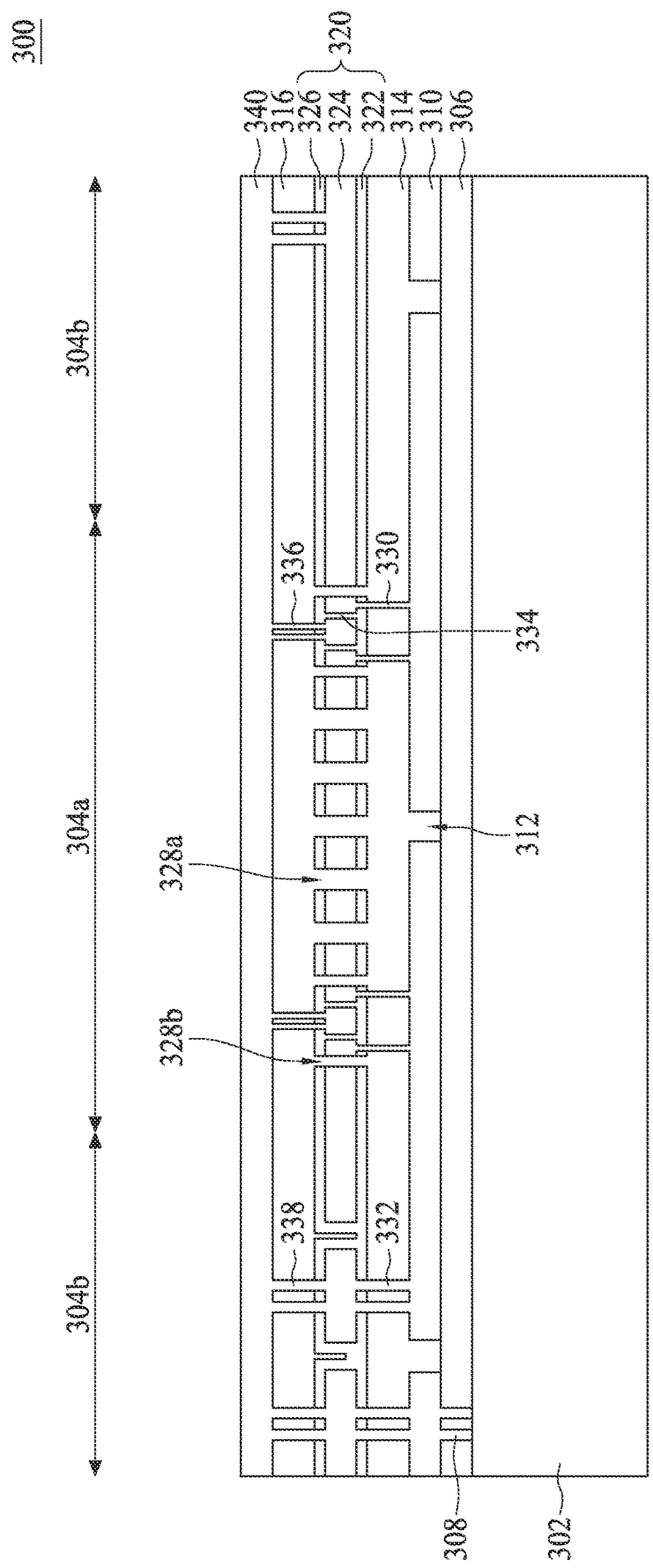

Referring to FIG. 4C, a plurality of holes 328a is formed according to operation 104. In some embodiments, the multi-layer structure 320 is patterned to form a plurality of holes 328a in the first region 304a according to operation 104. Further, a plurality of trenches 328b can be formed in the multi-layer structure 320 in the first region 304a simultaneously with the forming of the holes 328a. As shown in FIG. 4C, the holes 328a and the trenches 328b penetrate the multi-layer structure 320. In some embodiments, a width of the holes 328a is between approximately 1 μm and approximately 60 μm, but the disclosure is not limited thereto. In some embodiments, the width of the holes 328a is greater than a width of the trenches 328b. The holes 328a are configured to serve as acoustic holes, while the trenches 328b are configured to provide mechanical isolations between the back plate and the interconnect structures formed thereafter. It should be understood that operations for forming the holes 328a and the trenches 328b can be the same as those described above and shown in FIGS. 3D to 3F, and such details therefore are omitted for brevity.

Still referring to FIG. 4C, a plurality of second pillars is formed over the multi-layer structure 320 according to operation 105. In operation 105, an insulating layer 316 is formed over the multi-layer structure 320. The insulating layer 316 fills the holes 328a and the trenches 328b in the first region 304a and the trenches 317b in the second region 304b. It should be noted that the thickness of the insulating layer 316 substantially defines a spacing distance between the multi-layer structure 320 and an overlaying layer to be formed thereon. Subsequently, a plurality of second semiconductor pillars 336 are formed in the insulating layer 316 on the multi-layer structure 320 according to operation 105, and a semiconductor layer 340 is formed over the second semiconductor pillars 336 and multi-layer structure 320 according to operation 106. In some embodiments, a plurality of connecting structures 338 can be formed simultaneously with the forming of the second semiconductor pillars 336. As shown in FIG. 4C, the second semiconductor pillars 336 are formed in the first region 304a, and the connecting structures 338 are formed in the second region 304b. It should be understood that operations for forming the second semiconductor pillars 336 and the connecting structures 338 can be the same as those described above and shown in FIGS. 3F to 3G, and such details are therefore omitted for brevity. In some embodiments, a width of the second semiconductor pillars 336 can be substantially the same as the width of the first semiconductor pillars 330, and a width of the connecting structures 338 can be substantially the same as the width of the connecting structures 332, but the disclosure is not limited thereto. The second semiconductor pillars 336 in the first region 304a are in contact with the semiconductor layer 324 of the multi-layer structure 320, as shown in FIG. 4C. In some embodiments, the connecting structures 338 in the second region 304b can be electrically connected to the semiconductor layer 324 of the multi-layer structure 320.

Figure 4D:
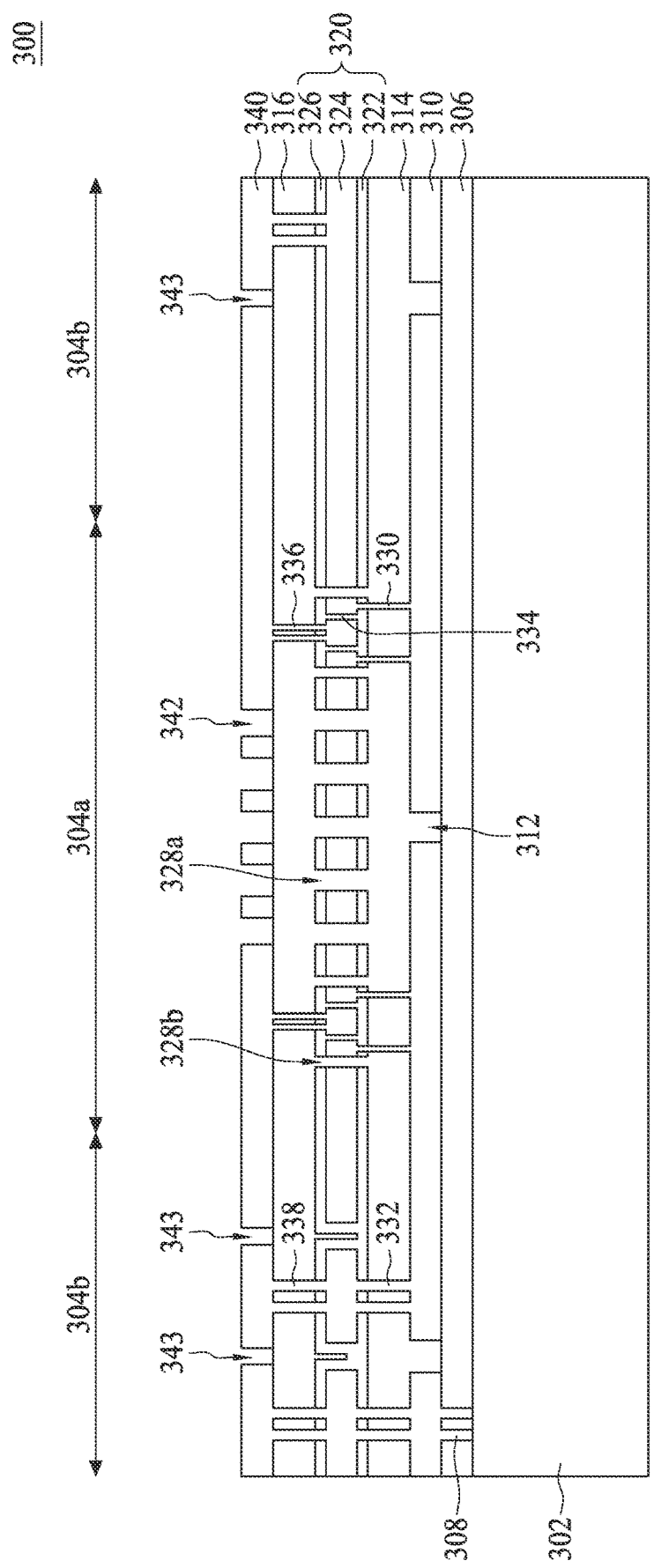

Referring to FIG. 4D, the second semiconductor layer 340 is patterned to form a plurality of holes 342 according to operation 107. The holes 342 are formed in the first region 304a. Further, a plurality of trenches 343 is formed in the second region 304b simultaneously with the forming of the holes 342. It should be noted that a width of the holes 342 is greater than the width of the holes 328a. In some embodiments, the width of the holes 342 in the first region 304a is between approximately 1 μm and 50 μm, but the disclosure is not limited thereto. In some embodiments, a width of the trenches 343 is between approximately 0.5 μm and 2 μm, but the disclosure is not limited thereto. It should also be noted that each of the holes 342 is substantially aligned with each of the holes 328a. However, the holes 342 are offset from the second semiconductor pillars 336.

Figure 4E:
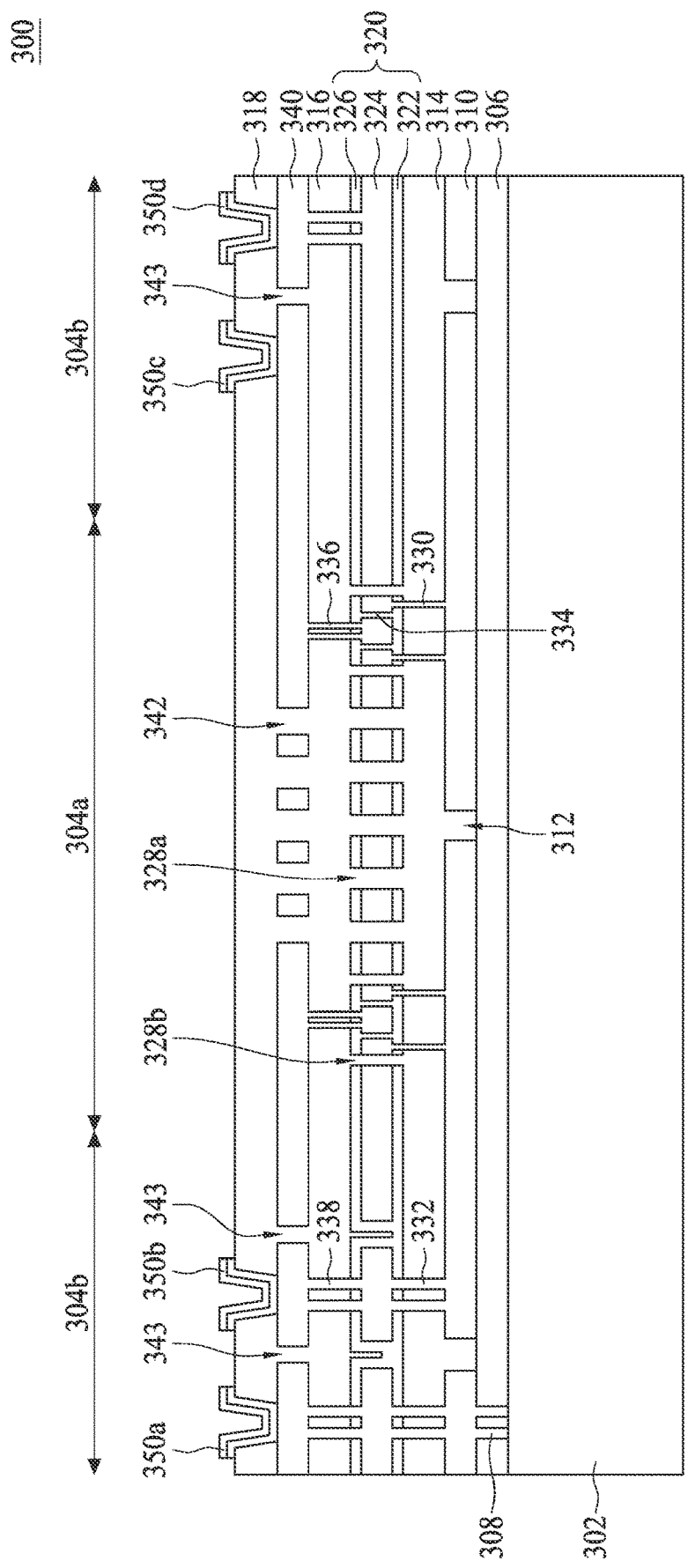

Referring to FIG. 4E, an insulating layer 318 is next formed over the second semiconductor layer 340 in operation 108. In some embodiments, the insulating layer 318 can include the same materials as the insulating layer 316. As shown in FIG. 4E, the insulating layer 318 fills the holes 342 in the first region 304a and the trenches 343 in the second region 304b. Subsequently, a plurality of openings (not shown) are formed in the insulating layer 318, and a plurality of connecting pads 350a-350d are formed in the openings in operation 108.

Figure 4F:
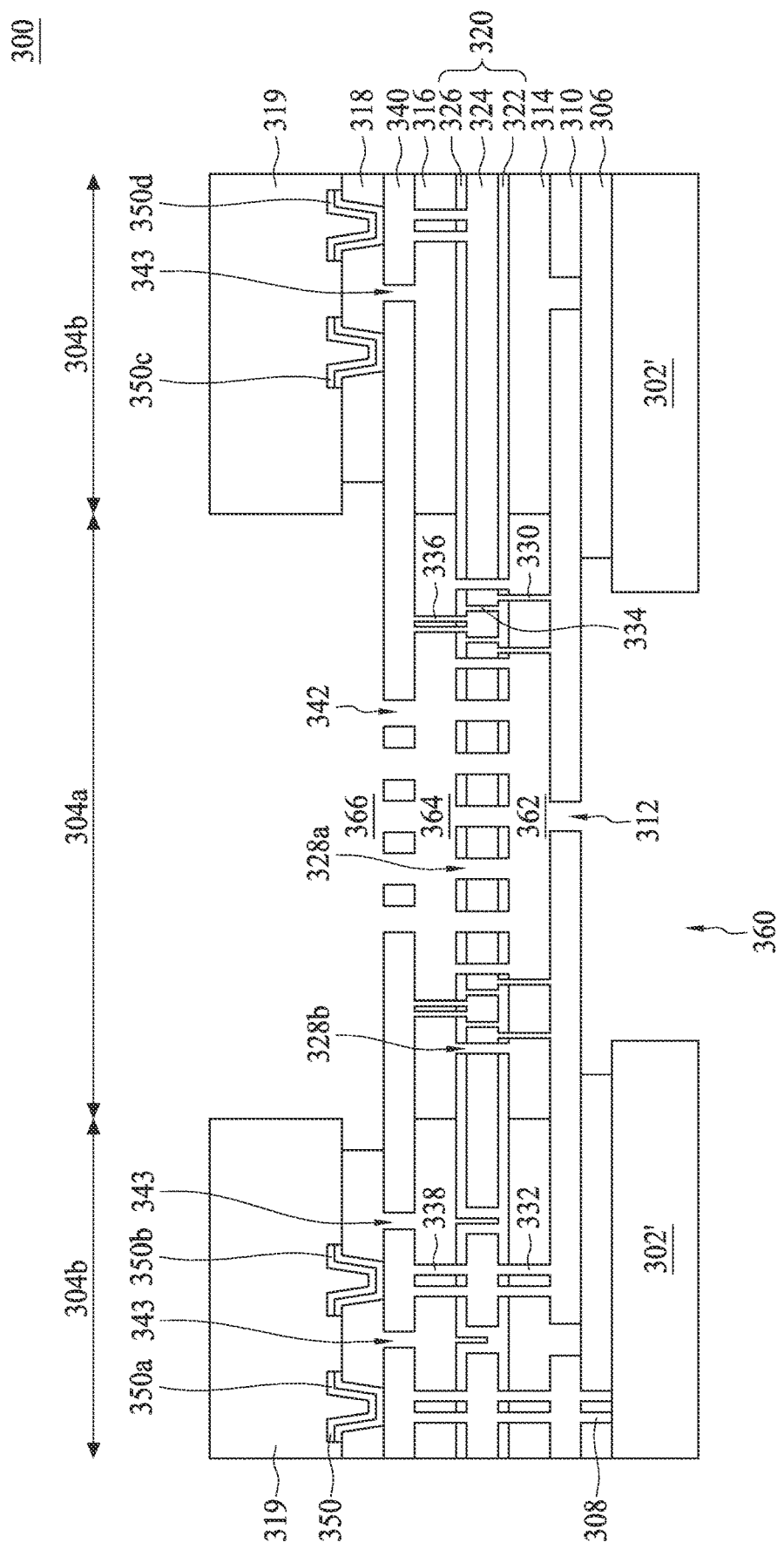

Referring to FIG. 4F, in operation 109, the substrate 302 is next grinded or thinned down on a side opposite to the first semiconductor layer 310, the multi-layer structure 320, and the second semiconductor layer 340. Consequently, a thinned substrate 302' is obtained as shown in FIG. 4F. Next, a patterned photoresist 319 is formed on the insulating layer 318 and the connecting pads 350, wherein the patterned photoresist 319 includes an opening substantially corresponding to the first region 304a. Next, a portion of the thinned substrate 302' is removed to form an environment port 360 substantially in the first region 304a according to operation 110, as shown in FIG. 4F. Next, an etching operation is performed to remove a portion of the insulating layer 318 through the opening in operation 110. Further, a portion of the insulating layer 316, a portion of the insulating layer 314, and a portion of the insulating layer 306 are removed through the opening. In some embodiments, the etching operation includes introducing vHF acid through the opening. Accordingly, air gaps 362 and 364 and an opening 366 are formed, the holes 312, 328a and 342, and the trenches 328b are again visible after the etching operation is performed. Because the etching operation is similar to those described above, the details are omitted in the interest of brevity. Next, the patterned photoresist 319 is removed. Additionally, a width of the opening 366 can be greater than a width of the air gaps of 364 and 362, and the width of air gaps 364 and 362 can be greater than a width of the environment port 360, but the disclosure is not limited thereto.

Figure 4G:
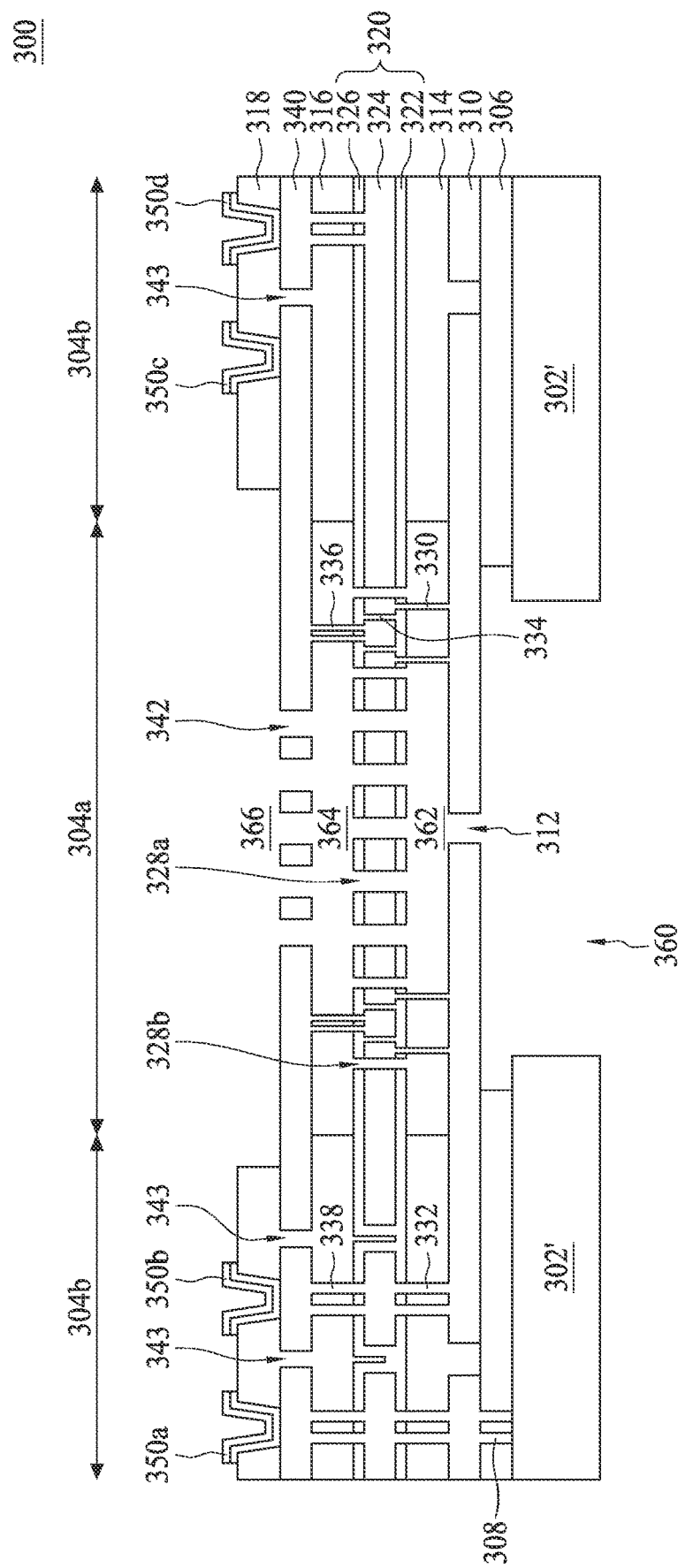

Referring to FIG. 4G, a MEMS device 300 is formed accordingly. It should be easily understood that similar elements in FIG. 3K and FIG. 4G can include similar materials; therefore, repetitive details are omitted in the interest of brevity, and only differences between the MEMS device 200 and the MEMS device 300 are described. As shown in FIG. 4G, at least the first hole 312 is formed in and penetrates a first movable portion of the first semiconductor layer 310, and the plurality of second holes 342 are formed in and penetrate a second movable portion of the second semiconductor layer 340. Both the first hole 312 and the second holes 342 serve as vent holes. In some embodiments, the first hole 312 is formed substantially in a center of the movable portion (in the first region 304a), but the disclosure is not limited thereto. Further, the plurality of holes 328a and the plurality of trenches 328b are formed in and penetrate the multi-layer structure 320, and the holes 328a and the trenches 328b are formed corresponding to the first movable portion of the first semiconductor layer 310 and the second movable portion of the second semiconductor layer 340. The holes 328a serve as acoustic holes, and the trenches 328b serve to provide mechanical isolation. It should be noted that the width of the second holes 342 is greater than the width of the acoustic holes 328a.

Still referring to FIG. 4G, it should be noted that the MEMS device 300 further includes the plurality of first semiconductor pillars 330, the plurality of second semiconductor pillars 336 and the plurality of isolation structures 334. The first semiconductor pillars 330, the second semiconductor pillars 336 and the isolation structures 334 are similar to those described in relation to the MEMS device 200; therefore, repetitive details are omitted for brevity. It should be noted that the second semiconductor pillars 336 are formed between the second holes 342 and the second anchor portion (in the second region 304b) of the second semiconductor layer 340. In some embodiments, each of the first semiconductor pillars 330 is entirely separated from the insulating layer 314 by the air gap 362, and each of the second semiconductor pillars 336 is entirely separated from the insulating layer 316 by the air gap 364. The MEMS device 300 further includes the connecting structures 308, 332 and 338 disposed in the second region 304b. The connecting structures 308, 332 and 338 are similar to those described in relation to the MEMS device 200; therefore, repetitive details are omitted for brevity.

In some embodiments, the first semiconductor layer 310 and the second semiconductor layer 340 serve as two membranes, and the multi-layer structure 320 serves as a back plate for the MEMS device 300. Consequently, the MEMS device 300 is referred to as a dual-membrane device. It should be noted that the first semiconductor pillars 330 that entirely disposed over the first movable portion of the first semiconductor layer 310 improve a stiffness of the first semiconductor layer 310, and the second semiconductor pillars 336 that entirely disposed over the second movable portion of the second semiconductor layer 340 improve a stiffness of the second semiconductor layer 340. Accordingly, AOP of the MEMS device 300 can be improved without changing bias voltage. Further, the vent hole 312, which allows communication between the environment port 360 and the air gap 362, has the width of less than 3 μm, thereby preventing particles from entering the air gap 362. Particle and air damping issues can therefore both be mitigated. In addition, the second holes 342, which are also the vent holes, improve air outflow, and thus performance of the MEMS device 300 can be improved. Further, the second holes 342 are aligned with the acoustic holes 328a, and one of the second holes 342 and one of acoustic holes 328a are aligned with the first hole 312, as shown in FIG. 4G. Accordingly, particles accidentally falling into the MEMS device 300 through the first hole 312 can easily fall out through the acoustic hole 328a and the second hole 342 that are aligned with the first hole 312, and thus particle issue can be further mitigated.

Figure 5A:
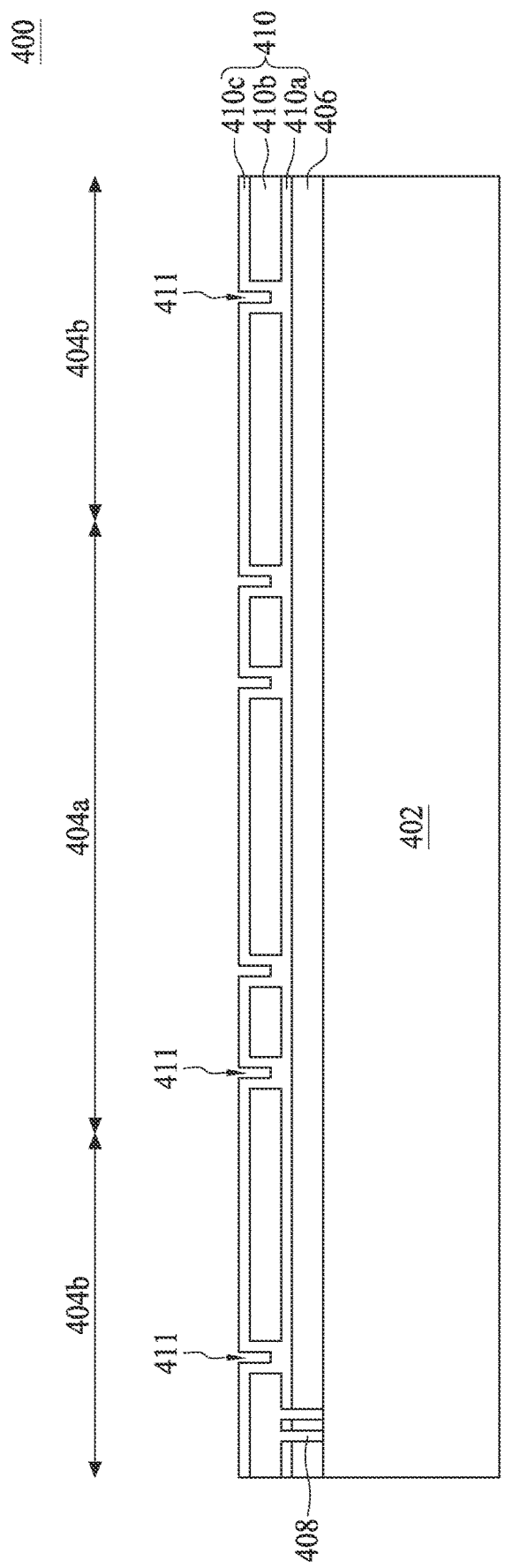
FIGS. 5A to 5H are schematic drawings illustrating a MEMS device at various fabrication stages constructed according to aspects of the present disclosure in one or more embodiments.

FIGS. 5A to 5H are schematic drawings illustrating a MEMS device 400 at various fabrication stages constructed according to aspects of the present disclosure in one or more embodiments. Further, similar elements in FIGS. 5A to 5H and FIGS. 3A to 3K can include similar materials; therefore, repetitive details are omitted in the interest of brevity. As shown in FIG. 5A, a substrate 402 is provided. The substrate 402 can have a first region 404a and a second region 404b defined thereon. In some embodiments, the second region 404b surrounds the first region 404a, but the disclosure is not limited thereto. In some embodiments, IC devices (not shown) can be formed in the second region 404b of the substrate 402, but the disclosure is not limited thereto. In some embodiments, an insulating layer 406 and an insulating layer 410a are sequentially formed over the substrate 402. A thickness of the insulating layer 406 is greater than a thickness of the insulating layer 410a. The insulating layer 406 and the insulating layer 410a include different materials. In some embodiments, the insulating layer 406 can include SiO, and the insulating layer 410a can include SiN, but the disclosure is not limited thereto.

Still referring to FIG. 5A, a semiconductor layer 410b is next formed on the insulating layer 410a. The semiconductor layer 410b can include Si such as doped polysilicon, but the disclosure is not limited thereto. In some embodiments, a plurality of connecting structures 408 are formed in the insulating layers 406 and 410a in the second region 404b. Further, the connecting structures 408 can be in contact with the substrate 402, and are configured to provide electrical connection in the second region 404b. A thickness of the semiconductor layer 410b is greater than the thickness of the insulating layer 410a. Subsequently, the semiconductor layer 410b is patterned to form a plurality of trenches 411 in the first region 404a and the second region 404b. After the forming of the trenches 411, another insulating layer 410c is formed on the semiconductor layer 410b. A thickness of the insulating layer 410c can be the same as the thickness of the insulating layer 410a, but the disclosure is not limited thereto. In some embodiments, the insulating layer 410c can include the same materials as the insulating layer 410a, but the disclosure is not limited thereto. As shown in FIG. 5A, the insulating layer 410c is conformally formed over the semiconductor layer 410b, such that the insulating layer 410c covers a bottom and sidewalls of the trenches 411. In some embodiments, it is taken as to form a first multi-layer structure 410 including the insulating layer 410a, the semiconductor layer 410b and the insulating layer 410c over the substrate 402 according to operation 100.

Figure 5B:
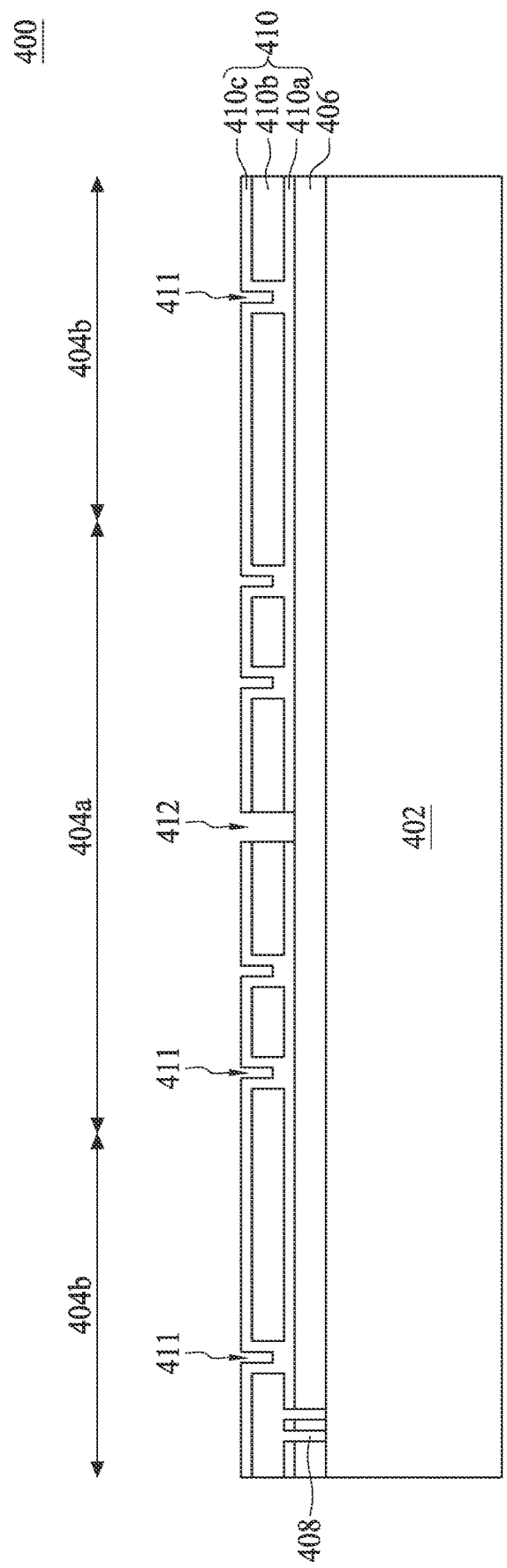

Referring to FIG. 5B, the first multi-layer structure 410 is patterned to form at least a hole 412 in the first region 404a according to operation 101. It should be noted that the hole 412 penetrates the first multi-layer structure 410, and thus the insulating layer 406 is exposed through the hole 412. A width of the hole 412 is greater than a width of the trenches 411. In some embodiments, the width of the hole 412 is less than approximately 3 μm, but the disclosure is not limited thereto. Further, the hole 412 is configured to serve as a vent hole, while the trenches 411 are configured to provide electrical isolation.

Figure 5C:
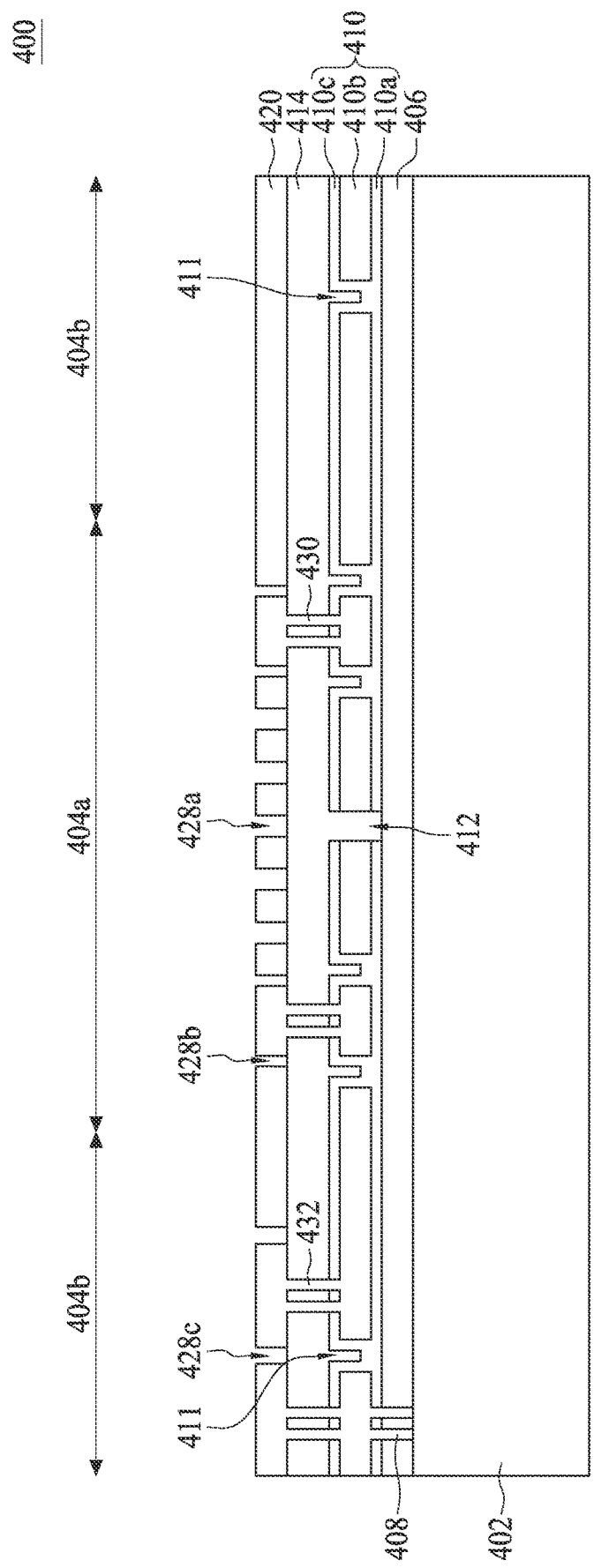

Referring to FIG. 5C, an insulating layer 414 is formed on the first multi-layer structure 410. Further, the trenches 411 and the hole 412 are filled with the insulating layer 414. The insulating layer 414 can include materials different from those of the insulating layer 410c. In some embodiments, the insulating layer 414 can include TEOS, but the disclosure is not limited thereto. A thickness of the insulating layer 414 is greater than a thickness of the insulating layer 410c. It should be noted that the thickness of the insulating layer 414 substantially defines a spacing distance between the first multi-layer structure 410 and an overlaying layer to be formed thereon. Next, a plurality of first semiconductor pillars 430 is formed in the first region 404a according to operation 102. In some embodiments, a plurality of connecting structures 432 are formed in the second region 404b simultaneously with the forming of the first semiconductor pillars 430. It should be understood that operations for forming the first semiconductor pillars 430 and the connecting structures 432 can be the same as those described above and shown in FIGS. 3B to 3C, and such details are therefore omitted for brevity.

In some embodiments, a width of the first semiconductor pillars 430 is less than a width of the connecting structures 432. In alternative embodiments, the width of the first semiconductor pillars 430 is the same as the width of the connecting structures 432. In some embodiments, the width of the first semiconductor pillars 430 is between approximately 0.5 m and approximately 50 μm, but the disclosure is not limited thereto. The first semiconductor pillars 430 in the first region 404a are in contact with the semiconductor layer 410b of the first multi-layer structure 410, as shown in FIG. 5C. In some embodiments, the connecting structures 432 in the second region 404b can be electrically connected to the semiconductor layer 410b or to the connecting structure 408 through the semiconductor layer 410b.

Still referring to FIG. 5C, a semiconductor layer 420 is formed over the first semiconductor pillars 430 and the first multi-layer structure 410 according to operation 103. Subsequently, a plurality of holes 428a is formed in the semiconductor layer 420 according to operation 104. In some embodiments, the semiconductor layer 420 is patterned to form at least a plurality of holes 428a in the first region 404a in operation 104. Further, the semiconductor layer 420 is patterned to form a plurality of trenches 428b in the first region 404a and a plurality of trenches 428c in the second region 404b simultaneously with the forming of the holes 428a. As shown in FIG. 5C, the holes 428a and the trenches 428b and 428c penetrate the semiconductor layer 420. In some embodiments, a width of the trenches 428c in the second region 404b is between approximately 0.5 μm and 2 μm, but the disclosure is not limited thereto. The width of the holes 428a in the first region 404a is greater than a width of the trenches 428b in the first region 404a. In some embodiments, the width of the holes 428a is between approximately 1 μm and approximately 50 μm, but the disclosure is not limited thereto. In some embodiments, the holes 428a and the trenches 428b are offset from the first semiconductor pillars 430. The holes 428a are configured to serve as acoustic holes, the trenches 428b are configured to provide mechanical and electrical isolations between elements such as membrane and interconnect structures formed thereafter, and the trenches 428c are configured to provide electrical isolation between the interconnect structures.

Figure 5D:
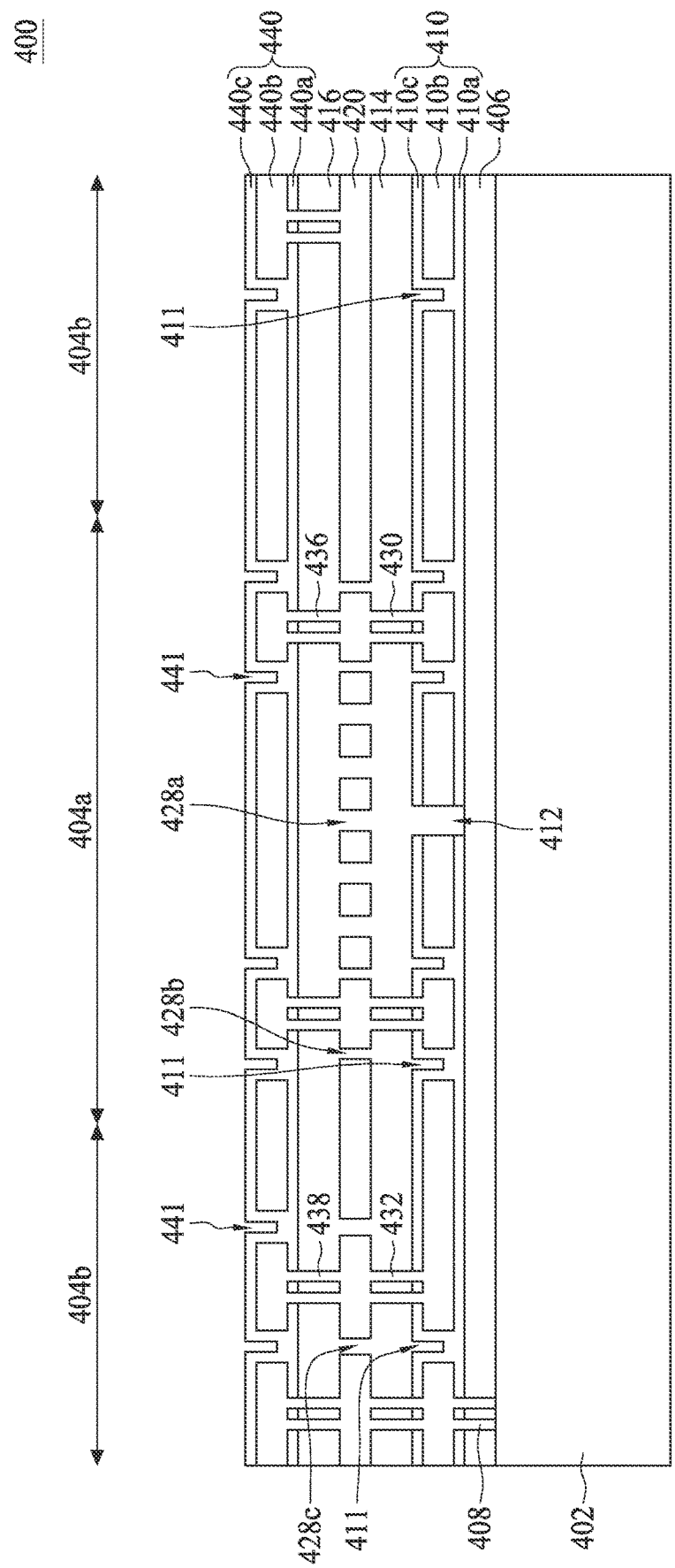

Referring to FIG. 5D, a plurality of second pillars are formed over the semiconductor layer 420 according to operation 105. In some embodiments, an insulating layer 416 is formed over the semiconductor layer 420 in operation 106. In some embodiments, the insulating layer 416 can include the same materials as the insulating layer 414. As shown in FIG. 5D, the insulating layer 416 fills the holes 428a and the trenches 428b in the first region 404a. The insulating layer 417 also fills the trenches 428c in the second region 404b. It should be noted that a thickness of the insulating layer 416 substantially defines a spacing distance between the semiconductor layer 420 and an overlaying layer to be formed thereon. Subsequently, another insulating layer 440a is formed on the insulating layer 416. A thickness of the insulating layer 440a is less than the thickness of the insulating layer 416. The insulating layer 416 and the insulating layer 440a include different materials. In some embodiments, the insulating layer 416 can include SiO, and the insulating layer 440a can include SiN, but the disclosure is not limited thereto. Next, a semiconductor layer 440b is formed on the insulating layers 416 and 440a to form a plurality of second semiconductor pillars 436 according to operation 105. In some embodiments, a plurality of connecting structures 438 can be formed simultaneously with the forming of the second semiconductor pillars 436. As shown in FIG. 5D, the second semiconductor pillars 436 are formed in the first region 404a and the connecting structures 438 are formed in the second region 404b. It should be understood that operations for forming the second semiconductor pillars 436 and the connecting structures 438 can be the same as those described above and shown in FIGS. 3F to 3G, and repetitive details are omitted for brevity. In some embodiments, a width of the second semiconductor pillars 436 can be substantially the same as the width of the first semiconductor pillars 430, and a width of the connecting structures 438 can be substantially the same as the width of the connecting structures 432, but the disclosure is not limited thereto. The second semiconductor pillars 436 in the first region 404a are in contact with the semiconductor layer 420, as shown in FIG. 5D. In some embodiments, the connecting structures 438 in the second region 404b can be electrically connected to the semiconductor layer 420.

Still referring to FIG. 5D, the semiconductor layer 440b is next patterned to form a plurality of trenches 441 in the first region 404a and the second region 404b. In some embodiments, a width of the trenches 441 is between approximately 1 μm and 2 μm, but the disclosure is not limited thereto. In some embodiments, the trenches 441 are offset from the second semiconductor pillars 436. After the forming of the trenches 441, another insulating layer 440c is formed over the semiconductor layer 440b. A thickness of the insulating layer 440c can be the same as the width of the insulating layer 440a, but the disclosure is not limited thereto. In some embodiments, the insulating layer 440c can include the same materials as the insulating layer 440a, but the disclosure is not limited thereto. As shown in FIG. 5D, the insulating layer 440c is conformally formed over the semiconductor layer 410b, such that the insulating layer 440c covers a bottom and sidewalls of the trenches 441. In some embodiments, it is taken as to form a second multi-layer structure 440 including the insulating layer 440a, the semiconductor layer 440b and the insulating layer 440c over the second semiconductor pillars 436 and the semiconductor layer 420 according to operation 106.

Figure 5E:
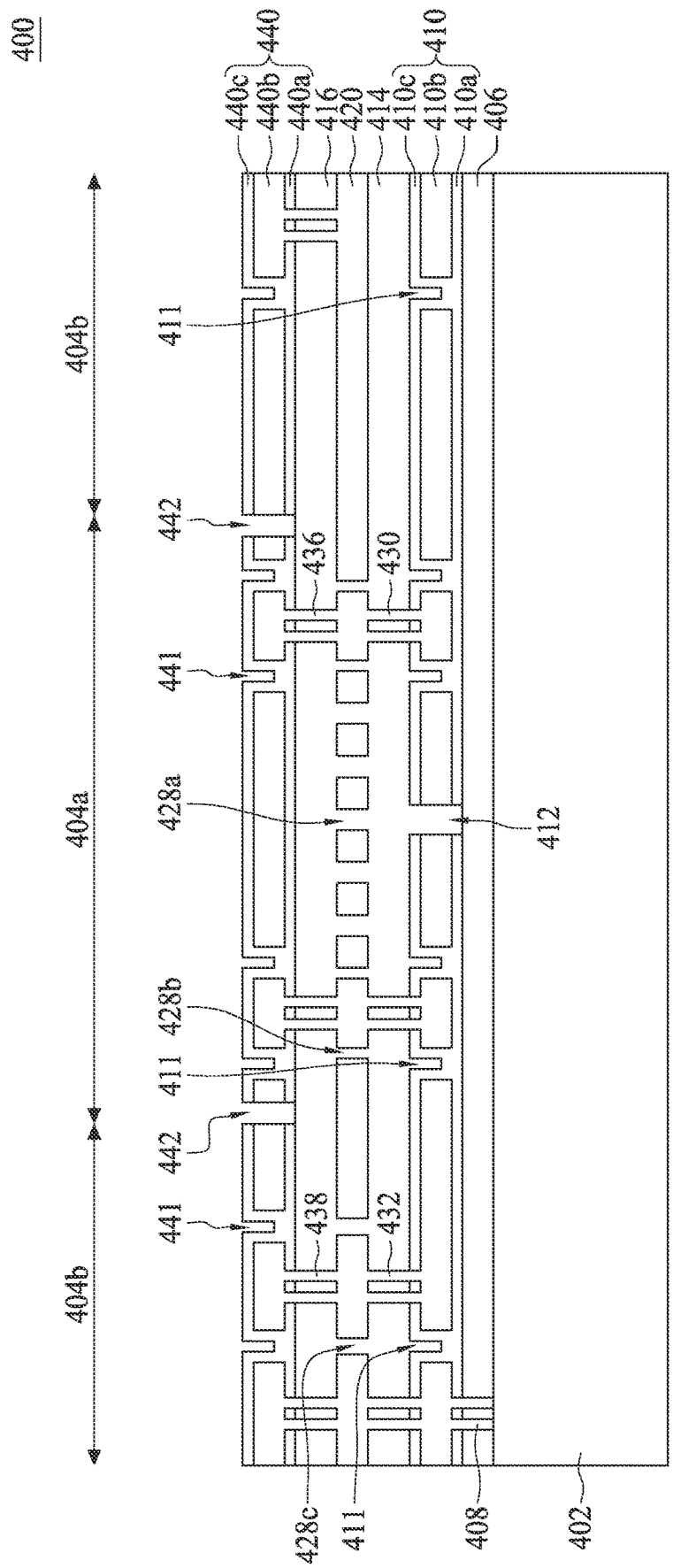

Referring to FIG. 5E, the second multi-layer structure 440 is next patterned to form a plurality of holes 442 in the first region 404a according to operation 107. In some embodiments, a width of the holes 442 in the first region 404a is between approximately 1 m and 50 μm, but the disclosure is not limited thereto. In some embodiments, the holes 442 are offset from the second semiconductor pillars 436.

Figure 5F:
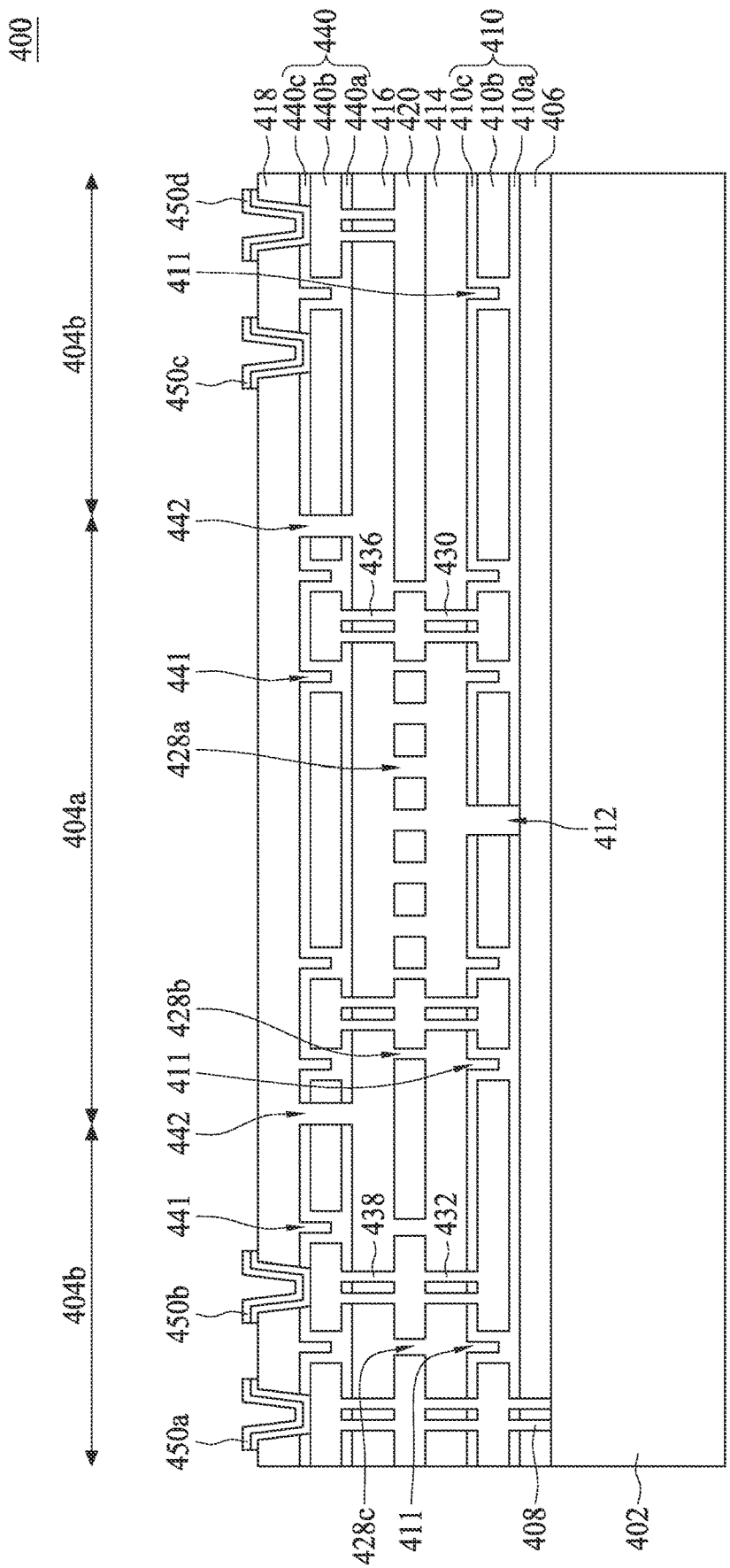

Referring to FIG. 5F, an insulating layer 418 is next formed over the second multi-layer structure 440 according to operation 108. In some embodiments, the insulating layer 418 can include the same materials as the insulating layer 416. As shown in FIG. 5F, the insulating layer 418 fills the trenches 441 and the holes 442. Subsequently, a plurality of openings (not shown) are formed in the insulating layer 418, and a plurality of connecting pads 450a-450d are formed in the openings according to operation 108.

Figure 5G:
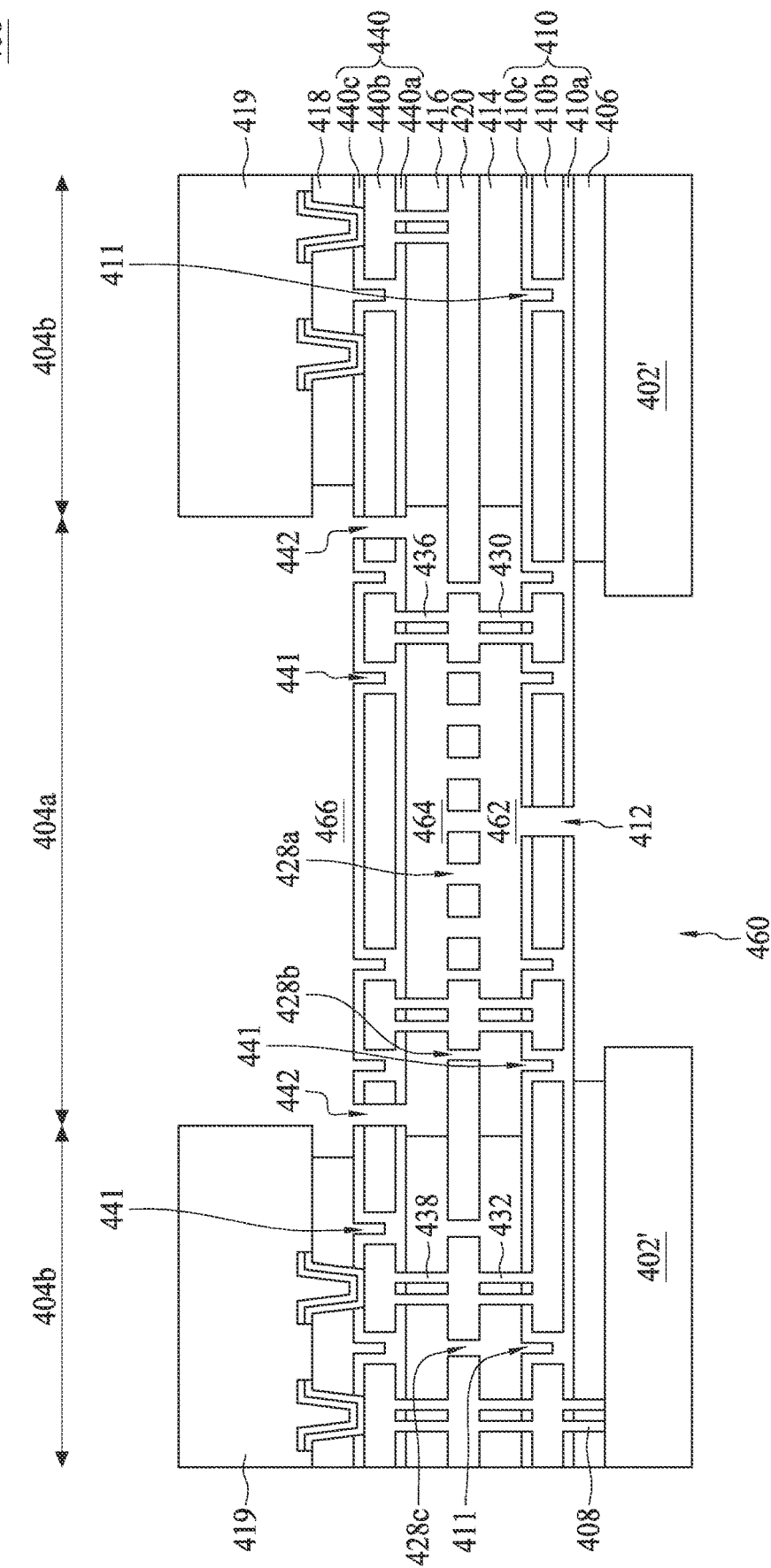

Referring to FIG. 5G, the substrate 402 is next grinded or thinned down on a side opposite to the first multi-layer structure 410, the semiconductor layer 420 and the second multi-layer structure 440 according to operation 109. Consequently, a thinned substrate 402' is obtained as shown in FIG. 5G. Next, a patterned photoresist 419 is formed on the insulating layer 418 and the connecting pads 450, wherein the patterned photoresist 419 includes an opening substantially corresponding to the first region 404a. Next, a portion of the thinned substrate 402' is removed to form an environment port 460 substantially in the first region 404a according to operation 110, as shown in FIG. 5G. Next, an etching operation is performed to remove a portion of the insulating layer 418 through the opening in operation 110. Further, a portion of the insulating layer 416, a portion of the insulating layer 414, and a portion of the insulating layer 406 are removed through the opening by the etching operation. Accordingly, air gaps 462 and 464 and an opening 466 are formed. The holes 412, 428a and 442 and the trenches 428b are again visible after the etching operation is performed. Further, each of the first semiconductor pillars 430 is entirely separated from the insulating layer 414 by the air gap 462, and each of the second semiconductor pillars 436 is entirely separated from the insulating layer 416 by the air gap 464 after the etching operation is performed. Because the etching operation is similar to those described above, repetitive details are omitted in the interest of brevity. Next, the patterned photoresist 419 is removed. Additionally, a width of the opening 466 can be greater than a width of the air gaps of 464 and 462, and the width of air gaps 464 and 462 can be greater than a width of the environment port 460, but the disclosure is not limited thereto.

Figure 5H:
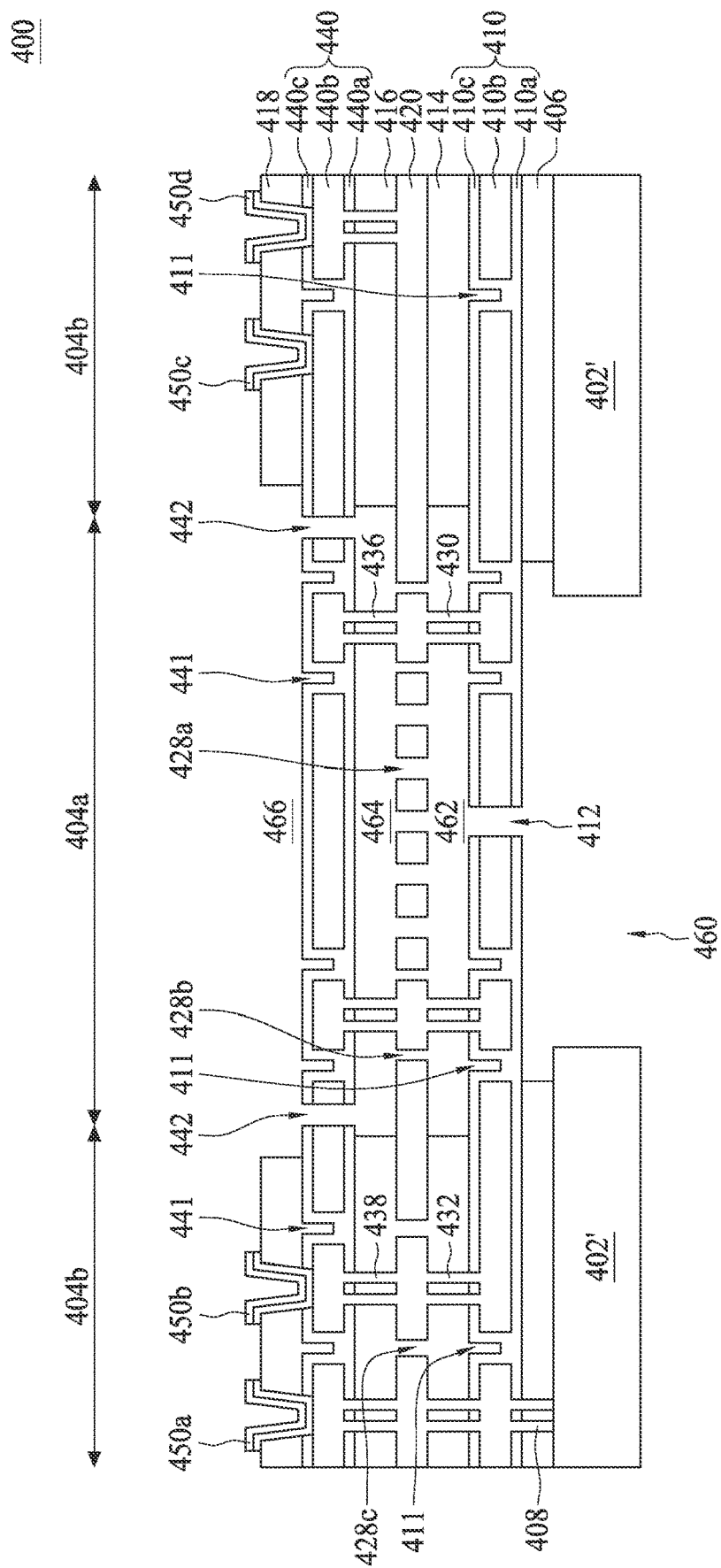

Referring to FIG. 5H, a MEMS device 400 is formed accordingly. It should be easily understood that similar elements in FIG. 3K and FIG. 5H can include similar materials; therefore, repetitive details are omitted in the interest of brevity, and only differences between the MEMS device 200 and the MEMS device 400 are described.

According to the MEMS device 400, the first multi-layer structure 410 and the second multi-layer structure 440 serve as bottom and up plates, and the semiconductor layer 420 serves as a membrane for the MEMS device 400. Consequently, the MEMS device 400 is referred to as a dual-plate device. As shown in FIG. 4K, an interconnect structure can be formed by the connecting structure 408, the semiconductor layer 410b in the first multi-layer structure 410, the connecting structure 432, the semiconductor layer 420, the connecting structure 438 and the semiconductor layer 440b in the second multi-layer structure 440. And the interconnect structure provides electrical connection between the substrate 402' and the connecting pad 450a. Another interconnect structure can be formed by the semiconductor layer 410b, the connecting structure 432, the semiconductor layer 420, the connecting structure 438 and the semiconductor layer 440b. And the interconnect structure provides electrical connection between the bottom plate and the connecting pad 450b. Another interconnect structure can be formed by the semiconductor layer 420, the connecting structure 438 and the semiconductor layer 440b. And the interconnect structure provides electrical connection between the membrane and the connecting pad 450d. Further, the connecting pad 450c is in contact with the semiconductor layer 440b to provide electrical connection to the up plate.

It should be noted that the first semiconductor pillars 430 between the first multi-layer structure 410 and the semiconductor layer 420 and entirely disposed over the first movable portion of the first multi-layer structure 410, together with the second semiconductor pillars 436 between the second multi-layer structure 440 and the semiconductor layer 420 and entirely disposed over the second movable portion of the second multi-layer structure 440, improve a stiffness of the semiconductor layer 420. Accordingly, AOP of the MEMS device 400 can be improved without changing bias voltage. Further, the vent hole 412, which allows communication between the environment port 460 and the air gap 462, has the width of less than 3 μm, thereby preventing particles from entering the air gap 462. Particle and air damping issues can therefore both be mitigated. In addition, the second holes 442, which are air flow channels between the second semiconductor pillars 436 and the second anchor portion (in the second region 404b) of the multi-layer structure 440, improve air outflow, and thus performance of the MEMS device 400 can be improved.

Figure 6A:
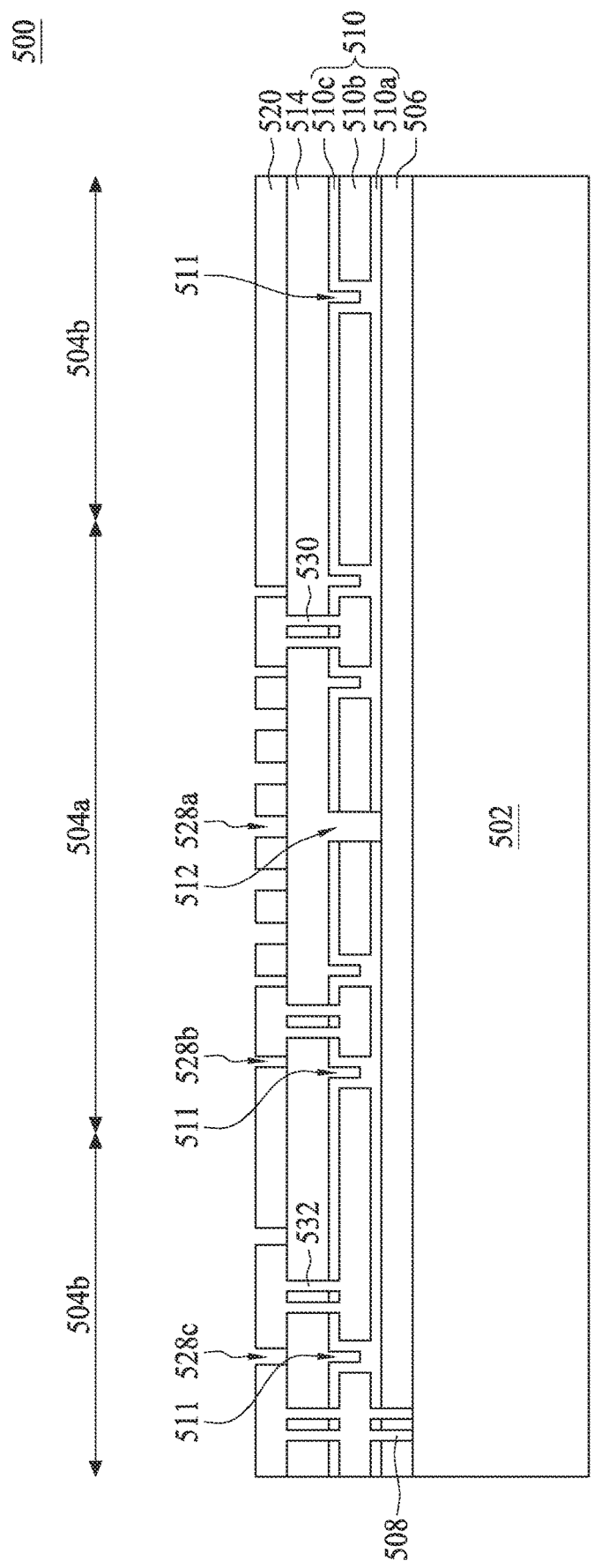
FIGS. 6A to 6E are schematic drawings illustrating a MEMS device at various fabrication stages constructed according to aspects of the present disclosure in one or more embodiments.

FIGS. 6A to 6E are schematic drawings illustrating a MEMS device 500 at various fabrication stages constructed according to aspects of the present disclosure in one or more embodiments. Further, similar elements in FIGS. 6A to 6E and FIGS. 5A to 5H can include similar materials and similar thickness; therefore, repetitive details are omitted in the interest of brevity. As shown in FIG. 6A, a substrate 502 is provided. The substrate 502 can have a first region 504a and a second region 504b defined thereon. In some embodiments, the second region 504b surrounds the first region 504a, but the disclosure is not limited thereto. In some embodiments, IC devices (not shown) can be formed in the second region 504b of the substrate 502, but the disclosure is not limited thereto. In some embodiments, an insulating layer 506 and an insulating layer 510a are sequentially formed over the substrate 502. The insulating layer 506 and the insulating layer 510a include different materials.

Still referring to FIG. 6A, a semiconductor layer 510b is next formed on the insulating layer 510a. In some embodiments, a plurality of connecting structures 508 are formed in the insulating layers 506 and 510a in the second region 504b. Further, the connecting structures 508 are in contact with the substrate 502, and are configured to provide electrical connection in the second region 504b. Subsequently, the semiconductor layer 510b is patterned to form a plurality of trenches 511 in the first region 504a and the second region 504b. After the forming of the trenches 511, another insulating layer 510c is formed over the semiconductor layer 510b. As shown in FIG. 6A, the insulating layer 510c is conformally formed over the semiconductor layer 510b, such that the insulating layer 510c covers a bottom and sidewalls of the trenches 511. In some embodiments, it is taken as to form a first multi-layer structure 510 including the insulating layer 510a, the semiconductor layer 510b and the insulating layer 510c over the substrate 502 according to operation 100.

Still referring to FIG. 6A, the first multi-layer structure 510 is patterned to form at least a hole 512 in the first region 504a according to operation 101. It should be noted that the hole 512 penetrates the first multi-layer structure 510, and thus the insulating layer 506 is exposed through the hole 512. A width of the hole 512 is greater than a width of the trenches 511. In some embodiments, the width of the hole 512 is less than approximately 3 μm, but the disclosure is not limited thereto. Further, the hole 512 is configured to serve as a vent hole, while the trenches 511 are configured to provide electrical isolation.

Still referring to FIG. 6A, an insulating layer 514 is formed on the first multi-layer structure 510. Further, the trenches 511 and the hole 512 are filled with the insulating layer 514. The insulating layer 514 can include materials different from those of the insulating layer 510c. It should be noted that a thickness of the insulating layer 514 substantially defines a spacing distance between the first multi-layer structure 510 and an overlaying layer to be formed thereon. Next, a plurality of first semiconductor pillars 530 is formed in the first region 504a according to operation 102. In some embodiments, a plurality of connecting structures 532 are formed in the second region 504b simultaneously with the forming of the first semiconductor pillars 530. It should be understood that operations for forming the first semiconductor pillars 530 and the connecting structures 532 can be the same to those described above and shown in FIGS. 3B to 3C, and repetitive details are therefore omitted for brevity.

In some embodiments, a width of the first semiconductor pillars 530 is less than a width of the connecting structures 532. In alternative embodiments, the width of the first semiconductor pillars 530 is the same as the width of the connecting structures 532. In some embodiments, the width of the first semiconductor pillars 530 is between approximately 0.5 m and approximately 50 µm, but the disclosure is not limited thereto. In some embodiments, the width of the connecting structures 532 is between approximately 0.5 µm and approximately 50 m, but the disclosure is not limited thereto. The first semiconductor pillars 530 in the first region 504a are in contact with the semiconductor layer 510b of the first multi-layer structure 510, as shown in FIG. 6A. In some embodiments, the connecting structures 532 in the second region 504b can be electrically connected to the semiconductor layer 510b or to the connecting structure 508 through the semiconductor layer 510b.

Still referring to FIG. 6A, a semiconductor layer 520 is formed over the first semiconductor pillars 530 and the first multi-layer structure 510 according to operation 103. Subsequently, a plurality of holes 428a is formed in the semiconductor layer 520 according to operation 104. In some embodiments, the semiconductor layer 520 is patterned to form a plurality of holes 528a in the first region 504a in operation 104. Further, the semiconductor layer 520 is patterned to form a plurality of trenches 528b in the first region 504a and a plurality of trenches 528c in the second region 504b simultaneously with the forming of the holes 428a. As shown in FIG. 6A, the holes 528a and the trenches 528b and 528c penetrate the semiconductor layer 520. In some embodiments, a width of the trenches 528c in the second region 504b is between approximately 0.5 µm and 2 µm, but the disclosure is not limited thereto. A width of the holes 528a in the first region 504a is greater than a width of the trenches 528b in the first region 504a. In some embodiments the width of the holes 528a is between approximately 1 µm and approximately 50 µm, but the disclosure is not limited thereto. In some embodiments, the holes 528a and the trenches 528b are offset from the first semiconductor pillars 530. The holes 528a are configured to serve as acoustic holes, the trenches 528b are configured to provide mechanical and electrical isolations between elements such as membrane and the interconnect structures formed thereafter, and the trenches 528c are configured to provide electrical isolation between the interconnect structures.

Figure 6B:
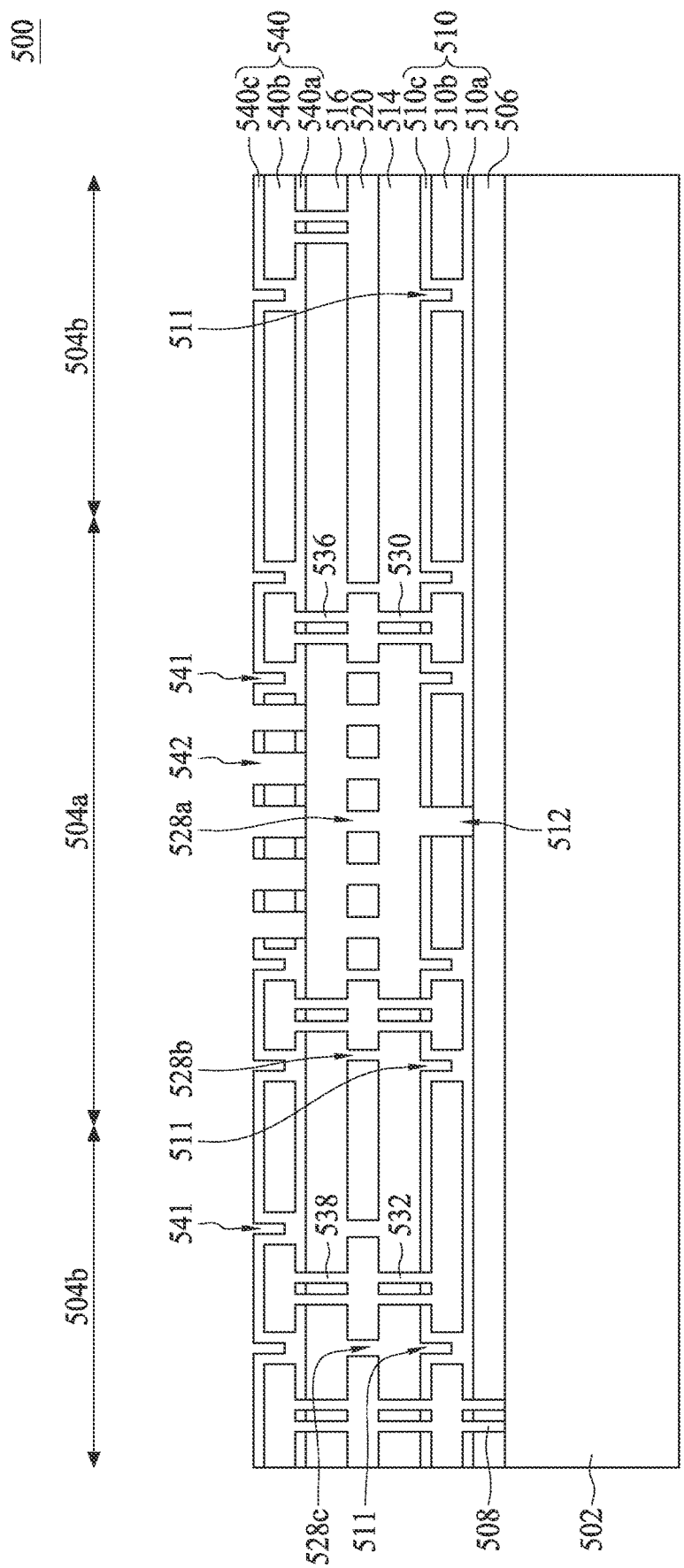

Referring to FIG. 6B, a plurality of second pillars are formed over the semiconductor layer 420 according to operation 105. In some embodiments, an insulating layer 516 is formed over the semiconductor layer 520 in operation 106. In some embodiments, the insulating layer 516 can include the same materials as the insulating layer 514. As shown in FIG. 6B, the insulating layer 516 fills the holes 528a and the trenches 528b in the first region 504a and the trenches 528c in the second region 504b. Subsequently, another insulating layer 540a is formed on the insulating layer 516. A thickness of the insulating layer 540a is less than a thickness of the insulating layer 516. It should be noted that the thickness of the insulating layer 516 substantially defines a spacing distance between the semiconductor layer 520 and an overlaying layer to be formed thereon. The insulating layer 516 and the insulating layer 540a include different materials. Next, a semiconductor layer 540b is formed over the substrate 502 and the insulating layers 516 and 540a to form a plurality of second semiconductor pillars 536 according to operation 105. In some embodiments, a plurality of connecting structures 538 can be formed simultaneously with the forming of the second semiconductor pillars 536. As shown in FIG. 6B, the second semiconductor pillars 536 are formed in the first region 504a and the connecting structures 538 are formed in the second region 504b. It should be understood that operations for forming the second semiconductor pillars 536 and the connecting structures 538 can be the same as those described above and shown in FIGS. 3F to 3G, and repetitive details are therefore omitted for brevity. In some embodiments, a width of the second semiconductor pillars 536 can be substantially the same as the width of the first semiconductor pillars 530, and a width of the connecting structures 538 can be substantially the same as the width of the connecting structures 532, but the disclosure is not limited thereto. The second semiconductor pillars 536 in the first region 504a are in contact with the semiconductor layer 520, as shown in FIG. 6B. In some embodiments, the connecting structures 538 in the second region 504b can be electrically connected to the semiconductor layer 520.

Still referring to FIG. 6B, the semiconductor layer 540b is patterned to form a plurality of trenches 541 in the first region 504a and the second region 504b. In some embodiments, a width of the trenches 541 is between approximately 1 µm and 2 µm, but the disclosure is not limited thereto. In some embodiments, the trenches 541 are offset from the second semiconductor pillars 536, but the disclosure is not limited thereto. After the forming of the trenches 541, another insulating layer 540c is formed over the semiconductor layer 540b. In some embodiments, the insulating layer 540c can include the same materials as the insulating layer 540a, but the disclosure is not limited thereto. As shown in FIG. 6B, the insulating layer 540c is conformally formed over the semiconductor layer 510b, such that the insulating layer 540c covers a bottom and sidewalls of the trenches 541. In some embodiments, it is taken as to form a second multi-layer structure 540 including the insulating layer 540a, the semiconductor layer 540b and the insulating layer 540c over the second semiconductor pillars 536 and the semiconductor layer 520 according to operation 106.

Referring to FIG. 6B, the second multi-layer structure 540 is next patterned to form a plurality of holes 542 in the first region 504a according to operation 107. In some embodiments, a width of the holes 542 is greater than the width of the holes 528a. In some embodiments, the width of the holes 542 in the first region 504a is between approximately 1 µm and 50 µm, but the disclosure is not limited thereto. It should be noted that each of the holes 542 is substantially aligned with each of the holes 528a, but the holes 542 are offset from the second semiconductor pillars 536.

Figure 6C:
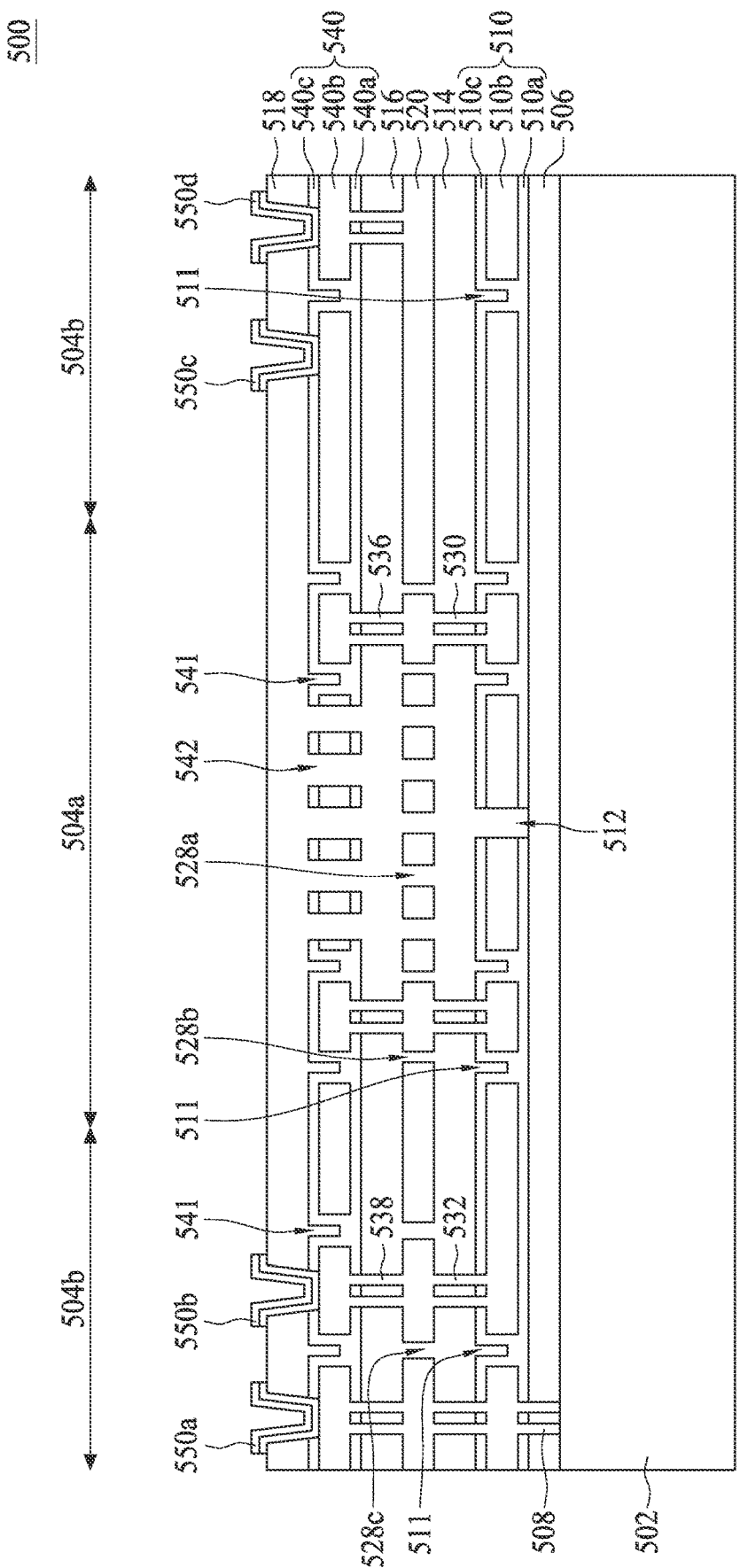

Referring to FIG. 6C, an insulating layer 518 is next formed over the second multi-layer structure 540 according to operation 108. In some embodiments, the insulating layer 518 can include the same materials as the insulating layer 516. As shown in FIG. 6C, the insulating layer 518 fills the trenches 541 and the holes 542. Subsequently, a plurality of openings (not shown) are formed in the insulating layer 518, and a plurality of connecting pads 550 are formed in the openings according to operation 108.

Figure 6D:
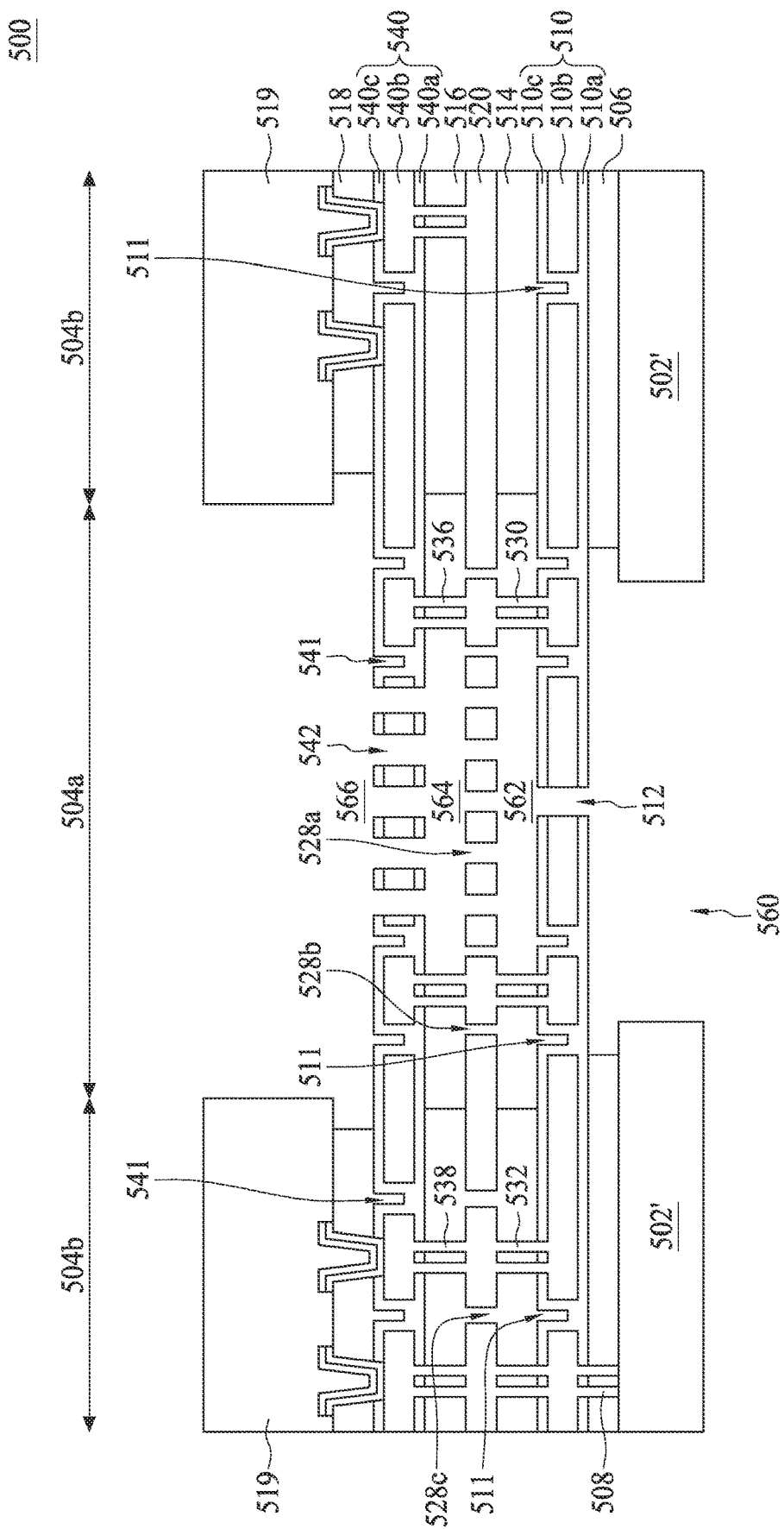

Referring to FIG. 6D, the substrate 502 is next grinded or thinned down on a side opposite to the first multi-layer structure 510, the semiconductor layer 520, and the second multi-layer structure 540 according to operation 109. Consequently, a thinned substrate 502' is obtained as shown in FIG. 6D. Next, a patterned photoresist 519 is formed on the insulating layer 518 and the connecting pads 550, wherein the patterned photoresist 519 includes an opening substantially corresponding to the first region 504a. Next, a portion of the thinned substrate 502' is removed to form an environment port 560 substantially in the first region 504a according to operation 110, as shown in FIG. 6D. Next, an etching operation is performed to remove a portion of the insulating layer 518 through the opening in operation 110. Further, a portion of the insulating layer 516, a portion of the insulating layer 514, and a portion of the insulating layer 506 are removed through the opening by the etching. Accordingly, air gaps 562 and 564 and an opening 566 are formed. The holes 512, 528a and 542 and the trenches 528b are again visible after the etching operation is performed. Further, each of the first semiconductor pillars 530 is entirely separated from the insulating layer 514 by the air gap 562, and each of the second semiconductor pillars 536 is entirely separated from the insulating layer 516 by the air gap 564 after the etching operation is performed. Because the etching operation is similar to those described above, repetitive details are omitted in the interest of brevity. Next, the patterned photoresist 519 is removed. Additionally, a width of the opening 566 can be greater than a width of the air gaps of 564 and 562, and the width of air gaps 564 and 562 can be greater than a width of the environment port 560, but the disclosure is not limited thereto.

Figure 6E:
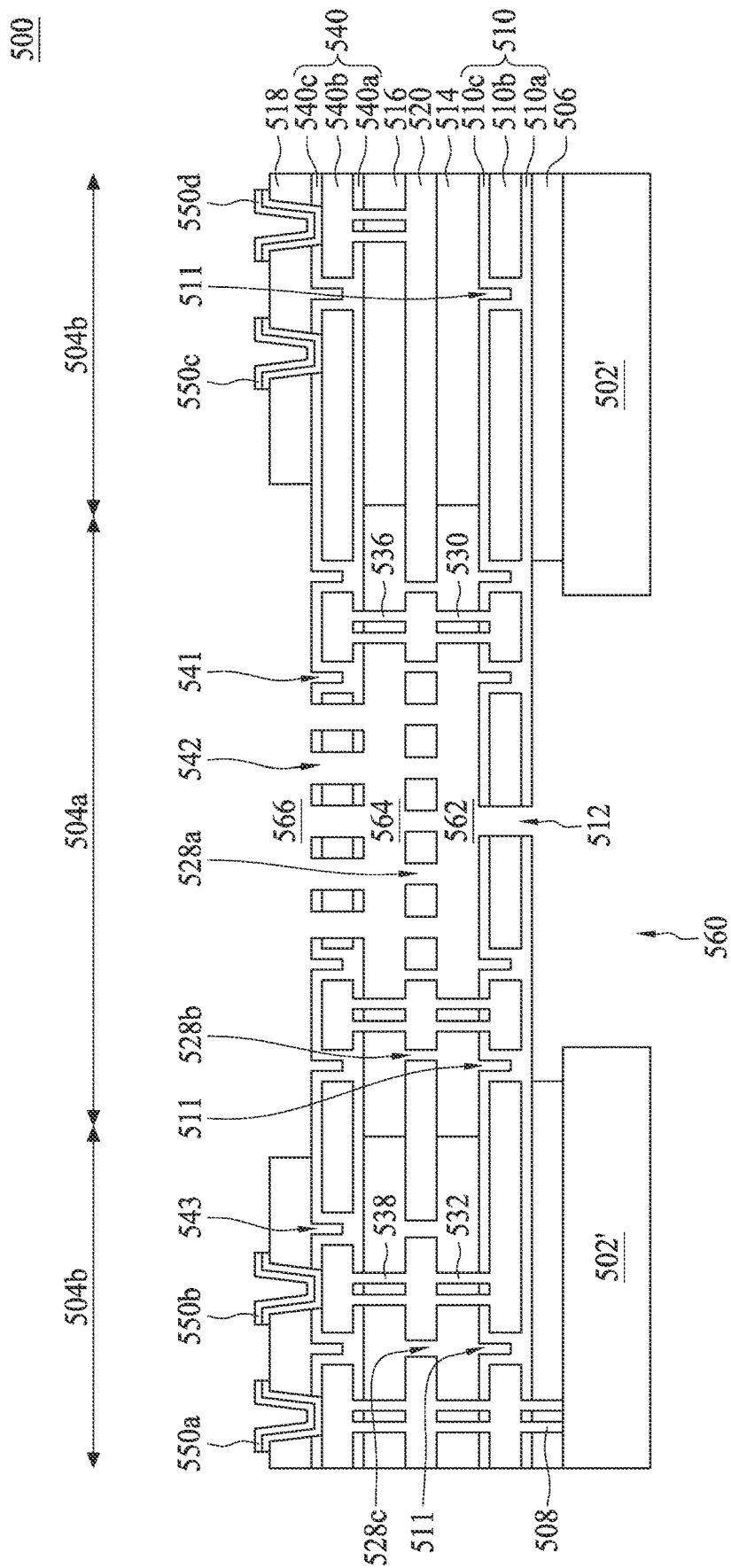

Referring to FIG. 6E, a MEMS device 500 is formed accordingly. It should be easily understood that similar elements in FIG. 5H and FIG. 6E can include similar materials; therefore, repetitive details are omitted in the interest of brevity, and only differences between the MEMS device 400 and the MEMS device 500 are described. According to the MEMS device 500, at least the first hole 512 is formed in and penetrates a first movable portion of the first multi-layer structure 510, and the plurality of second holes 542 are formed in and penetrate a second movable portion of the second multi-layer structure 540, as shown in FIG. 6E. Both the first hole 512 and the second holes 542 serve as vent holes. Further, the plurality of holes 528a and the plurality of trenches 528b are formed in and penetrate the semiconductor layer 520, and the holes 528a and the trenches 528b are formed in the first region 504a. The holes 528a serve as acoustic holes while the trenches 528b serve to provide mechanical isolation. It should be noted that the width of the second holes 542 is greater than the width of the acoustic holes 528a.

Still referring to FIG. 6E, it should be noted that the MEMS device 500 further includes the plurality of first semiconductor pillars 530 and the plurality of second semiconductor pillars 536. In contrast to the MEMS device 400, the second semiconductor pillars 536 are formed between a second anchor portion (in the second region 504b) and the second holes 542, as shown in FIG. 6E.

In some embodiments, the first multi-layer structure 510 and the second multi-layer structure 540 serve as two back plates, and the semiconductor layer 520 serves as a membrane for the MEMS device 500. Consequently, the MEMS device 500 is referred to as a dual-plate device. It should be noted that the first semiconductor pillars 530 between the first multi-layer structure 510 and the semiconductor layer 520 and entirely disposed over the first movable portion of the first multi-layer structure 510, together with the second semiconductor pillars 536 between the second multi-layer structure 540 and the semiconductor layer 520 and entirely disposed over the second movable portion of the second multi-layer structure 540, improve a stiffness of the semiconductor layer 520. Accordingly, AOP of the MEMS device 500 can be improved without changing bias voltage. Further, the vent hole 512, which allows communication between the environment port 560 and the air gap 562, has the width of less than 3 µm, thereby preventing particles from entering the air gap 562. Particle and air damping issues can therefore both be mitigated. In addition, the second holes 542, which are also the vent holes, improve air outflow, and thus performance of the MEMS device 500 can be improved. Further, the second holes 542 are aligned with the acoustic holes 528a, and one of the second holes 542 and one of the acoustic holes 528a are aligned with the first hole 512, as shown in FIG. 6E. Accordingly, particles accidentally falling into the MEMS device 500 through the first hole 512 can easily fall out through the acoustic hole 528a and the second hole 542 that are aligned with the first hole 512, and thus particle issue can be further mitigated.

In some embodiments, the method for forming the MEMS device 10 is performed, and thus the first semiconductor pillars 230, 330, 430 and 530 are formed before the forming of the multi-layer structure 220/320 or the semiconductor layer 420/520. According to the method 10, the second semiconductor pillars 236, 336, 436 and 536 are formed before the forming of the second semiconductor layer 240/340 or the second multi-layer structure 440/540.

Figure 7A:
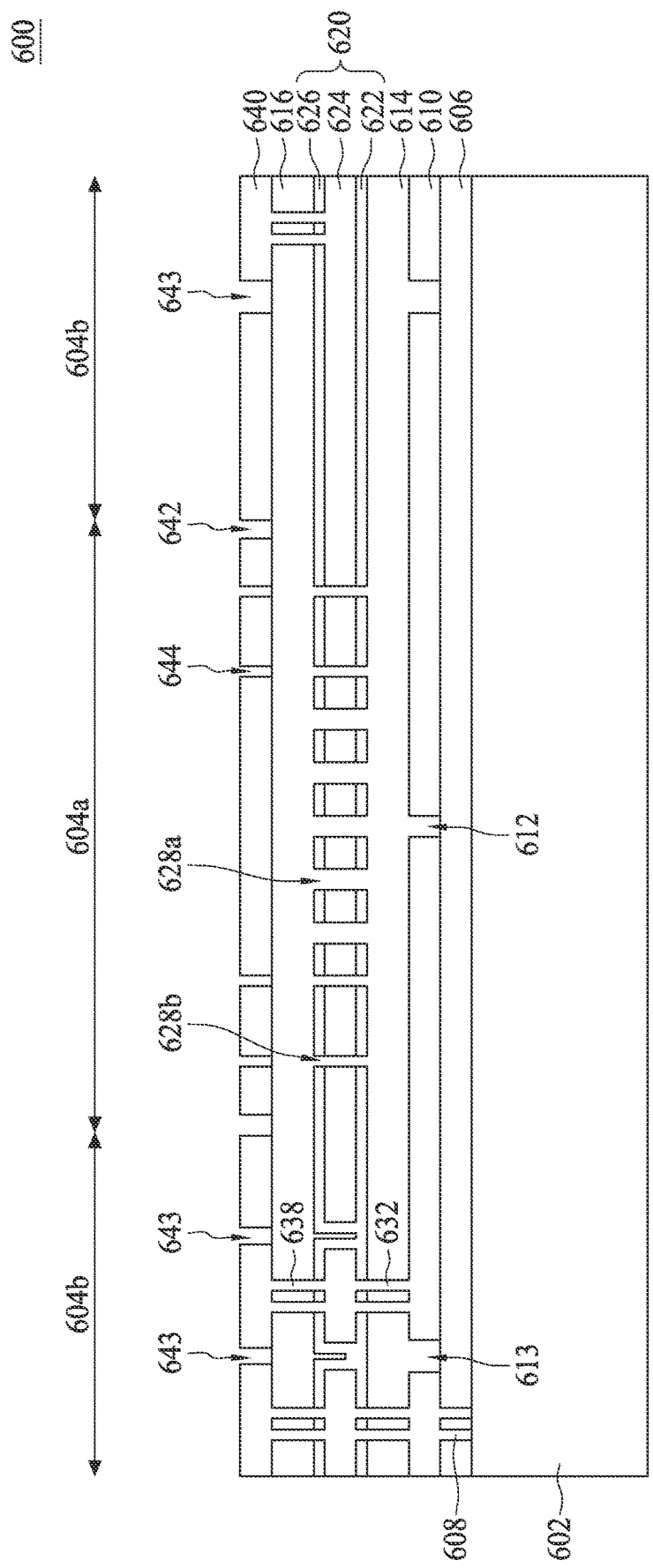
FIGS. 7A to 7D are schematic drawings illustrating a MEMS device at various fabrication stages constructed according to aspects of the present disclosure in one or more embodiments.

FIGS. 7A to 7D are schematic drawings illustrating a MEMS device 600 at various fabrication stages constructed according to aspects of the present disclosure in one or more embodiments. Further, similar elements in FIGS. 7A to 7D and FIGS. 3A to 3K can include similar materials and thicknesses; therefore, repetitive details are omitted in the interest of brevity. As shown in FIG. 7A, a substrate 602 is provided. The substrate 602 can have a first region 604a and a second region 604b defined thereon. In some embodiments, the second region 604b surrounds the first region 604a, but the disclosure is not limited thereto. In some embodiments, IC devices (not shown) can be formed in the second region 604b of the substrate 602, but the disclosure is not limited thereto. In some embodiments, an insulating layer 606 is formed over the substrate 602.

Still referring to FIG. 7A, a first semiconductor layer 610 is formed over the substrate 602 according to operation 120. In some embodiments, a plurality of connecting structures 608 are formed in the patterned insulating layer 606 in the second region 604b. The connecting structures 608 are in contact with the substrate 602 and are configured to provide electrical connection in the second region 604b. Subsequently, the first semiconductor layer 610 is patterned to form at least a hole 612 according to operation 121. The hole 612 is formed in the first region 604a. Further, a plurality of trenches 613 can be formed in the second region 604b simultaneously with the forming of the hole 612. In some embodiments, a width of the hole 612 is less than approximately 3 µm, but the disclosure is not limited thereto. In some embodiments, a width of the trenches 613 is between approximately 0.5 µm and 2 µm, but the disclosure is not limited thereto. As shown in FIG. 7A, the trenches 613 in the second region 604b are offset from the connecting structures 608. In some embodiments, the hole 612 is configured to serve as a vent hole, while the trenches 613 are configured to provide electrical isolation between elements such as membrane and interconnect structures formed thereafter.

Referring to FIG. 7A, insulating layers 614 and 622 are next formed on the first semiconductor layer 610. Next, a semiconductor layer 624 is formed over the insulating layers 614 and 622. In some embodiments, a plurality of connecting structures 632 are formed in the insulating layers 614 and 622 in the second region 604b before or with the forming of the semiconductor layer 624. The connecting structures 632 in the second region 604b can be electrically connected to the first semiconductor layer 610 or to the connecting structures 608 through the first semiconductor layer 610. Further, the semiconductor layer 624 can be patterned to form a plurality of trenches in the second region 604b. Next, an insulating layer 626 is formed on the semiconductor layer 624. The insulating layer 626 can include the same material as the insulating layer 622, but the disclosure is not limited thereto. In some embodiments, it is taken as to form a multi-layer structure 620 including the insulating layer 622, the semiconductor layer 624 and the insulating layer 626 over the first semiconductor layer 610 according to operation 122. Further, the insulating layer 626 of the multi-layer structure 620 provides electrical isolations between elements such as the interconnect structures in the second region 604b. The operations for forming the electrical isolation can be similar to those described above and shown in FIGS. 3C to 3D, and repetitive details are therefore omitted for brevity.

Still referring to FIG. 7A, the multi-layer structure 620 is patterned to form a plurality of holes 628a according to operation 123. The holes 628a are formed in the first region 604a. Further, a plurality of trenches 628b is formed in the first region 604a simultaneously with the forming of the holes 628a. As shown in FIG. 7A, the holes 628a and the trenches 628b penetrate the multi-layer structure 620. In some embodiments, a width of the holes 628a is between approximately 1 μm and approximately 50 μm, but the disclosure is not limited thereto. In some embodiments, the width of the holes 628a is greater than a width of the trenches 628b. The holes 628a are configured to serve as acoustic holes while the trenches 628b are configured to provide mechanical isolation between elements such as back plate and interconnections formed thereafter. Next, an insulating layer 616 is formed over the multi-layer structure 620. In some embodiments, the insulating layer 616 can include the same materials as the insulating layer 614. Subsequently, a second semiconductor layer 640 is formed over the multi-layer structure 620 according to operation 124. In some embodiments, a plurality of connecting structures 638 is formed in the second region 604b. The connecting structures 638 in the second region 604b can be electrically connected to the semiconductor layer 624 of the multi-layer structure 620.

Still referring to FIG. 7A, subsequently, the second semiconductor layer 640 is patterned to form a plurality of holes 642 and 644 according to operation 125. The holes 642 and 644 are formed in the first region 604a. Further, the second semiconductor layer 640 is patterned to form a plurality of trenches 643 in the second region 604b simultaneously with the forming of the holes 642 and 644. In some embodiments, a width of the holes 642 is greater than or less than a width of the holes 644, but the disclosure is not limited thereto. In some embodiments, the width of the holes 642 in the first region 604a is between approximately 1 m and 50 μm, but the disclosure is not limited thereto. In some embodiments, a width of the trenches 643 is between approximately 0.5 μm and 2 μm, but the disclosure is not limited thereto. The holes 642 in the first region 604a serve as air flow channels, the holes 644 in the first region 604a serve as release holes, and the trenches 643 in the second region 604b serve to provide electrical isolation between elements such as membrane and the interconnect structures formed thereafter.

Figure 7B:
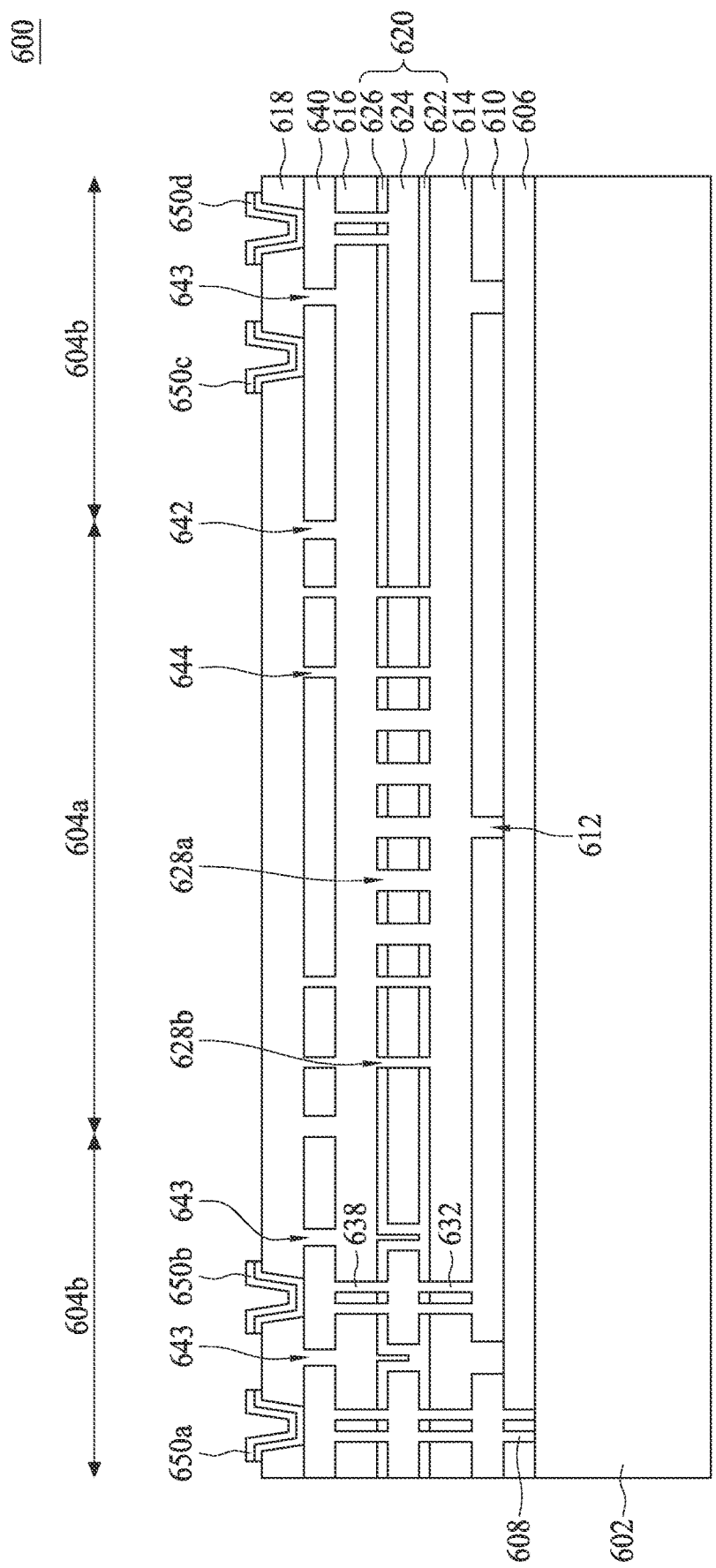

Referring to FIG. 7B, an insulating layer 618 is next formed over the second semiconductor layer 640 according to operation 126. In some embodiments, the insulating layer 618 can include the same materials as the insulating layer 616. As shown in FIG. 7B, the insulating layer 618 fills the holes 642 and 644 in the first region 604a and the trenches 643 in the second region 604b. Subsequently, a plurality of openings (not shown) are formed in the insulating layer 618, and a plurality of connecting pads 650a-650d are formed in the openings according to operation 126.

Figure 7C:
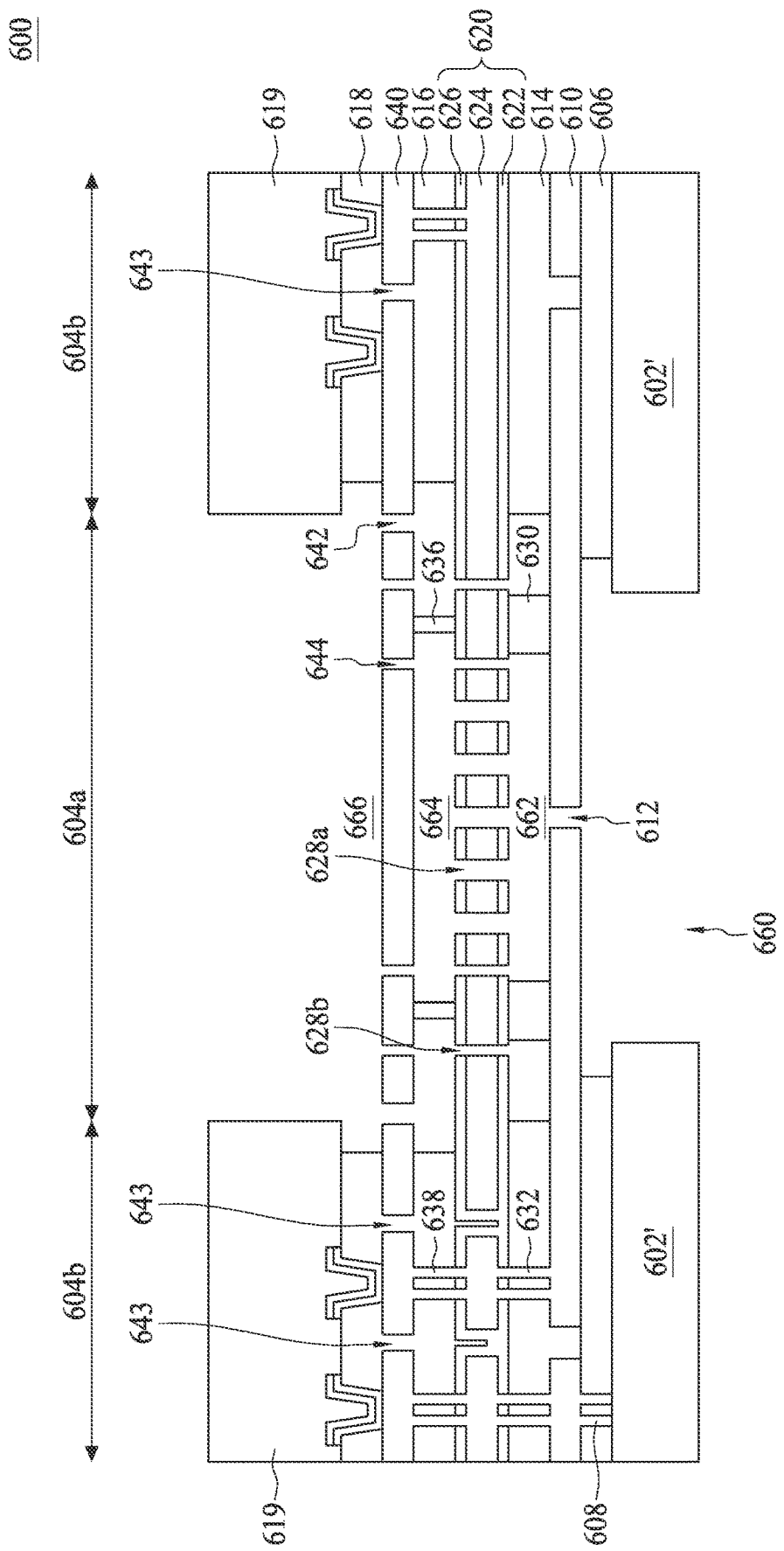

Referring to FIG. 7C, the substrate 602 is next grinded or thinned down on a side opposite to the first semiconductor layer 610, the multi-layer structure 620, and the second semiconductor layer 640 according to operation 127. Consequently, a thinned substrate 602' is obtained as shown in FIG. 7C. Next, a patterned photoresist 619 is formed on the insulating layer 618 and the connecting pads 650, wherein the patterned photoresist 619 includes an opening substantially corresponding to the first region 604a. Next, a portion of the thinned substrate 602' is removed to form an environment port 660 substantially in the first region 604a according to operation 128, as shown in FIG. 7C. Next, an etching operation is performed to remove a portion of the insulating layer 618, a portion of the insulating layer 616, a portion of the insulating layer 614, and a portion of the insulating layer 606 through the opening according to operation 129. Accordingly, air gaps 662 and 664 and an opening 666 are formed. The holes 612, 628a, 642 and 644 and the trenches 628b are again visible after the etching operation is performed. Because the etching operation is similar to those described above, the repetitive details are omitted in the interest of brevity. Next, the patterned photoresist 619 is removed. Additionally, a width of the opening 666 can be greater than a width of the air gaps of 664 and 662, and the width of air gaps 664 and 662 can be greater than a width of the environment port 660, but the disclosure is not limited thereto.

Still referring to FIG. 7C, it should be noted that portions of the insulating layer 616 and portions of the insulating layer 614 remain in place after the etching operation is performed. Consequently, a plurality of first insulating pillars 630 and a plurality of second insulating pillars 636 are simultaneously formed according to operation 129. As shown in FIG. 7C, the first insulating pillars 630 are formed between and arranged in contact with the first semiconductor layer 610 and the multi-layer structure 620, and are exposed to the air gap 662. The second insulating pillars 636 are formed between and arranged in contact with the multi-layer structure 620 and the second semiconductor layer 640, and are exposed to the air gap 664. Further, each of the first insulating pillars 630 is entirely separated from the insulating layer 614 by the air gap 662, and each of the second insulating pillars 636 is entirely separated from the insulating layer 616 by the air gap 664 after the etching operation is performed. In some embodiments, a width of the first insulating pillars 630 is greater than a width of the second insulating pillars 636, as shown in FIG. 7C. In some embodiments, the width of the first insulating pillars 630 can be defined by a distance between the release holes 644, but the disclosure is not limited thereto.

Figure 7D:
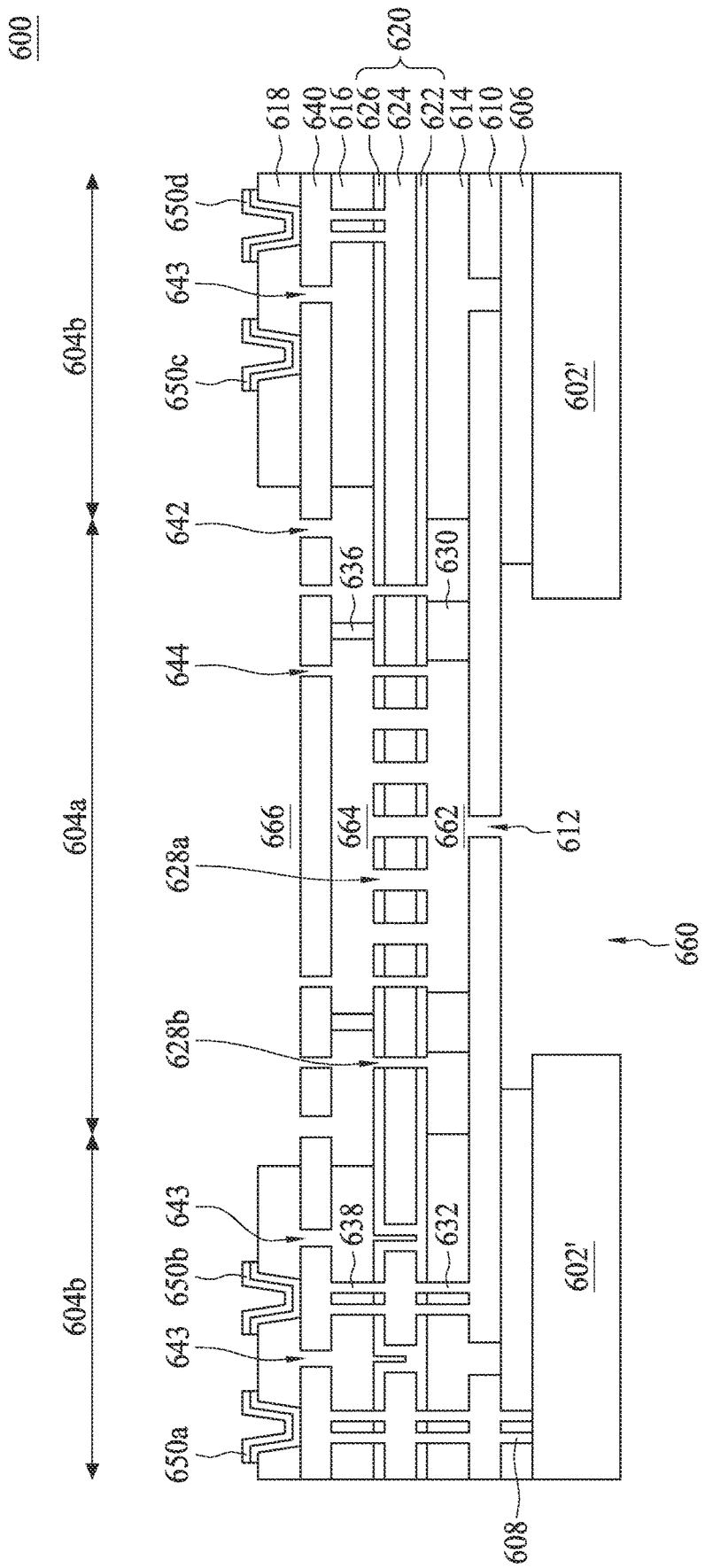

Referring to FIG. 7D, a MEMS device 600 is formed accordingly. It should be easily understood that similar elements in FIG. 3K and FIG. 7D can include similar materials; therefore, repetitive details are omitted in the interest of brevity, and only differences between the MEMS device 200 and the MEMS device 600 are described. According to the MEMS device 600, the plurality of first insulating pillars 630 and the plurality of second insulating pillars 636 are provided. In some embodiments, the first insulating pillars 630 and the second insulating pillars 636 can include the same material, but the disclosure is not limited thereto. In some embodiments, the first insulating pillars 630 can be offset from the second insulating pillars 636. In alternative embodiments, the first insulating pillars 630 can be aligned with the second insulating pillars 636. As shown in FIG. 7D, the second insulating pillars 636 are formed between the release holes 644 in the first region 604a. Further, the release holes 644 are formed between the second insulating pillars 636 and a second anchor portion (in the second region 604b) of the second semiconductor layer 640.

In some embodiments, the first semiconductor layer 610 and the second semiconductor layer 640 serve as two membranes, and the multi-layer structure 620 serves as a back plate for the MEMS device 600. Consequently, the MEMS device 600 is referred to as a dual-membrane device. It should be noted that the first insulating pillars 630 improve a stiffness of the first semiconductor layer 610, and the second insulating pillars 636 improve a stiffness of the second semiconductor layer 640. Accordingly, AOP of the MEMS device 600 can be improved without changing bias voltage. Further, the vent hole 612, which allows communication between the environment port 660 and the air gap 662, has the width of less than 3 μm, thereby preventing particles from entering the air gap 662. Particle and air damping issues can therefore both be mitigated. In addition, the second holes 642, which are air flow channels, improve air outflow, and thus performance of the MEMS device 600 can be improved. Additionally, because the first pillars 630 and the second pillars 636 include the insulating materials, the first semiconductor layer 610 (the bottom membrane) and the second semiconductor layer 640 (the top membrane) are electrically isolated from each other, and thus electrical routing is simplified.

Figure 8A:
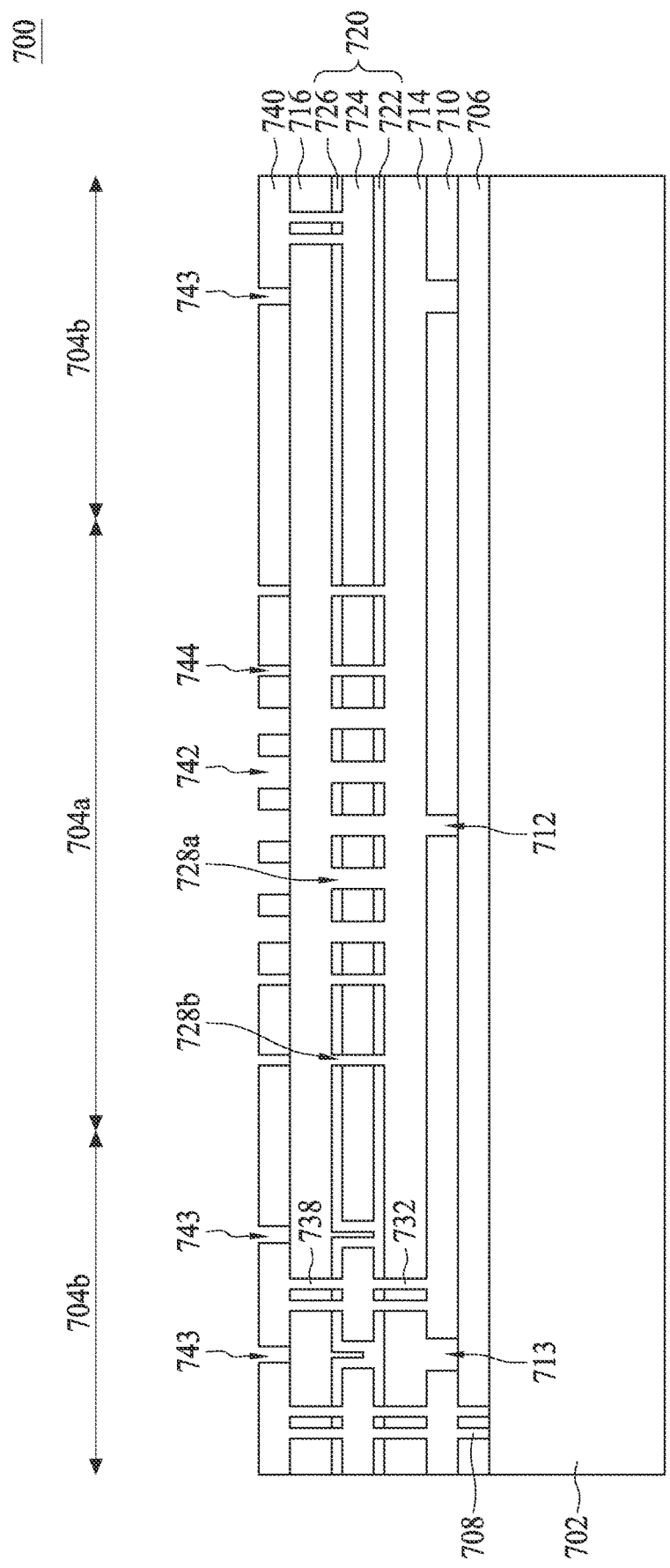
FIGS. 8A to 8D are schematic drawings illustrating a MEMS device at various fabrication stages constructed according to aspects of the present disclosure in one or more embodiments.

FIGS. 8A to 8D are schematic drawings illustrating a MEMS device 700 at various fabrication stages constructed according to aspects of the present disclosure in one or more embodiments. Further, similar elements in FIGS. 8A to 8D and FIGS. 3A to 3K can include similar materials; therefore, repetitive details are omitted in the interest of brevity. As shown in FIG. 8A, a substrate 702 is provided. The substrate 702 can have a first region 704a and a second region 704b defined thereon. In some embodiments, the second region 704b surrounds the first region 704a, but the disclosure is not limited thereto. In some embodiments, IC devices (not shown) can be formed in the second region 704b of the substrate 702, but the disclosure is not limited thereto. In some embodiments, an insulating layer 706 is formed over the substrate 702.

Still referring to FIG. 8A, a first semiconductor layer 710 is formed over the substrate 702 according to operation 120. In some embodiments, a plurality of connecting structures 708 is formed in the insulating layer 706 in the second region 704b. The connecting structures 708 are in contact with the substrate 702, and are configured to provide electrical connection in the second region 704b. Subsequently, the first semiconductor layer 710 is patterned to form at least a hole 712 according to operation 121. The hole 712 is formed in the first region 704a. Further, a plurality of trenches 713 can be formed in the second region 704b simultaneously with the forming of the hole 712. In some embodiments, a width of the hole 712 is less than approximately 3 μm, but the disclosure is not limited thereto. In some embodiments, a width of the trenches 713 is between approximately 0.5 μm and 2 μm, but the disclosure is not limited thereto. As shown in FIG. 8A, the trenches 713 in the second region 704b are offset from the connecting structures 708. In some embodiments, the hole 712 is configured to serve as a vent hole, while the trenches 713 are configured to provide electrical isolation between the membrane and the interconnect structures formed thereafter.

Referring to FIG. 8A, insulating layers 714 and 722 are next formed on the first semiconductor layer 710. Next, a semiconductor layer 724 is formed on the insulating layers 714 and 722. In some embodiments, a plurality of connecting structures 732 are formed in the insulating layers 714 and 722 in the second region 704b. The connecting structures 732 in the second region 704b can be electrically connected to the first semiconductor layer 710 or to the connecting structures 708 through the first semiconductor layer 710. Further, the semiconductor layer 724 can be patterned to form a plurality of trenches for electrical isolation in the second region 704b. Next, an insulating layer 726 is formed on the semiconductor layer 724. The insulating layer 726 can include the same material as the insulating layer 722, but the disclosure is not limited thereto. In some embodiments, it is taken as to form a multi-layer structure 720 including the insulating layer 722, the semiconductor layer 724 and the insulating layer 726 over the first semiconductor layer 710 according to operation 122. Further, the insulating layer 726 of the multi-layer structure 720 provides electrical isolation between elements such as interconnect structures in the second region 704b. The operations for forming the electrical isolation can be similar to those described above and shown in FIGS. 3C to 3D, and repetitive details are omitted for brevity.

Still referring to FIG. 8A, the multi-layer structure 720 is patterned to form a plurality of holes 728a according to operation 123. The holes 728a are formed in the first region 704a. Further, a plurality of trenches 728b is formed in the first region 704a simultaneously with the forming of the holes 728a. As shown in FIG. 8A, the holes 728a and the trenches 728b penetrate the multi-layer structure 720. In some embodiments, a width of the holes 728a is between approximately 1 μm and approximately 50 μm, but the disclosure is not limited thereto. In some embodiments, a width of the holes 728a is greater than a width of the trenches 728b. The holes 728a are configured to serve as acoustic holes, while the trenches 728b are configured to provide mechanical isolation between elements such as back plate and interconnections formed thereafter. Next, an insulating layer 716 is formed over the multi-layer structure 720, and the holes 728a and the trenches 728b are filled with the insulating layer 716. In some embodiments, the insulating layer 716 can include the same materials as the insulating layer 714. Next, a second semiconductor layer 740 is formed over the multi-layer structure 720 according to operation 124. In some embodiments, a plurality of connecting structures 738 is formed in the second region 704b. The connecting structures 738 in the second region 704b can be electrically connected to the semiconductor layer 724 of the multi-layer structure 720.

Still referring to FIG. 8A, subsequently, the second semiconductor layer 740 is patterned to form a plurality of holes 742 and 744 according to operation 125. The holes 742 and 744 are formed in the first region 704a. Further, the second semiconductor layer 740 is patterned to form a plurality of trenches 743 in the second region 704b simultaneously with the forming of the holes 742 and 744. In some embodiments, a width of the holes 742 is greater than or less than a width of the holes 744, but the disclosure is not limited thereto. In some embodiments, the width of the holes 742 in the first region 704a is between approximately 1 m and 50 μm, but the disclosure is not limited thereto. In some embodiments, a width of the trenches 743 is between approximately 0.5 μm and 2 μm, but the disclosure is not limited thereto. The holes 742 in the first region 704a serve as vent holes, the holes 744 in the first region 704a serve as release holes, and the trenches 743 in the second region 704b serve to provide electrical isolation between elements such as membrane and the interconnect structures formed thereafter.

Figure 8B:
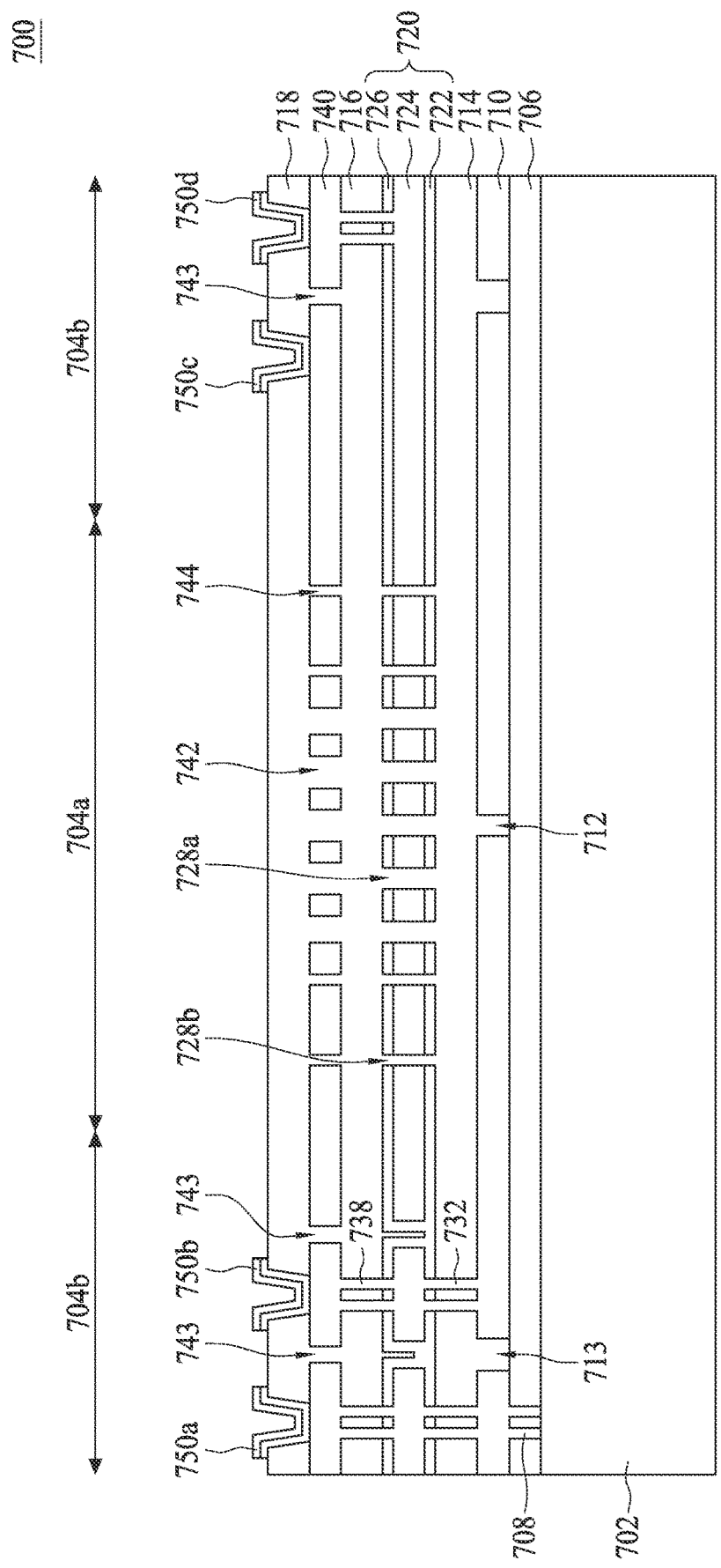

Referring to FIG. 8B, an insulating layer 718 is next formed over the second semiconductor layer 740 according to operation 126. In some embodiments, the insulating layer 718 can include the same materials as the insulating layer 716. As shown in FIG. 8B, the insulating layer 718 fills the holes 742 and 744 in the first region 704a and the trenches 743 in the second region 704b. Subsequently, a plurality of openings (not shown) are formed in the insulating layer 718, and a plurality of connecting pads 750a-750d are formed in the openings according to operation 126.

Figure 8C:
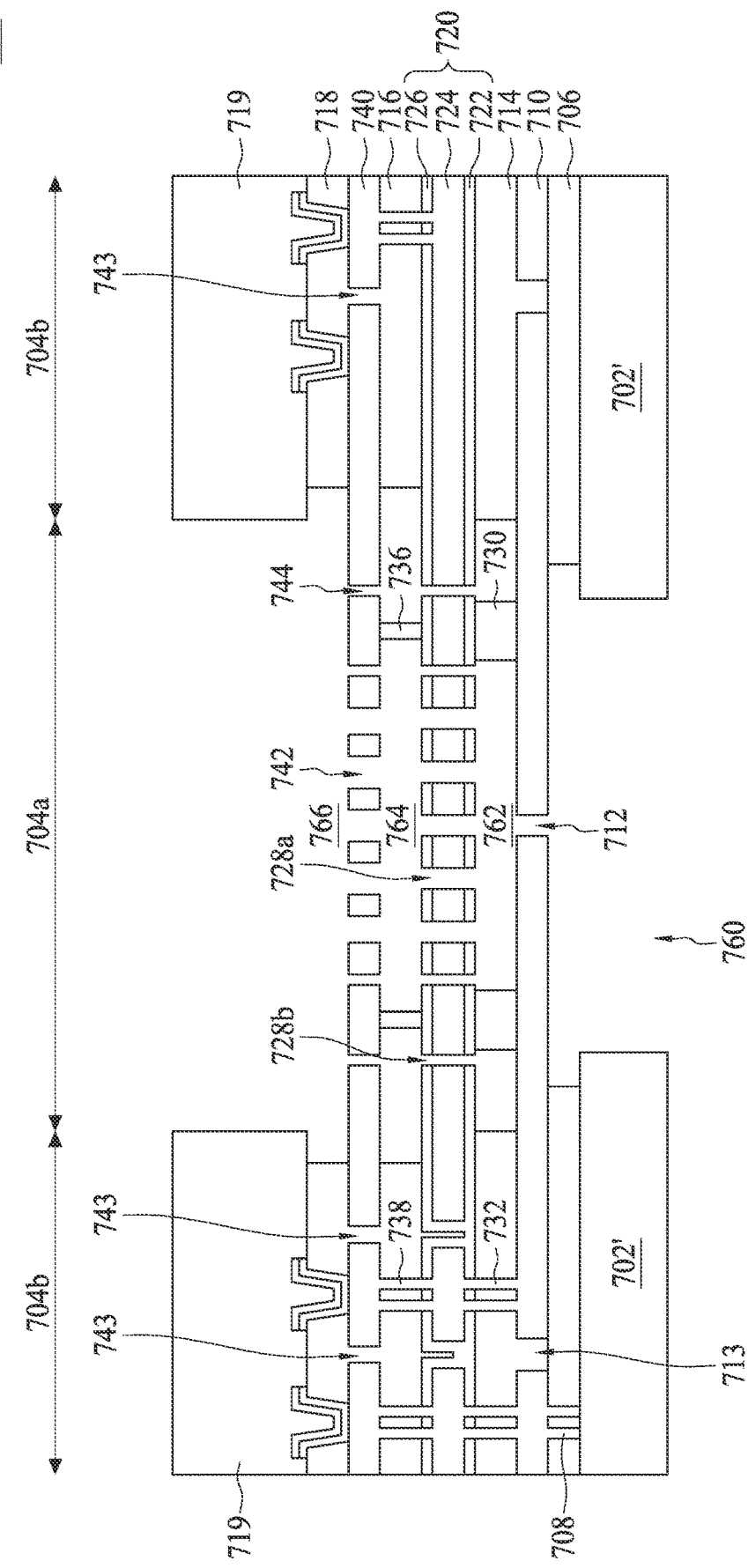

Referring to FIG. 8C, the substrate 702 is next grinded or thinned down on a side opposite to the first semiconductor layer 710, the multi-layer structure 720, and the second semiconductor layer 740 according to operation 127. Consequently, a thinned substrate 702' is obtained as shown in FIG. 8C. Next, a patterned photoresist 719 is formed on the insulating layer 718 and the connecting pads 750, wherein the patterned photoresist 719 includes an opening substantially corresponding to the first region 704a. Next, a portion of the thinned substrate 702' is removed to form an environment port 760 substantially in the first region 704a according to operation 128, as shown in FIG. 8C. Next, an etching operation is performed to remove a portion of the insulating layer 718, a portion of the insulating layer 716, a portion of the insulating layer 714, and a portion of the insulating layer 706 through the opening according to operation 129. Accordingly, air gaps 762 and 764 and an opening 766 are formed. The holes 712, 728a, 742 and 744 and the trenches 728b are again visible after the etching operation is performed. Because the etching is similar to those described above, repetitive details are omitted in the interest of brevity. Next, the patterned photoresist 719 is removed. Additionally, a width of the opening 766 can be greater than a width of the air gaps of 764 and 762, and the width of air gaps 764 and 762 can be greater than a width of the environment port 760, but the disclosure is not limited thereto.

Still referring to FIG. 8C, as mentioned above, portions of the insulating layer 716 and portions of the insulating layer 714 remain in place after the etching operation is performed. Consequently, a plurality of first insulating pillars 730 and a plurality of second insulating pillars 736 are simultaneously formed according to operation 129. As shown in FIG. 8C, the first insulating pillars 730 are formed between the first semiconductor layer 710 and the multi-layer structure 720, and are exposed to the air gap 762, while the second insulating pillars 736 are formed between the multi-layer structure 720 and the second semiconductor layer 740, and are exposed to the air gap 764. Further, each of the first insulating pillars 730 is entirely separated from the insulating layer 714 by the air gap 762, and each of the second insulating pillars 736 is entirely separated from the insulating layer 716 by the air gap 764 after the etching operation is performed. In some embodiments, a width of the first insulating pillars 730 is greater than a width of the second insulating pillars 736, as shown in FIG. 8C. In some embodiments, the width of the first insulating pillars 730 can be defined by a distance between the release holes 744, but the disclosure is not limited thereto.

Figure 8D:
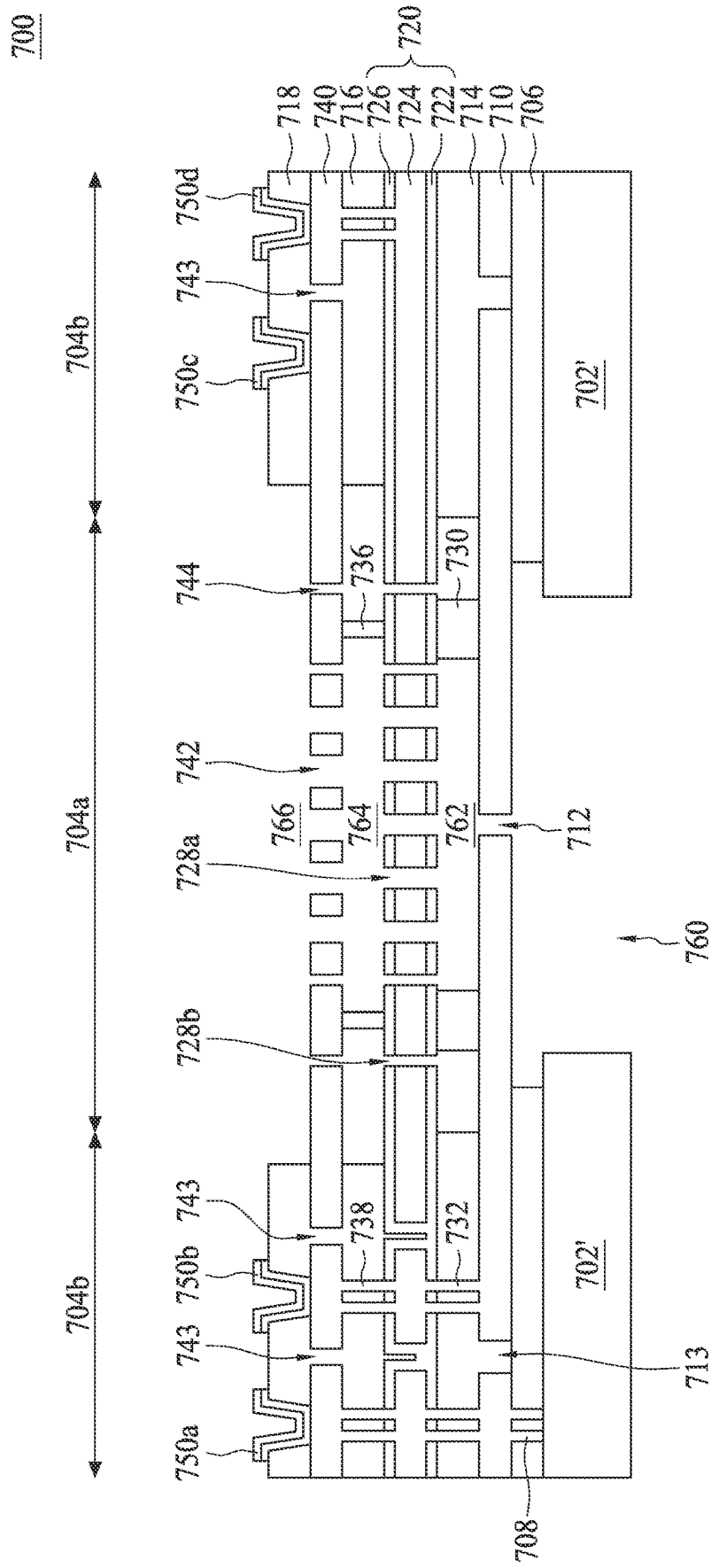

Referring to FIG. 8D, a MEMS device 700 is formed accordingly. It should be easily understood that similar elements in FIG. 7D and FIG. 8D can include similar materials; therefore, repetitive details are omitted in the interest of brevity, and only differences between the MEMS device 600 and the MEMS device 700 are described. According to the MEMS device 700, at least the first hole 712 is formed in and penetrates a first movable portion of the first semiconductor layer 710, and the plurality of second holes 742 and 744 are formed in and penetrate a second movable portion of the second semiconductor layer 740, as shown in FIG. 8D. The first holes 712 and the second holes 742 both serve as vent holes, and the holes 744 serve as release holes. Further, the plurality of holes 728a and the plurality of trenches 728b are formed in and penetrate the multi-layer structure 720, and the holes 728a and the trenches 728b are formed corresponding to the first movable portion of the first semiconductor layer 710 and the second movable portion of the second semiconductor layer 740. The holes 728a serve as acoustic holes, while the trenches 728b serve to provide mechanical isolation. As shown in FIG. 8D, it should be noted that the width of the second holes 742 is greater than the width of the acoustic holes 728a. Further, the second holes 742 are aligned with the acoustic holes 728a, and one of the second holes 742 and one of acoustic holes 728a are aligned with the first hole 712, as shown in FIG. 8D. As shown in FIG. 8D, the second insulating pillars 736 are formed between the release holes 744 in the first region 704a. Further, the second insulating pillars 736 are formed between the second holes 742 and a second anchor portion (in the second region 704b) of the second semiconductor layer 740.

In some embodiments, the first semiconductor layer 710 and the second semiconductor layer 740 serve as two membranes, and the multi-layer structure 720 serves as a back plate for the MEMS device 700. Consequently, the MEMS device 700 is referred to as a dual-membrane device. It should be noted that the first insulating pillars 730 improve a stiffness of the first semiconductor layer 710, and the second insulating pillars 736 improve a stiffness of the second semiconductor layer 740. Accordingly, AOP of the MEMS device 700 can be improved without changing bias voltage. Further, the vent hole 712, which allows communication between the environment port 760 and the air gap 762, has a width of less than 3 μm, thereby preventing particles from entering the air gap 762. Particle and air damping issues can therefore both be mitigated. In addition, the second holes 742, which are also the vent holes, improve air outflow, and thus performance of the MEMS device 700 can be improved. Further, particles accidentally falling into the MEMS device 700 through the first hole 712 can easily fall out through the acoustic hole 728a and the second hole 742 that are aligned with the first hole 712, and thus particle issue can be further mitigated. Additionally, because the first pillars 730 and the second pillars 736 include the insulating materials, the first semiconductor layer 710 (the bottom membrane) and the second semiconductor layer 740 (the top membrane) are electrically isolated from each other, and thus electrical routing is simplified.

Figure 9A:
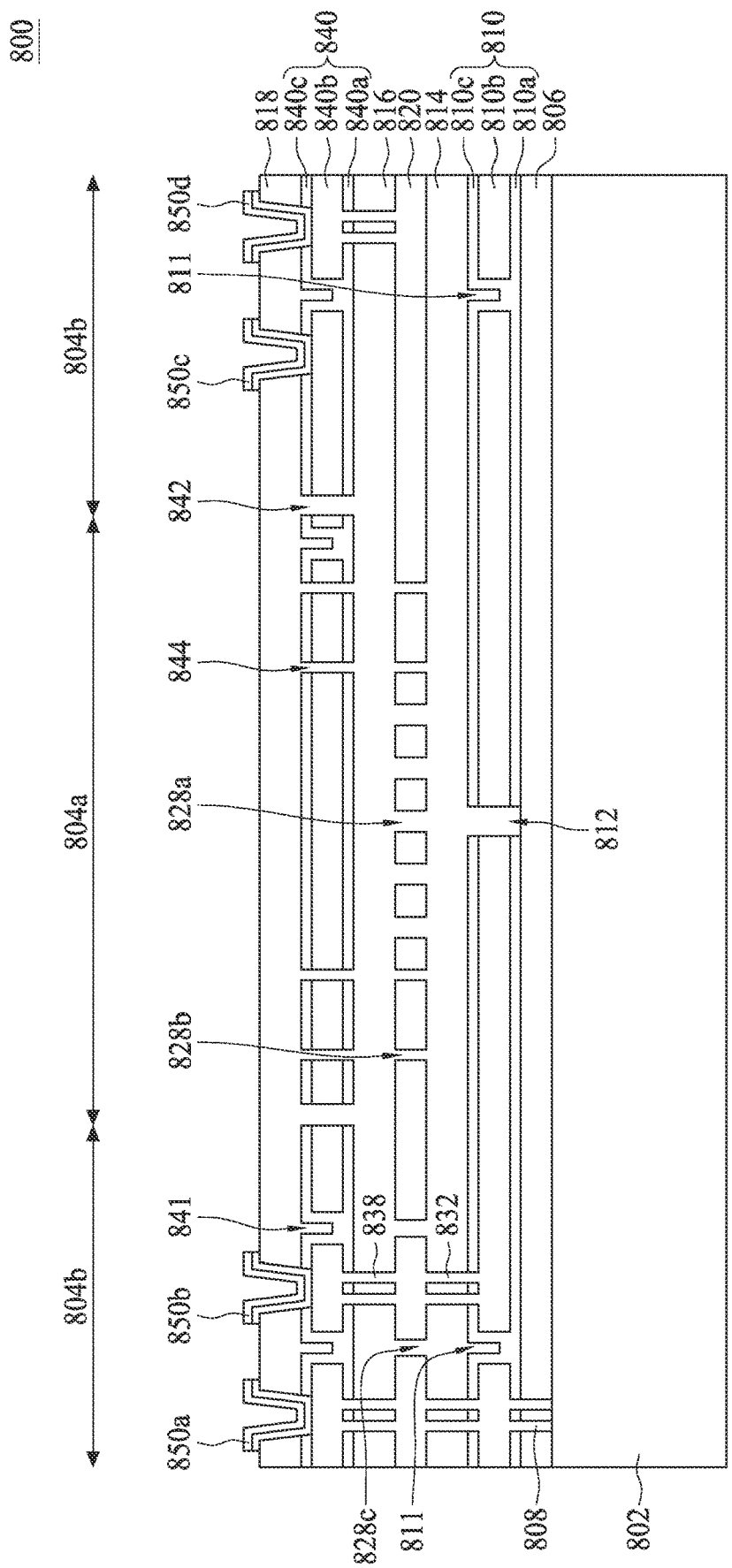
FIGS. 9A and 9B are schematic drawings illustrating a MEMS device at various fabrication stages constructed according to aspects of the present disclosure in one or more embodiments.
Figure 9B:
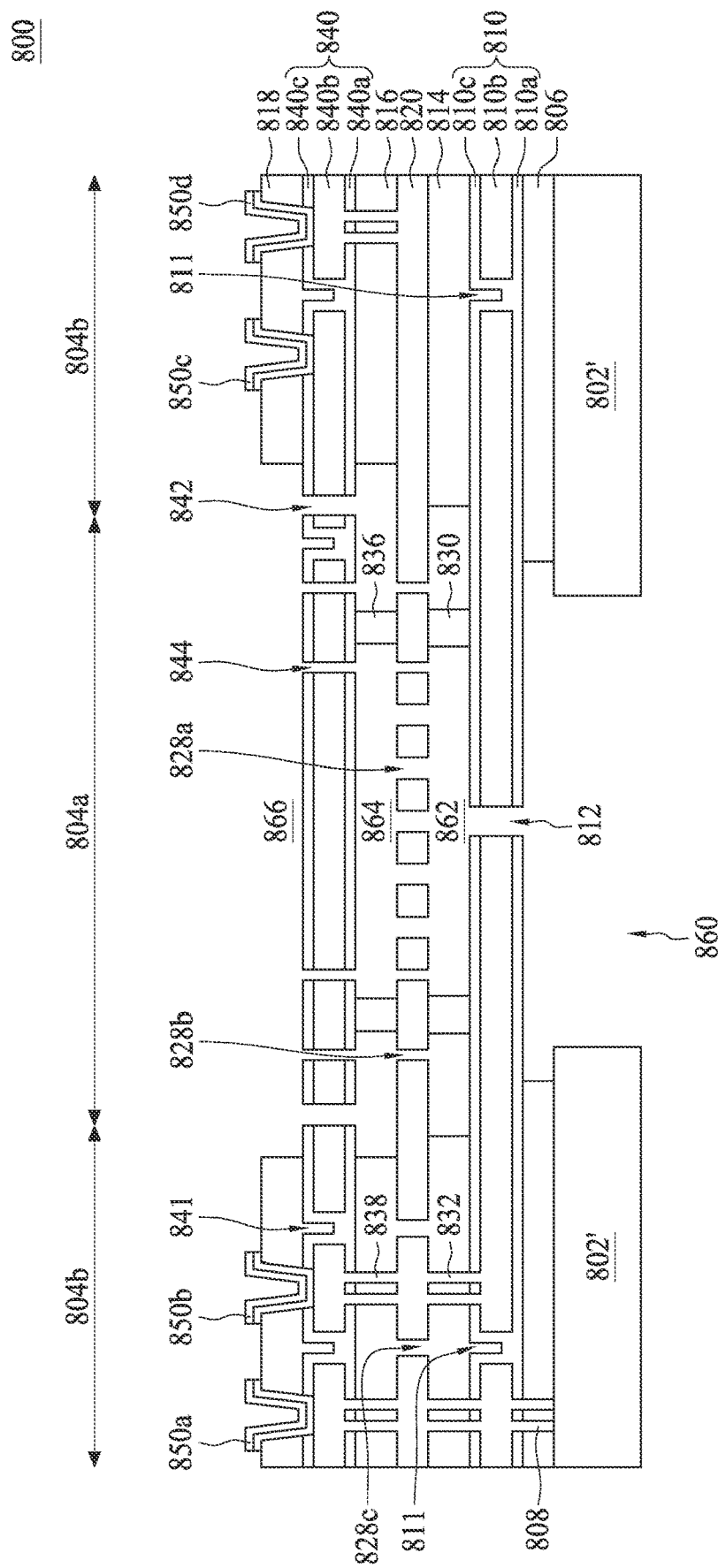

FIGS. 9A and 9B are schematic drawings illustrating a MEMS device 800 at various fabrication stages constructed according to aspects of the present disclosure in one or more embodiments. Further, similar elements in FIGS. 8A to 8D and FIGS. 9A to 9B can include similar materials and similar thicknesses; therefore, repetitive details are omitted in the interest of brevity. As shown in FIG. 9A, a substrate 802 is provided. The substrate 802 can have a first region 804a and a second region 804b defined thereon. In some embodiments, the second region 804b surrounds the first region 804a, but the disclosure is not limited thereto. In some embodiments, IC devices (not shown) can be formed in the second region 804b of the substrate 802, but the disclosure is not limited thereto. In some embodiments, an insulating layer 806 is formed over the substrate 802. A first multi-layer structure 810 including an insulating layer 810a, a semiconductor layer 810b and an insulating layer 810c is formed over the insulating layer 806 according to operation 120. In some embodiments, a plurality of connecting structures 808 can be formed in the insulating layer 806 before or simultaneously with the forming of the semiconductor layer 810b. A plurality of trenches 811 can be formed in the semiconductor layer 810b and the insulating layer 810a in the second region 804b. At least a hole 812 penetrating the first multi-layer structure 810 is formed in the first region 804a according to operation 121. An insulating layer 814 is formed over the substrate 800. A semiconductor layer 820 is formed over the first multi-layer structure 810 according to operation 122. Further, a plurality of connecting structures 832 is formed in the second region 804b. A plurality of holes 828a is formed in the first region 804a according to operation 123. Further, a plurality of trenches 828b is formed in the semiconductor layer 820 in the first region 804a simultaneously with the forming of the holes 828a. Next, a second multi-layer structure 840 including an insulating layer 840a, a semiconductor layer 840b and an insulating layer 840c is formed over the insulating layer 816 according to operation 124. Further, a plurality of trenches 841 can be formed in the semiconductor layer 840b and the insulating layer 840a in the second region 804b. The operations for forming the above elements are similar to the operations for forming similar elements for the MEMS device 700, and repetitive details are therefore omitted for brevity.

Still referring to FIG. 9A, the second multi-layer structure 840 is next patterned to form a plurality of holes 842 and 844 in the first region 804a according to operation 125. In some embodiments, a width of the holes 842 is greater than a width of the holes 844. In some embodiments, the width of the holes 842 is between approximately 1 µm and 50 µm, but the disclosure is not limited thereto. In some embodiments, the holes 842 serve as air flow channels while the holes 844 serve as release holes. After the forming of the holes 842 and 844, an insulating layer 818 and a plurality of connecting pads 850 are formed according to operation 126. The operations for forming the insulating layer 818 and the connecting pads 850 are similar to the operations for forming similar elements for the MEMS device 700, and repetitive details are therefore omitted for brevity.

Referring to FIG. 9B, the substrate 802 is next grinded or thinned down on a side opposite to the first multi-layer structure 810, the semiconductor layer 820, and the second multi-layer structure 840 according to operation 127. Consequently, a thinned substrate 802' is obtained as shown in FIG. 9B. Next, a patterned photoresist (not shown) is formed on the insulating layer 818 and the connecting pads 850, wherein the patterned photoresist includes an opening substantially equal in size to the first region 804a. Next, a portion of the thinned substrate 802' is removed to form an environment port 860 substantially in the first region 804a according to operation 128, as shown in FIG. 9B. Next, an etching operation is performed to remove a portion of the insulating layer 818, a portion of the insulating layer 816, a portion of the insulating layer 814, and a portion of the insulating layer 806 through the opening according to operation 129. Accordingly, air gaps 862 and 864 and an opening 866 are formed. The holes 812, 828a, 842 and 844 and the trenches 828b are again visible after the etching operation is performed. Further, a plurality of first insulating pillars 830 and a plurality of second insulating pillars 836 are simultaneously formed in operation 129. Each of the first insulating pillars 830 is entirely separated from the insulating layer 814 by the air gap 862, and each of the second insulating pillars 836 is entirely separated from the insulating layer 816 by the air gap 864 after the etching is performed. Because the etching is similar to those described above, repetitive details are omitted in the interest of brevity. Next, the patterned photoresist is removed. Additionally, a width of the opening 866 can be greater than a width of the air gaps of 864 and 862, and the width of air gaps 864 and 862 can be greater than a width of the environment port 860, but the disclosure is not limited thereto.

Referring to FIG. 9B, a MEMS device 800 is formed accordingly. It should be easily understood that similar elements in FIG. 9B and FIG. 8D can include similar materials; therefore, repetitive details are omitted in the interest of brevity, and only differences between the MEMS device 700 and the MEMS device 800 are described. According to the MEMS device 800, at least the first hole 812 is formed in and penetrates a first movable portion of the first multi-layer structure 810, and the plurality of second holes 842 and 844 are formed in and penetrate a second movable portion of the second multi-layer structure 840, as shown in FIG. 9B. The first hole 812 serves as a vent hole, the second holes 842 serve as air flow channels, and the holes 844 serve as release holes. Further, the plurality of holes 828a and the plurality of trenches 828b are formed in and penetrates the semiconductor layer 840, and the holes 828a and the trenches 828b are formed corresponding to the first movable portion of the first multi-layer structure 810 and the second movable portion of the second multi-layer structure 840. The holes 828a serve as acoustic holes while the trenches 828b serve to provide mechanical isolation. In some embodiments, the second holes 842 and the release holes 844 are offset from the first holes 812, but the disclosure is not limited thereto. As shown in FIG. 9B, the second insulating pillars 836 are formed between the release holes 744 in the first region 704a. Further, the second holes 842 are formed between the second insulating pillars 836 and a second anchor portion (in the second region 804b) of the second multi-layer structure 840.

In some embodiments, the first multi-layer structure 810 and the second multi-layer structure 840 serve as two back plates, and the semiconductor layer 820 serves as a membrane for the MEMS device 800. It should be noted that the first insulating pillars 830 and the second insulating pillars 836 improve a stiffness of the semiconductor layer 840. Accordingly, AOP of the MEMS device 800 can be improved without changing bias voltage. Further, the vent hole 812, which allows communication between the environment port 860 and the air gap 862, has a width of less than 3 µm, thereby preventing particles from entering the air gap 862. Particle and air damping issues can therefore both be mitigated. In addition, the second holes 842, which are air flow channels, improve air outflow, and thus performance of the MEMS device 800 can be improved. Additionally, because the first pillars 830 and the second pillars 836 include the insulating materials, the first multi-layer structure 810 (the bottom plate) and the second multi-layer structure 840 (the top plate) are electrically isolated from each other, and thus electrical routing is simplified.

Figure 10A:
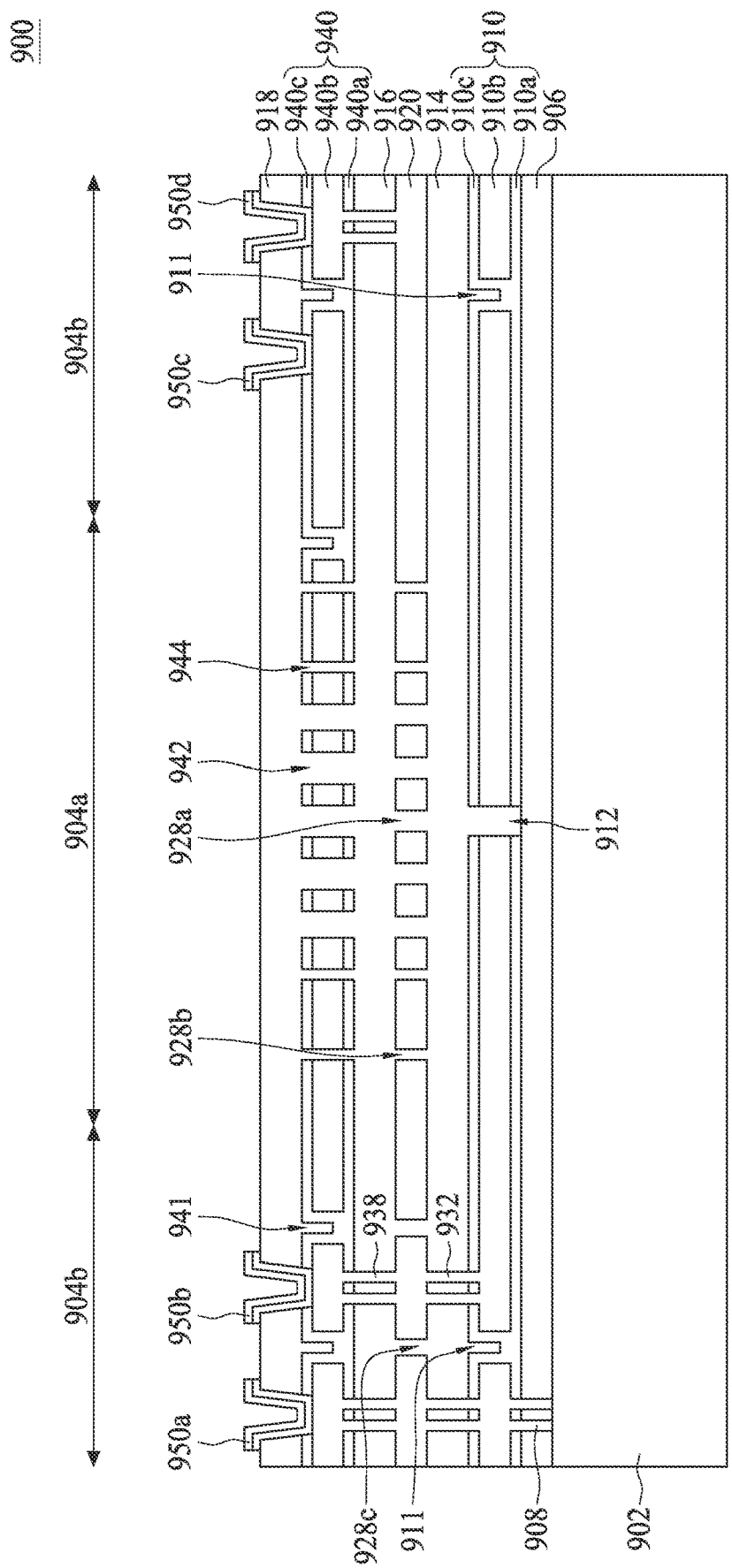
FIGS. 10A and 10B are schematic drawings illustrating a MEMS device at various fabrication stages constructed according to aspects of the present disclosure in one or more embodiments.
Figure 10B:
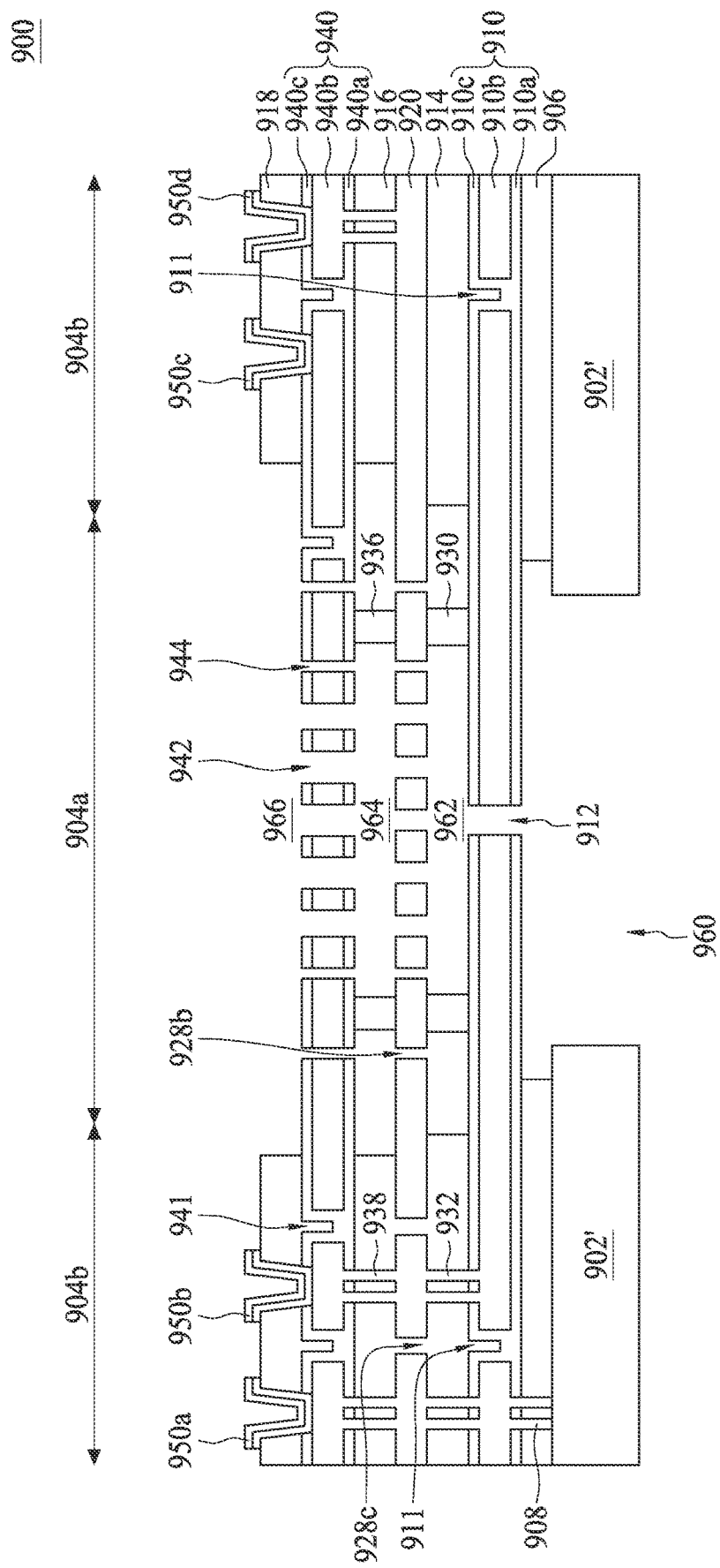

FIGS. 10A and 10B are schematic drawings illustrating a MEMS device 900 at various fabrication stages constructed according to aspects of the present disclosure in one or more embodiments. Further, similar elements in FIGS. 9A to 9B and FIGS. 10A to 10B can include similar materials and similar thicknesses; therefore, repetitive details are omitted in the interest of brevity. As shown in FIG. 10A, a substrate 902 is provided. The substrate 902 can have a first region 904a and a second region 904b defined thereon. In some embodiments, the second region 904b surrounds the first region 904a, but the disclosure is not limited thereto. In some embodiments, IC devices (not shown) can be formed in the second region 904b of the substrate 902, but the disclosure is not limited thereto. In some embodiments, an insulating layer 906 is formed over the substrate 902. A first multi-layer structure 910 including an insulating layer 910a, a semiconductor layer 910b and an insulating layer 910c is formed over the insulating layer 906 according to operation 120. In some embodiments, a plurality of connecting structures 908 can be formed in the insulating layer 906 before or simultaneously with the forming of the semiconductor layer 910b. A plurality of trenches 911 can be formed in the semiconductor layer 910b and the insulating layer 910a in the second region 904b. At least a hole 912 penetrating the first multi-layer structure 910 is formed in the first region 904a. An insulating layer 914 is formed over the substrate 902. A semiconductor layer 920 is formed over the first multi-layer structure 910 according to operation 122. Further, a plurality of connecting structures 832 is formed in the second region 804b. A plurality of holes 928a is formed in the first region 904a according to operation 123. Further, a plurality of trenches 928b is formed in the semiconductor layer 920 in the first region 904a simultaneously with the forming of the holes 928a. Next, a second multi-layer structure 940 including an insulating layer 940a, a semiconductor layer 940b and an insulating layer 940c is formed over the insulating layer 916 according to operation 124. Further, a plurality of trenches 941 can be formed in the semiconductor layer 940b and the insulating layer 840a in the second region 804b. The operations for forming the above elements are similar to the operations for forming similar elements for the MEMS device 800, and repetitive details are therefore omitted for brevity.

Still referring to FIG. 10A, the second multi-layer structure 940 is next patterned to form a plurality of holes 942 and 944 in the first region 904a according to operation 125. In some embodiments, a width of the holes 942 is greater than a width of the holes 944. In some embodiments, the width of the holes 942 is between approximately 1 μm and 50 μm, but the disclosure is not limited thereto. In some embodiments, the holes 942 serve as vent holes, while the holes 944 serve as release holes. After the forming of the holes 942 and 944, an insulating layer 918 and a plurality of connecting pads 950 are formed according to operation 126. Operations for forming the insulating layer 918 and the connecting pads 950 are similar to the operations for forming similar elements for the MEMS device 800, and repetitive details are therefore omitted for brevity.

Referring to FIG. 10B, the substrate 902 is next grinded or thinned down on a side opposite to the first multi-layer structure 910, the semiconductor layer 920, and the second multi-layer structure 940 according to operation 127. Consequently, a thinned substrate 902' is obtained as shown in FIG. 10B. Next, a patterned photoresist (not shown) is formed on the insulating layer 918 and the connecting pads 950, wherein the patterned photoresist includes an opening substantially equal in size to the first region 904a. Next, a portion of the thinned substrate 902' is removed to form an environment port 960 substantially in the first region 904a according to operation 128, as shown in FIG. 10B. Next, an etching operation is performed to remove a portion of the insulating layer 918, a portion of the insulating layer 916, a portion of the insulating layer 914, and a portion of the insulating layer 906 through the opening according to operation 129. Accordingly, air gaps 962 and 964 and an opening 966 are formed. The holes 912, 928a, 942 and 944 and the trenches 928b are again visible after the etching operation is performed. Further, a plurality of first insulating pillars 930 and a plurality of second insulating pillars 936 are simultaneously formed according to operation 129. Each of the first insulating pillars 930 is entirely separated from the insulating layer 914 by the air gap 962, and each of the second insulating pillars 936 is entirely separated from the insulating layer 916 by the air gap 964 after the etching is performed. Because the etching operation is similar to those described above, the details are omitted in the interest of brevity. Next, the patterned photoresist is removed. Additionally, a width of the opening 966 can be greater than a width of the air gaps of 964 and 962, and the width of air gaps 964 and 962 can be greater than a width of the environment port 960, but the disclosure is not limited thereto.

Referring to FIG. 10B, a MEMS device 900 is formed accordingly. It should be easily understood that similar elements in FIG. 9B and FIG. 10B can include similar materials; therefore, repetitive details are omitted in the interest of brevity, and only differences between the MEMS device 800 and the MEMS device 900 are described. According to the MEMS device 900, at least the first hole 912 is formed in and penetrates a first movable portion of the first semiconductor layer 910, and the plurality of second holes 942 and 944 are formed in and penetrate a second movable portion of the second semiconductor layer 940, as shown in FIG. 10B. The first holes 912 and the second holes 942 both serve as vent holes, and the holes 944 serve as release holes. Further, the plurality of holes 928a and the plurality of trenches 928b are formed in and penetrate the semiconductor layer 920, and the holes 928a and 928b are formed corresponding to the first movable portion of the first semiconductor layer 910 and the second movable portion of the second semiconductor layer 940. The holes 928a serve as acoustic holes, while the trenches 928b serve to provide mechanical isolation. As shown in FIG. 10B, it should be noted that a width of the second holes 942 is greater than a width of the acoustic holes 928a. Further, the second holes 942 are aligned with the acoustic holes 928a, and one of the second holes 942 and one of acoustic holes 928a are aligned with the first hole 912, as shown in FIG. 10B. The first insulating pillars 930 are formed between the first holes 942 and the first anchor portion of the first semiconductor layer 910, and the second insulating pillars 936 are formed between the release holes 944 in the first region 904a.

In some embodiments, the first multi-layer structure 910 and the second multi-layer structure 940 serve as two back plates, and the semiconductor layer 920 serves as a membrane for the MEMS device 900. It should be noted that the first insulating pillars 930 and the second insulating pillars 936 improve a stiffness of the semiconductor layer 920.

Accordingly, AOP of the MEMS device 900 can be improved without changing bias voltage. Further, the vent hole 912, which allows communication between the environment port 960 and the air gap 962, has a width of less than 3 µm, thereby preventing particles from entering the air gap 962. Particle and air damping issues can therefore both be mitigated. The second holes 942, which are also the vent holes, improve air outflow, and thus performance of the MEMS device 900 can be improved. Further, particles accidentally falling into the MEMS device 900 through the first hole 912 can easily fall out through the acoustic hole 928a and the second hole 942 that are aligned with the first hole 912, and thus particle issue can be further mitigated. Additionally, because the first pillars 930 and the second pillars 936 include the insulating materials, the first multi-layer structure 910 (the bottom plate) and the second multi-layer structure 940 (the top plate) are electrically isolated from each other, and thus electrical routing is simplified.

In some embodiments, the method 12 for forming the MEMS device is performed, and thus the first and second insulating pillars 630, 636, 730, 736, 830, 836, 930 and 936 are simultaneously formed after the forming of the multi-layer structure 620/720 or the semiconductor layer 820/920.

The present disclosure therefore provides a MEMS device including the first and second pillars, which can be semiconductor or insulating pillars, in contact with top and bottom membranes, or in contact with top and bottom plates. By connecting the top and bottom membranes or the top and bottom plates with the pillars, structure stiffness is increased. Further, the MEMS device provided by the present disclosure can also include a membrane or a plate, that faces the environment port and, that is designed to reduce particle entry into the air gap, and another membrane or plate designed to have large vent holes or air flow channels to maintain the good sensitivity and SNR.

In some embodiments, a MEMS device is provided. The MEMS device includes a first multi-layer structure, a second multi-layer structure over the first multi-layer structure, a first semiconductor layer between the first and second multilayer structures, a first air gap separating the first multi-layer structure and the first semiconductor layer, a second air gap separating the first semiconductor layer and the second multi-layer structure, a plurality of semiconductor pillars, and a plurality of second semiconductor pillars. The first semiconductor pillars are exposed to the first air gap, and coupled to the first semiconductor layer and the first multi-layer structure. The second semiconductor pillars are exposed to the second air gap, and coupled to the first semiconductor layer and the second multi-layer structure.

In some embodiments, a MEMS device is provided. The MEMS device includes a first semiconductor layer, a second semiconductor layer over the first semiconductor layer, a multi-layer structure between the first and second semiconductor layers, a first air gap separating the first semiconductor layer and the multi-layer structure, a second air gap separating the multi-layer structure and the second semiconductor layer, a plurality of first insulating pillars, and a plurality of second insulating pillars. The first insulating pillars are exposed to the first air gap, and coupled to the first semiconductor layer and the multi-layer structure. The second insulating pillars are exposed to the second air gap, and coupled to the multi-layer structure and the second semiconductor layer.

In some embodiments, a MEMS device is provided. The MEMS device includes a first multi-layer structure, a second multi-layer structure over the first multi-layer structure, a first semiconductor layer between the first and second multi-layer structures, a first air gap separating the first multi-layer structure and the first semiconductor layer, a second air gap separating the first semiconductor layer and the second multi-layer structure, a plurality of first insulating pillars, and a plurality of second insulating pillars. The first insulating pillars are exposed to the first air gap, and coupled to the first semiconductor layer and the first multi-layer structure. The second insulating pillars are exposed to the second air gap, and coupled to the first semiconductor layer and the second multi-layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device comprising:
    a first multi-layer structure;
    a second multi-layer structure over the first multi-layer structure;
    a first semiconductor layer between the first multi-layer structure and the second multi-layer structure;
    a first insulating layer between the first multi-layer structure and the first semiconductor layer;
    a first air gap separating the first multi-layer structure and the first semiconductor layer;
    a second air gap separating the first semiconductor layer and the second multi-layer structure;
    a plurality of first semiconductor pillars exposed to the first air gap, and coupled to the first semiconductor layer and the first multi-layer structure; and
    a plurality of second semiconductor pillars exposed to the second air gap, and coupled to the first semiconductor layer and the second multi-layer structure,
    wherein the first multi-layer structure comprises a second insulating layer, a third insulating layer over the second insulating layer, and a second semiconductor layer between the second insulating layer and the third insulating layer, and
    wherein the second semiconductor layer is entirely separated from the first insulating layer.

2. The MEMS device of claim 1, wherein the second multi-layer structure comprises a second movable portion and a second anchor portion.

3. The MEMS device of claim 2, further comprising a fourth insulating layer separating the first semiconductor layer and the second multi-layer structure in the second anchor portion.

4. The MEMS device of claim 3, wherein the second multi-layer structure comprises a fifth insulating layer, a sixth insulating layer over the fifth insulating layer, and a third semiconductor layer between the fifth insluting layer and the sixth insulating layer.

5. The MEMS device of claim 4, wherein the third semiconductor layer in the second anchor portion is entirely separated from the fourth insulating layer.

6. The MEMS device of claim 4, wherein the second semiconductor pillars penetrate the fifth insulating layer of the second multi-layer structure, and are in contact with the third semiconductor layer of the second multi-layer structure.

7. The MEMS device of claim 1, wherein the first semiconductor pillars penetrate the third insulating layer of the first multi-layer structure, and are in contact with the second semiconductor layer of the first multi-layer structure.

8. A microelectromechanical system (MEMS) device comprising:
- a first semiconductor layer;
- a second semiconductor layer over the first semiconductor layer;
- a multi-layer structure between the first semiconductor layer and the second semiconductor layer;
- a first air gap separating the first semiconductor layer and the multi-layer structure;
- a second air gap separating the multi-layer structure and the second semiconductor layer;
- a plurality of first insulating pillars exposed to the first air gap, and coupled to the first semiconductor layer and the multi-layer structure; and
- a plurality of second insulating pillars exposed to the second air gap, and coupled to the multi-layer structure and the second semiconductor layer.

9. The MEMS device of claim 8, wherein the multi-layer structure comprises a first insulating layer, a second insulating layer over the first insulating layer, and a third semiconductor layer between the first insulating layer and the second insulating layer.

10. The MEMS device of claim 9, wherein the first insulating pillars are coupled to the first insulating layer of the multi-layer structure, and the second insulating pillars are coupled to the second insulating layer of the multi-layer structure.

11. The MEMS device of claim 8, wherein the first semiconductor layer has a first hole, and the first air gap is in communication with an environment port through the first hole.

12. The MEMS device of claim 8, wherein the multi-layer structure comprises a plurality of second holes, and the first air gap is in communication with the second air gap through the second holes.

13. The MEMS device of claim 8, wherein the second semiconductor layer comprises a plurality of third holes, and the second air gap is in communication with an opening through the third holes.

14. A microelectromechanical system (MEMS) device comprising:
- a first multi-layer structure;
- a second multi-layer structure over the first multi-layer structure;
- a first semiconductor layer between the first multi-layer structure and the second multi-layer structure;
- a first air gap separating the first multi-layer structure and the first semiconductor layer;
- a second air gap separating the first semiconductor layer and the second multi-layer structure;
- a plurality of first insulating pillars exposed to the first air gap, and coupled to the first semiconductor layer and the first multi-layer structure; and
- a plurality of second insulating pillars exposed to the second air gap, and coupled to the first semiconductor layer and the second multi-layer structure.

15. The MEMS device of claim 14, wherein the first multi-layer structure and the second multi-layer structure respectively comprise a first insulating layer, a second insulating layer over the first insulating layer, and a second semiconductor layer between the first insulating layer and the second insulating layer.

16. The MEMS device of claim 15, wherein the first insulating pillars are coupled to the second insulating layer of the first multi-layer structure.

17. The MEMS device of claim 15, wherein the second insulating pillars are coupled to the first insulating layer of the second multi-layer structure.

18. The MEMS device of claim 14, wherein the first multi-layer structure has a first hole, and the first air gap is in communication with an environment port through the first hole.

19. The MEMS device of claim 14, wherein the first semiconductor layer comprises a plurality of second holes, and the first air gap is in communication with the second air gap through the second holes.

20. The MEMS device of claim 14, wherein the second multi-layer structure comprises a plurality of third holes, and the second air gap is in communication with an opening through the third holes.

* * * * *